United States Patent
Tamoto et al.

(10) Patent No.: US 12,268,043 B2
(45) Date of Patent: Apr. 1, 2025

(54) PHOTOELECTRIC CONVERSION ELEMENT, PHOTOELECTRIC CONVERSION ELEMENT MODULE, ELECTRONIC DEVICE, AND POWER SUPPLY MODULE

(71) Applicants: Nozomu Tamoto, Shizuoka (JP); Yuuji Tanaka, Shizuoka (JP); Tamotsu Horiuchi, Kyoto (JP); Naomichi Kanei, Shizuoka (JP); Takahiro Ide, Shizuoka (JP); Yoshiaki Masuda, Shizuoka (JP)

(72) Inventors: Nozomu Tamoto, Shizuoka (JP); Yuuji Tanaka, Shizuoka (JP); Tamotsu Horiuchi, Kyoto (JP); Naomichi Kanei, Shizuoka (JP); Takahiro Ide, Shizuoka (JP); Yoshiaki Masuda, Shizuoka (JP)

(73) Assignee: Ricoh Company, Ltd., Tokyo (JP)

( * ) Notice: Subject to any disclaimer, the term of this patent is extended or adjusted under 35 U.S.C. 154(b) by 423 days.

(21) Appl. No.: 17/596,205

(22) PCT Filed: Jun. 9, 2020

(86) PCT No.: PCT/JP2020/022729
§ 371 (c)(1),
(2) Date: Dec. 6, 2021

(87) PCT Pub. No.: WO2020/250901
PCT Pub. Date: Dec. 17, 2020

(65) Prior Publication Data
US 2022/0302399 A1    Sep. 22, 2022

(30) Foreign Application Priority Data
Jun. 10, 2019 (JP) .................. 2019-107785

(51) Int. Cl.
*H10K 30/10* (2023.01)
*H10K 30/88* (2023.01)
(Continued)

(52) U.S. Cl.
CPC ............ *H10K 30/10* (2023.02); *H10K 30/88* (2023.02); *G06F 3/021* (2013.01); *G06F 3/033* (2013.01);
(Continued)

(58) Field of Classification Search
CPC .... H10K 30/151; H10K 85/331; H10K 39/30; H10K 85/652; Y02E 10/542; Y02E 10/549
See application file for complete search history.

(56) References Cited

U.S. PATENT DOCUMENTS 9,373,450 B2    6/2016    Arai et al.
9,378,899 B2    6/2016    Arai et al.
(Continued)

FOREIGN PATENT DOCUMENTS

JP    2012-194411    10/2012
JP    2015-023216    2/2015
(Continued)

OTHER PUBLICATIONS

International Search Report Issued Sep. 18, 2020 for counterpart International Patent Application No. PCT/JP2020/022729 filed Jun. 9, 2020.
(Continued)

*Primary Examiner* — Moazzam Hossain
(74) *Attorney, Agent, or Firm* — Grüneberg and Myers PLLC

(57) ABSTRACT

A photoelectric conversion element includes a first electrode section; a second electrode section; an electron-transporting section between the first electrode section and the second
(Continued)

electrode section; a light-absorbing section; and a hole-transporting section. The hole-transporting section has a peak that reaches maximum at a Raman shift of 1575 $cm^{-1} \pm 10\ cm^{-1}$ and a peak that reaches maximum at a Raman shift of 1606 $cm^{-1} \pm 10\ cm^{-1}$ in a Raman spectrum obtained by emitting laser light having a wavelength of 532 nm; and has a peak intensity ratio A/B of 0.80 or more, the peak intensity ratio A/B being obtained from a maximum peak intensity A of the peak that reaches maximum at 1575 $cm^{-1} \pm 10\ cm^{-1}$ and a maximum peak intensity B of the peak that reaches maximum at 1606 $cm^{-1} \pm 10\ cm^{-1}$.

20 Claims, 8 Drawing Sheets

(51) Int. Cl.
    *H10K 85/30*     (2023.01)
    *H10K 85/60*     (2023.01)
    *G06F 3/02*     (2006.01)
    *G06F 3/033*     (2013.01)
    *H10K 102/00*     (2023.01)

(52) U.S. Cl.
    CPC ......... *H10K 85/331* (2023.02); *H10K 85/654* (2023.02); *H10K 2102/00* (2023.02)

(56) References Cited

U.S. PATENT DOCUMENTS

| | | | |
|---|---|---|---|
| 9,640,330 B2 | 5/2017 | Tanaka et al. | |
| 10,367,103 B2 | 7/2019 | Tanaka et al. | |
| 2010/0108135 A1* | 5/2010 | Morooka | H01G 9/2022 257/E31.127 |
| 2011/0315213 A1* | 12/2011 | Takada | H10K 71/50 257/E31.124 |
| 2016/0276609 A1 | 9/2016 | Horiuchi et al. | |
| 2017/0092433 A1 | 3/2017 | Kanei et al. | |
| 2017/0243698 A1 | 8/2017 | Kanei et al. | |
| 2017/0358399 A1* | 12/2017 | Matsuyama | H10K 85/00 |
| 2018/0197688 A1 | 7/2018 | Horiuchi et al. | |
| 2018/0330890 A1 | 11/2018 | Tanaka et al. | |
| 2020/0066458 A1 | 2/2020 | Matsuyama et al. | |
| 2021/0184064 A1* | 6/2021 | Yamamoto | H01L 31/0336 |
| 2021/0294009 A1* | 9/2021 | Misawa | G02B 5/22 |

FOREIGN PATENT DOCUMENTS

| | | |
|---|---|---|
| JP | 2015-144235 | 8/2015 |
| JP | 2016-143708 | 8/2016 |
| JP | 2016-178102 | 10/2016 |
| JP | 2017-152558 | 8/2017 |
| JP | 2019-176136 | 10/2019 |
| JP | 2020-102602 | 7/2020 |
| WO | WO2014/081388 A1 | 5/2014 |

OTHER PUBLICATIONS

Written Opinion Issued Sep. 18, 2020 for counterpart International Patent Application No. PCT/JP2020/022729 filed Jun. 9, 2020.
European Communication pursuant to Article 94(3) EPC, dated Jul. 3, 2023, in European Application 20743876.3, 6 pages.
Urieta-Mora et al., "Hole transporting materials for perovskite solar cells: a chemical approach", Chem. Soc. Rev., vol. 47, 2018, pp. 8541-8571.
Korean Office Action received for Korean Patent Application No. 10-2022-7000109 dated Sep. 25, 2023, with English translation, 14 pages.
Japanese Office Action dated Mar. 5, 2024, in Japanese Application No. 2020-100268, 6 pages.

* cited by examiner

PHOTOELECTRIC CONVERSION ELEMENT, PHOTOELECTRIC CONVERSION ELEMENT MODULE, ELECTRONIC DEVICE, AND POWER SUPPLY MODULE

CROSS-REFERENCE TO RELATED APPLICATIONS

This application is the National Stage entry under § 371 of International Application No. PCT/JP2020/022729, filed on Jun. 9, 2020, and which claims the benefit of Japanese Application No. 2019-107785, filed on Jun. 10, 2019. The content of each of these applications is hereby incorporated by reference in its entirety.

TECHNICAL FIELD

The present disclosure relates to a photoelectric conversion element, a photoelectric conversion element module, an electronic device, and a power supply module.

BACKGROUND ART

In recent years, solar cells increasingly become important as alternative energies to fossil fuels or as measures against global warming. Solar cells and photodiodes are obtained by applying photoelectric conversion elements that can convert light energy into electric energy.

In recent years, indoor-type photoelectric conversion elements, which can obtain a high output not only under sunlight (illuminance under direct light: about 100,000 lux), but also under light of a low illuminance (illuminance: 20 lux or more but 1,000 lux or less) such as a light emitting diode (LED) or a fluorescent lamp, attract attention.

As the indoor-type photoelectric conversion elements, organic solar cells represented by dye-sensitized solar cells are known in addition to amorphous silicon solar cells. Generally, the dye-sensitized solar cells have problems such as volatilization and leakage of liquid because they include an electrolyte. However, solid dye-sensitized solar cells using a solid p-type semiconductor material in place of the electrolyte have been developed in recent years. For example, as a photoelectric conversion element that can obtain a good photoelectric conversion property even under irradiation of very weak light such as indoor light (10 lux to 50 lux), inclusion of a spiro-OMeTAD as an organic hole-transporting material and the technique of addition of an oxidizing agent for converting a part of the organic hole-transporting material into radical cations for the purpose of improving electric conductivity have been proposed (see, for example, PTL 1).

However, when a photoelectric conversion element including a solid p-type semiconductor material such as spiro-OMeTAD is continuously irradiated with light of high illuminance for a long period of time, a problem of the durability; i.e., the output is gradually decreased, is caused. It cannot be said that such a photoelectric conversion element has sufficient durability required for a practical use. Therefore, such a photoelectric conversion element that has higher durability has been desired.

CITATION LIST

Patent Literature

PTL 1: Unexamined Japanese Patent Application Publication No. 2016 178102

SUMMARY OF INVENTION

Technical Problem

An object of the present disclosure is to provide a photoelectric conversion element that can obtain a high output under light of a low illuminance and has such a high durability that a high output can be stably maintained for a long period of time even when light of a high illuminance is emitted.

Solution to Problem

According to one aspect of the present disclosure, a photoelectric conversion element includes: a first electrode section; a second electrode section; an electron-transporting section between the first electrode section and the second electrode section; a light-absorbing section; and a hole-transporting section. The hole-transporting section has a peak that reaches maximum at a Raman shift of 1575 $cm^{-1} \pm 10\ cm^{-1}$ and a peak that reaches maximum at a Raman shift of 1606 $cm^{-1} \pm 10\ cm^{-1}$ in a Raman spectrum obtained by emitting laser light having a wavelength of 532 nm, and has a peak intensity ratio A/B of 0.80 or more. The peak intensity ratio A/B is obtained from a maximum peak intensity A of the peak that reaches maximum at 1575 $cm^{-1} \pm 10\ cm^{-1}$ and a maximum peak intensity B of the peak that reaches maximum at 1606 $cm^{-1} \pm 10\ cm^{-1}$.

Advantageous Effects of Invention

According to the present disclosure, it is possible to provide a photoelectric conversion element that can obtain a high output under light of a low illuminance and has such a high durability that a high output can be stably maintained over a long period of time even when light of a high illuminance is emitted.

DESCRIPTION OF EMBODIMENTS (Photoelectric Conversion Element)

Figure 1:
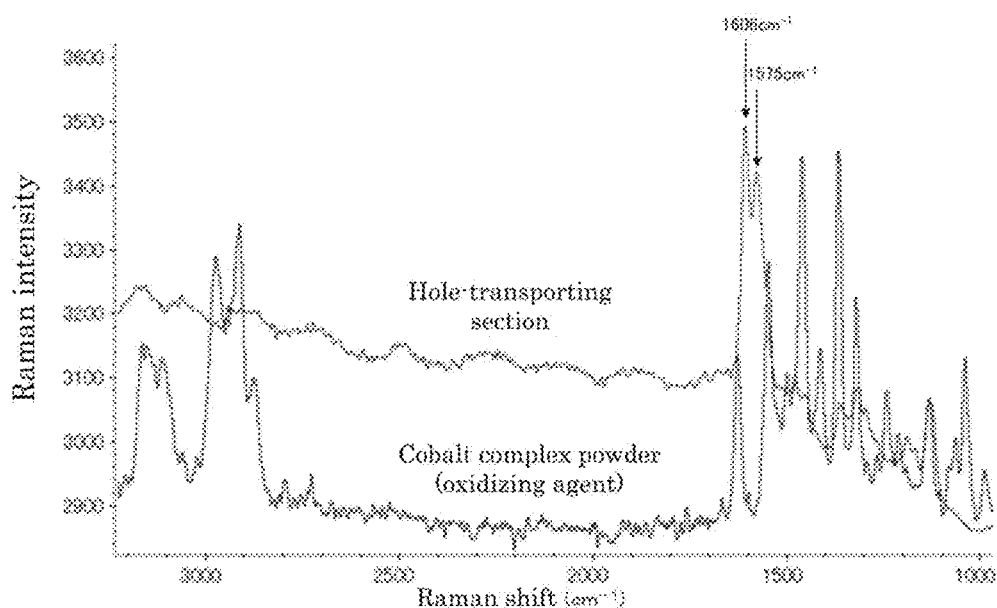
FIG. 1 is a graph of a Raman spectrum obtained by measuring a hole-transporting section of the present disclosure and a cobalt complex powder that is an oxidizing agent.

A photoelectric conversion element of the present disclosure includes: a first electrode section; a second electrode section; an electron-transporting section between the first electrode section and the second electrode section; a light-absorbing section; and a hole-transporting section. The hole-transporting section has a peak that reaches the maximum at a Raman shift of 1575 $cm^{-1}\pm 10$ $cm^{-1}$ and a peak that reaches the maximum at a Raman shift of 1606 $cm^{-1}\pm 10$ $cm^{-1}$ in a Raman spectrum obtained by emitting laser light having a wavelength of 532 nm, and has a peak intensity ratio A/B of 0.80 or more. The peak intensity ratio A/B is obtained from a maximum peak intensity A of the peak that reaches the maximum at 1575 $cm^{-1}\pm 10$ $cm^{-1}$ and a maximum peak intensity B of the peak that reaches the maximum at 1606 $cm^{-1}+10$ $cm^{-1}$.

The photoelectric conversion element means an element that can convert light energy into electric energy.

The photoelectric conversion element of the present disclosure includes a first electrode section, a second electrode section, and an electron-transporting section between the first electrode section and the second electrode section, a light-absorbing section, and a hole-transporting section, preferably includes a substrate and a sealing member, and further includes other members if necessary.

As a result of studies of output characteristics or durability characteristics of a photoelectric conversion element containing a solid hole-transporting material as the hole-transporting section, the present inventors found that output and durability are greatly affected by an amount of radical cations (hereinafter, may be referred to as "oxidized product") generated by oxidizing a hole-transporting material included in a hole-transporting section; i.e., extracting electrons (holes are doped), and the amount of oxidized products exceeding a predetermined level greatly improves not only the output but also the durability.

Moreover, the present inventors found that when the hole-transporting section is subjected to Raman spectroscopy, the oxidized product of the hole-transporting material in the hole-transporting section can be quantified. The present inventors found that it can be determined from a peak intensity ratio A/B obtained from a maximum peak intensity A of the peak that reaches maximum at a Raman shift of 1575 $cm^{-1}\pm 10$ $cm^{-1}$ and a maximum peak intensity B of the peak that reaches maximum at a Raman shift of 1606 $cm^{1}\pm 10$ $cm^{-1}$ in a Raman spectrum obtained by irradiating the hole-transporting section with laser light having a wavelength of 532 nm using a Raman spectroscopic apparatus.

In the present disclosure, when the peak intensity ratio A/B is 0.80 or more, the durability of the photoelectric conversion element can be greatly improved.

It was found that the oxidized product of the hole-transporting material is necessary in order to enhance a hole-transporting property and is also considerably important in order to enhance the durability of the photoelectric conversion element. It is believed that the amount of the oxidized product of the hole-transporting material is determined by various conditions such as an amount of the hole-transporting material, amounts of various additives such as an oxidizing agent and an alkali metal salt included in the hole-transporting section, and an amount of oxygen inside a sealed part.

In the present disclosure, when the hole-transporting section is subjected to Raman spectroscopy, quantification of the oxidized product of the hole-transporting material in the hole-transporting section, which is effective in improvement of the output and the durability, can be realized, and adjusting the amount of the oxidized product to a specific value solves the problems.

<First Electrode Section>

A shape, a size, and the number of the first electrode section are not particularly limited and may be appropriately selected depending on the intended purpose. When the first electrode is a layered form, it may be a single layer structure or may be such a structure that a plurality of materials are laminated.

A material of the first electrode section is not particularly limited and may be appropriately selected depending on the intended purpose, so long as it has electric conductivity and transparency with respect to visible light. Examples thereof include transparent conductive metal oxides, carbon, and metals.

Examples of the transparent conductive metal oxide include indium-tin oxide (referred to as "ITO" hereinafter), fluorine-doped tin oxide (referred to as "FTO" hereinafter), antimony-doped tin oxide (referred to as "ATO" hereinafter), niobium-doped tin oxide (referred to as "NTO" hereinafter), aluminum-doped zinc oxide, indium-zinc oxide, and niobium-titanium oxide.

Examples of the carbon include carbon black, carbon nanotube, graphene, and fullerene.

Examples of the metal include gold, silver, aluminum, nickel, indium, tantalum, and titanium.

These may be used alone or in combination. Among them, a transparent conductive metal oxide having high transparency is preferable, ITO, FPO, ATO, and NTO are more preferable.

An average thickness of the first electrode section is not particularly limited and may be appropriately selected depending on the intended purpose. The average thickness of the first electrode section is preferably 5 nm or more but 100 micrometers or less, more preferably 50 nm or more but 10 micrometers or less. When a material of the first electrode section is carbon or a metal, the average thickness of the first electrode section is preferably an enough average thickness to obtain translucency.

The first electrode section can be formed through known methods such as sputtering, vapor deposition, and spraying.

Moreover, the first electrode section is preferably formed over a first substrate that will be described hereinafter. It is possible to use a commercially available product where a film of the first electrode section has been formed over the first substrate in advance.

Examples of the first substrate over which a film of the first electrode section has been formed include FTO coated glass, ITO coated glass, zinc oxide/aluminum coated glass, FTO coated transparent plastic films, and ITO coated transparent plastic films. Other examples thereof include glass substrates provided with a transparent electrode where tin oxide or indium oxide is doped with a cation or an anion having a different atomic value and glass substrates provided with a metal electrode having such a structure that allows light in the form of a mesh or stripes to pass. These may be used alone, or two or more products may be used in combination as a combined product or a laminate.

Moreover, a metal lead wire may be used in combination in order to decrease an electric resistance value.

A material of the metal lead wire is, for example, aluminum, copper, silver, gold, platinum, and nickel.

The metal lead wire can be used in combination by forming it on the substrate through, for example, vapor deposition, sputtering, or pressure bonding, and disposing a layer of ITO or FPO thereon.

<Electron-Transporting Section>

The electron-transporting section is formed for the purpose of transporting, to the first electrode section, electrons generated in a light-absorbing section that will be described hereinafter, and is appropriately selected depending on the intended purpose without any limitation. The electron-transporting section is preferably formed over the first electrode section or a hole blocking section that will be described hereinafter in the form of layers. In this case, a structure of the electron-transporting section may be a continuous single layer or a multilayer in which a plurality of layers are laminated.

The electron-transporting section includes an electron-transporting material, and further includes other materials if necessary.

Electron-Transporting Material

The electron-transporting material is not particularly limited and may be appropriately selected depending on the intended purpose, but is preferably a semiconductor material.

Moreover, the semiconductor material has a particulate shape, and these particles are joined to be formed over a porous film, which is preferable. The porous film can drastically enlarge a surface area of the film, and can obtain an effect of increasing a light adsorption amount to enhance the output when the light-absorbing section is adsorbed on the surface of the porous film.

The semiconductor material is not particularly limited and known materials can be used. Examples thereof include simple substance semiconductors, compound semiconductors, and compounds having the Perovskite structure.

Examples of the simple substance semiconductor include silicon and germanium.

Examples of the compound semiconductor include chalcogenides of metal. Specific examples thereof include: oxides of titanium, tin, zinc, iron, tungsten, zirconium, hafnium, strontium, indium, cerium, yttrium, lanthanum, vanadium, niobium, and tantalum; sulfides of cadmium, zinc, lead, silver, antimony, and bismuth; selenides of cadmium and lead; and tellurium compounds of cadmium.

Examples of the other compound semiconductor include: phosphides of zinc, gallium, indium, and cadmium; gallium arsenide; copper-indium-selenide, and copper-indium-sulfide.

Examples of the compound having the Perovskite structure include strontium titanate, calcium titanate, sodium titanate, barium titanate, and potassium niobate.

Among them, oxide semiconductors are preferable, particularly, titanium oxide, zinc oxide, tin oxide, and niobium oxide are more preferable. Particularly, when the electron-transporting material of the electron-transporting section is titanium oxide, a conduction band is high, and high open circuit voltage can be obtained. In addition, a high refractive index can be obtained, and a high short-circuit current can be achieved because of a light confinement effect. Moreover, a high dielectric constant and a high mobility can result in a high fill factor, which is advantageous.

These may be used alone or in combination. A crystal type of the semiconductor material is not particularly limited and may be appropriately selected depending on the intended purpose. The crystal type thereof may be a single crystal, polycrystalline, or amorphous.

When a porous film is formed, the number average particle diameter of primary particles of the semiconductor material is not particularly limited and may be appropriately selected depending on the intended purpose. The number average particle diameter thereof is preferably 1 nm or more but 100 nm or less, more preferably 5 nm or more but 50 nm or less. Moreover, a semiconductor material larger than the number average particle diameter may be mixed or laminated. Use of such a semiconductor material may improve a conversion efficiency because of an effect of scattering incident light. In this case, the number average particle diameter is preferably 50 nm or more but 600 nm or less.

An average thickness of the electron-transporting section is not particularly limited and may be appropriately selected depending on the intended purpose. The average thickness thereof is preferably 60 nm or more but 100 micrometers or less, more preferably 100 nm or more but 50 micrometers or less, and even more preferably 150 nm or more but 10 micrometers or less. When the average thickness of the electron-transporting section falls within the aforementioned preferable range, an amount of the photosensitization compound per unit projection area can be sufficiently secured, and a high light-trapping rate can be maintained. Moreover, a diffusion distance of injected electrons is hardly increased, and loss due to recombination of charges can be low.

Therefore, the electron-transporting section having the average thickness falling within the preferable range is advantageous.

A production method of the electron-transporting section is not particularly limited and may be appropriately selected depending on the intended purpose. Examples thereof include a method where a thin film is formed in vacuum, such as sputtering, and a wet film formation method. Among them, in terms of production cost, a wet film formation method is preferable, and a method where paste dispersing powder or sol of a semiconductor material is prepared, and then the paste is coated onto a first electrode section or a hole-blocking section formed thereon is more preferable.

The wet film formation method is not particularly limited and may be appropriately selected depending on the intended purpose. Examples thereof include dipping, spraying, wire-bar coating, spin coating, roller coating, blade coating, and gravure coating.

As a wet printing method, for example, various methods such as relief printing, offset printing, gravure printing, intaglio printing, rubber plate printing, and screen printing can be used.

A method for preparing a dispersion liquid of the semiconductor material is, for example, a method where the semiconductor material is mechanically pulverized using a milling device known in the art. According to the method, a dispersion liquid of the semiconductor material can be prepared by dispersing a particulate semiconductor material alone or a mixture of the semiconductor material and a resin in water or a solvent.

Examples of the resin include polymers or copolymers of vinyl compounds (e.g., styrene, vinyl acetate, acrylic acid ester, and methacrylic acid ester), silicone resins, phenoxy resins, polysulfone resins, polyvinyl butyral resins, polyvinyl formal resins, polyester resins, cellulose ester resins, cellulose ether resins, urethane resins, phenol resins, epoxy resins, polycarbonate resins, polyarylate resins, polyamide resins, and polyimide resins. These may be used alone or in combination.

Examples of the solvent include water, alcohol solvents, ketone solvents, ester solvents, ether solvents, amide solvents, halogenated hydrocarbon solvents, and hydrocarbon solvents.

Examples of the alcohol solvent include methanol, ethanol, isopropyl alcohol, and α-terpineol.

Examples of the ketone solvent include acetone, methyl ethyl ketone, and methyl isobutyl ketone.

Examples of the ester solvent include ethyl formate, ethyl acetate, and n-butyl acetate.

Examples of the ether solvent include diethyl ether, dimethoxy ethane, tetrahydrofuran, dioxolane, and dioxane.

Examples of the amide solvent include N,N-dimethylformamide, N,N-dimethylacetamide, and N-methyl-2-pyrrolidone.

Examples of the halogenated hydrocarbon solvent include dichloromethane, chloroform, bromoform, methyl iodide, dichloroethane, trichloroethane, trichloroethylene, chlorobenzene, o-dichlorobenzene, fluorobenzene, bromobenzene, iodobenzene, and 1-chloronaphthalene. Examples of the hydrocarbon solvent include n-pentane, n-hexane, n-octane, 1,5-hexadiene, cyclohexane, methylcyclohexane, cyclohexadiene, benzene, toluene, o-xylene, m-xylene, p-xylene, ethylbenzene, and cumene.

These may be used alone or in combination.

To the dispersion liquid including the semiconductor material or the paste including the semiconductor material obtained through, for example, the sol-gel method, acid, a surfactant, or a chelating agent may be added in order to prevent re-aggregation of the particles.

Examples of the acid include hydrochloric acid, nitric acid, and acetic acid.

Examples of the surfactant include polyoxyethylene octylphenyl ether.

Examples of the chelating agent include acetyl acetone, 2-aminoethanol, and ethylene diamine.

Moreover, addition of a thickener is also an affective means for the purpose of improving film formation ability.

Examples of the thickener include polyethylene glycol, polyvinyl alcohol, and ethyl cellulose.

After the semiconductor material is coated, firing, irradiation of microwave or electron beams, or irradiation of electron beams can be performed in order to electronically contact particles of the semiconductor material or in order to improve the film strength or adhesiveness to the substrate. These treatments may be performed alone or in combination.

In the case where the electron-transporting section formed of the semiconductor material is fired, a firing temperature thereof is not particularly limited and may be appropriately selected depending on the intended purpose. However, when the temperature is too high, resistance of the substrate may be high or the substrate may be melted. Therefore, the firing temperature thereof is preferably 30 degrees Celsius or higher but 700 degrees Celsius or lower, more preferably 100 degrees Celsius or higher but 600 degrees Celsius or lower. Moreover, the firing time is not particularly limited and may be appropriately selected depending on the intended purpose. The firing time is preferably 10 minutes or longer but 10 hours or shorter.

In the case where the electron-transporting section formed of the semiconductor material is irradiated with microwaves, the irradiation time is not particularly limited and may be appropriately selected depending on the intended purpose. The irradiation time is preferably 1 hour or shorter. In this case, the irradiation may be performed from the side where the electron-transporting section is formed or from the side where the electron-transporting section is not formed.

After the electron-transporting section formed of the semiconductor material is fired, for example, chemical plating using an aqueous solution of titanium tetrachloride or a mixed solution with an organic solvent, or electrochemical plating using an aqueous solution of titanium trichloride may be performed in order to increase a surface area of the electron-transporting section or enhance an electron injection efficiency to the semiconductor material from a photosensitization compound that will be described hereinafter.

The film obtained by firing the semiconductor material having a diameter of several tens of nanometers can form a porous structure. Such a nanoporous structure has an extremely high surface area and the surface area can be represented by a roughness factor. The roughness factor is a numerical value representing an actual area of the inner sides of pores relative to an area of the semiconductor particles coated onto the first substrate. Accordingly, a larger value of the roughness factor is preferable. In terms of a relationship with the average thickness of the electron-transporting section, the roughness factor is preferably 20 or more.

<Light-Absorbing Section>

The light-absorbing section includes a photosensitization compound, and includes other materials if necessary.

A form of the light-absorbing section is not particularly limited and may be appropriately selected depending on the intended purpose. For example, the form of the light-absorbing section may be such a form that the photosensitization compound is adsorbed on the surface of the semiconductor material constituting the aforementioned electron-transporting section or may be such a form that the light-absorbing section is formed over the electron-transporting section in the form of layers.

The photosensitization compound is not particularly limited and may be appropriately selected depending on the intended purpose, so long as the photosensitization compound is a compound that absorbs light to be emitted to a photoelectric conversion element and is excited. Examples thereof include the following compounds known in the art.

Specific examples thereof include metal complex compounds, cumarin compounds described in J. Phys. Chem. C, 7224, Vol. 111 (2007), polyene compounds described in Chem. Commun., 4887 (2007), indoline compounds described in J. Am. Chem. Soc., 12218, Vol. 126 (2004), Chem. Commun., 3036 (2003), and Angew. Chem. Int. Ed., 1923, Vol. 47 (2008), thiophene compounds described in J. Am. Chem. Soc., 16701, Vol. 128 (2006), and J. Am. Chem. Soc., 14256, Vol. 128 (2006), cyanine dyes, merocyanine dyes, 9-arylxanthene compounds, triaryl methane compounds, phthalocyanine compounds and porphyrin compounds described in J. Phys. Chem., 2342, Vol. 91 (1987), J. Phys. Chem. B, 6272, Vol. 97 (1993), Electroanal. Chem., 31, Vol. 537 (2002) J. Porphyrins Phthalocyanines, 230, Vol. 3 (1999), Angew. Chem. Int. Ed., 373, Vol. 46 (2007), and Langmuir, 5436, Vol. 24 (2008).

Among them, metal complex compounds, cumarin compounds, polyene compounds, indoline compounds, and thiophene compounds are preferable. The compounds expressed by Structural Formulas (1), (2), and (3) below available from MITSUIBISHI PAPER MILLS LIMITED, and moreover a compound represented by General Formula (1) below are more preferable. These photosensitization compounds may be used alone or in combination.

[Chem. 1]

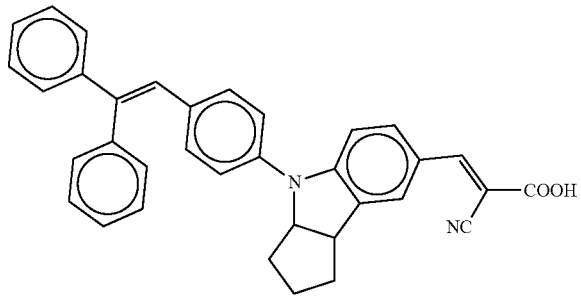

Structural Formula (1)

[Chem. 2]

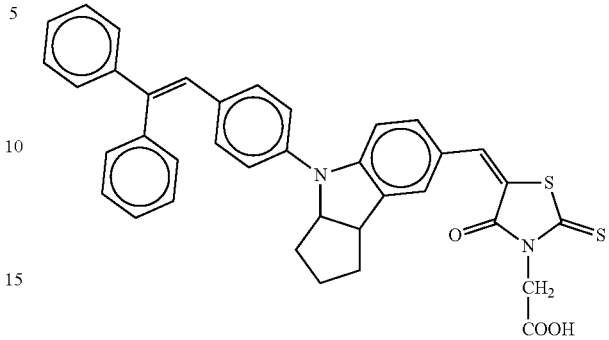

Structural Formula (2)

[Chem. 3]

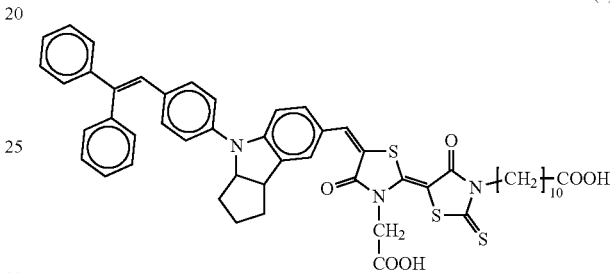

Structural Formula (3)

[Chem. 4]

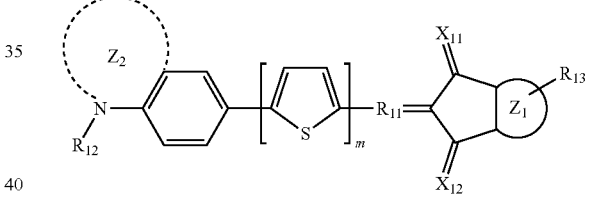

General Formula (1)

In General Formula (1), $X_1$ and $X_2$ are each an oxygen atom, a sulfur atom, or a selenium atom, and $R_{11}$ is a methine group that may have a substituent. Specific examples of the substituent include an aryl group (e.g., a phenyl group and a naphthyl group) and a heterocycle (e.g., a thienyl group and a furyl group).

$R_{12}$ represents an alkyl group that may have a substituent, an aryl group that may have a substituent, or a heterocyclic group that may have a substituent. Examples of the alkyl group include a methyl group, an ethyl group, a 2-propyl group, and a 2-ethylhexyl group. Examples of the aryl group and the heterocyclic group include the groups exemplified above.

$R_{13}$ is an acid group such as carboxylic acid, sulfonic acid, phosphonic acid, boronic acid, or phenols, and $Z_1$ and $Z_2$ are each a substituent that forms a cyclic structure. Examples of $Z_1$ include condensed hydrocarbon-based compounds (e.g., a benzene ring and a naphthalene ring) and heterocycles (e.g., a thiophene ring and a furan ring) each of which may have a substituent. Specific examples of the substituent include the alkyl groups and the alkoxy groups (e.g., a methoxy group, an ethoxy group, and a 2-isopropoxy group) described above. Examples of $Z_2$ include the following (A-1) to (A-22) where m is an integer of from 0 through 2.

[Chem.5]
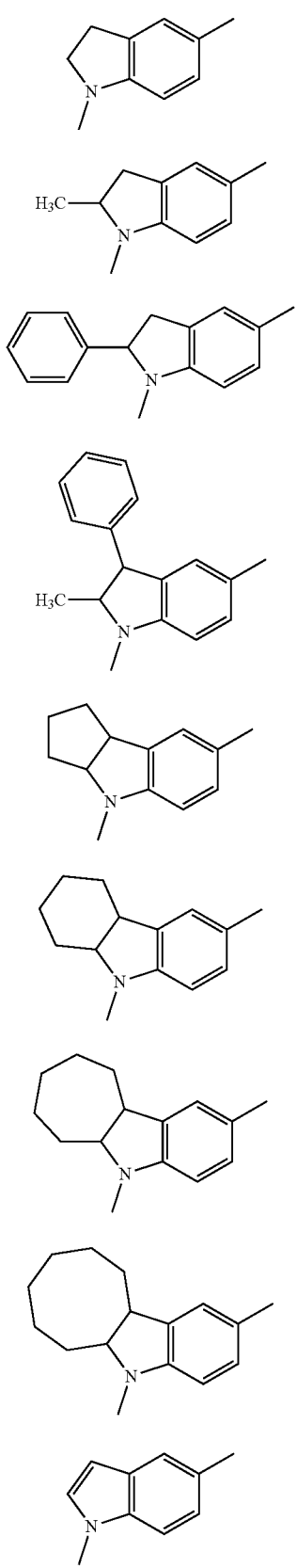
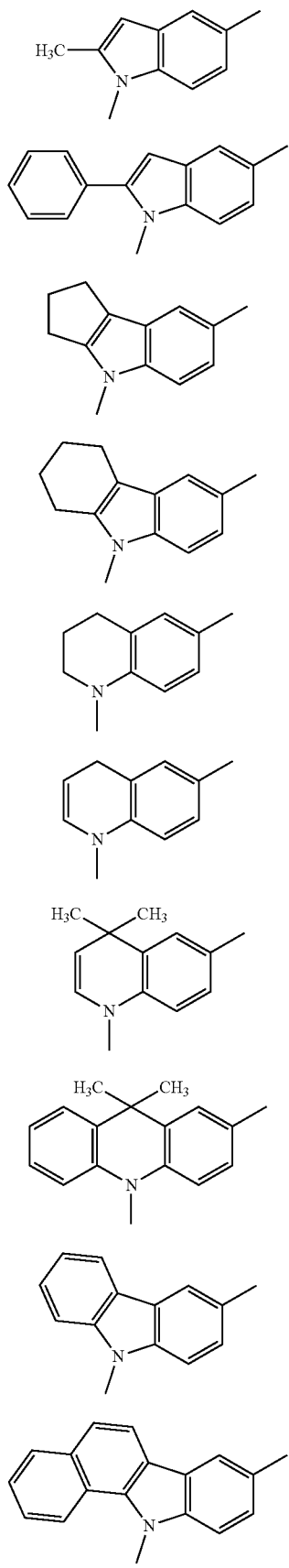

-continued
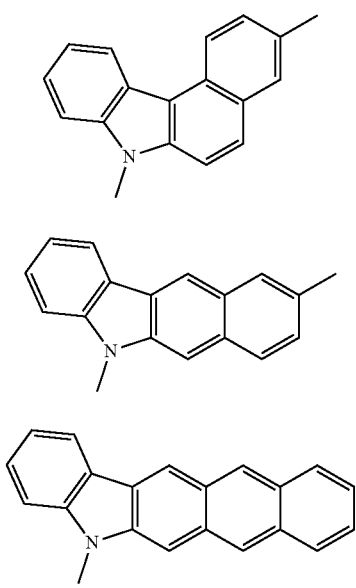
(A-20)
(A-21)
(A-22)
Specific examples of the photosensitization compound including the General Formula (1) include, but are not limited to, the following (B-1) to (B-36).
[Chem. 6]
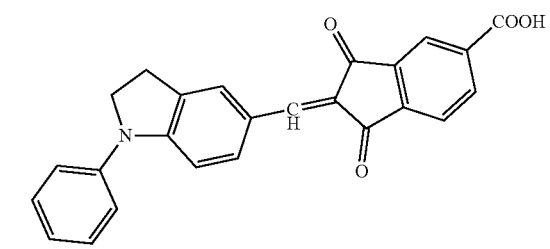
(B-1)
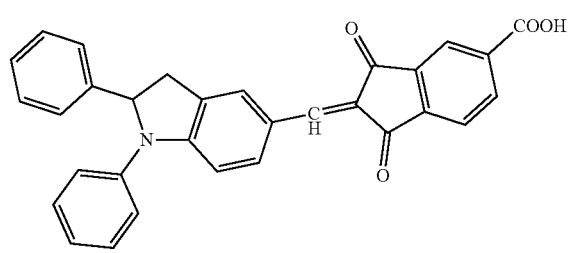
(B-2)
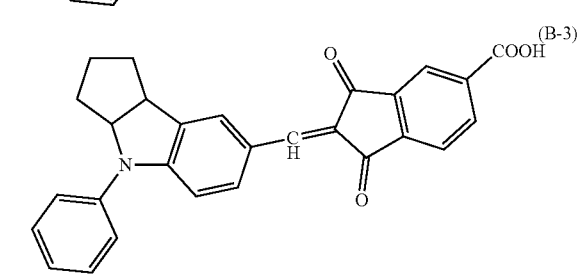
(B-3)
-continued
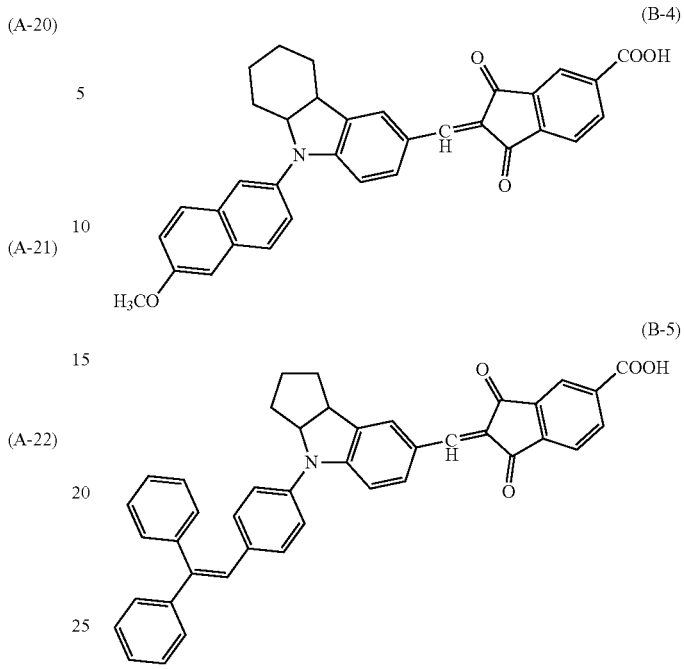
(B-4)
(B-5)
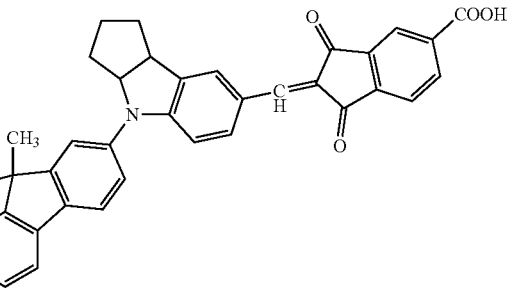
(B-6)
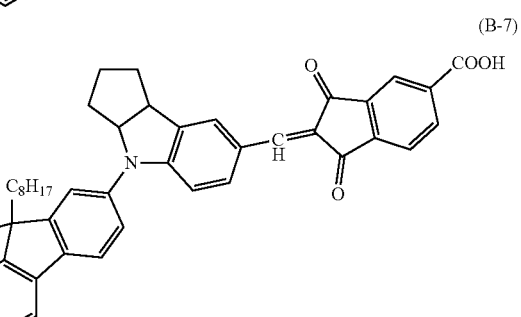
(B-7)
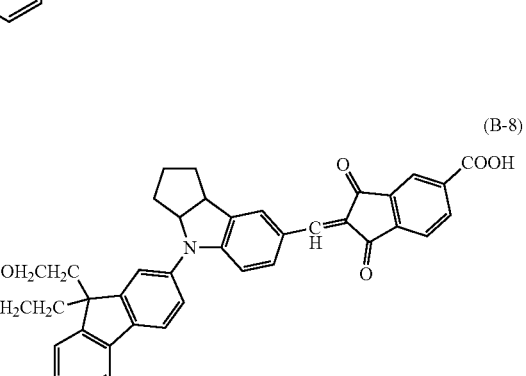
(B-8)

-continued
(B-9)
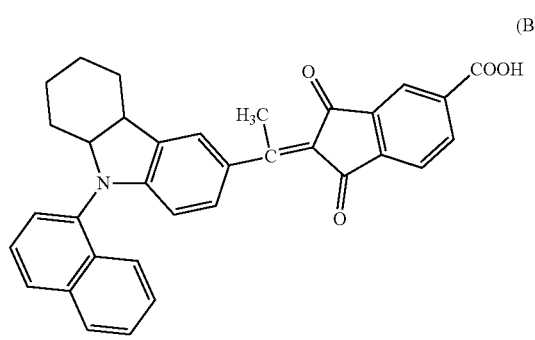
(B-14)
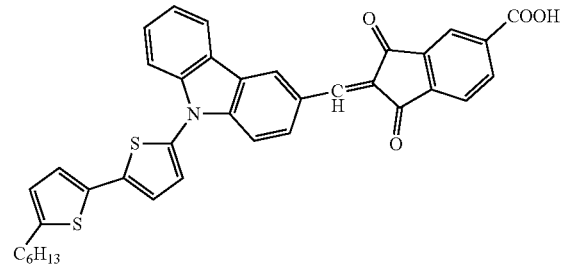
(B-10)
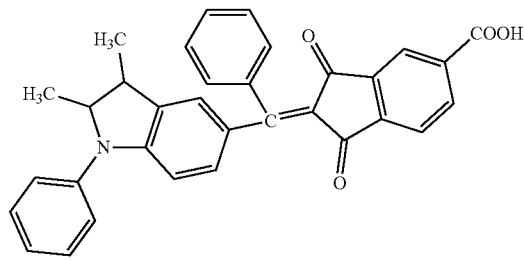
(B-15)
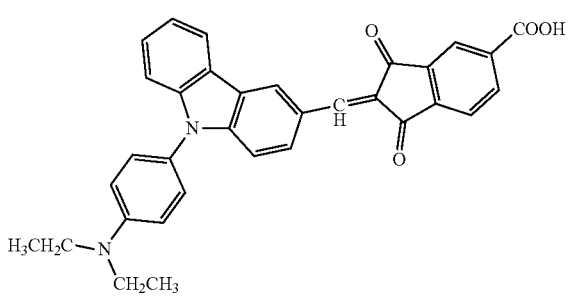
(B-11)
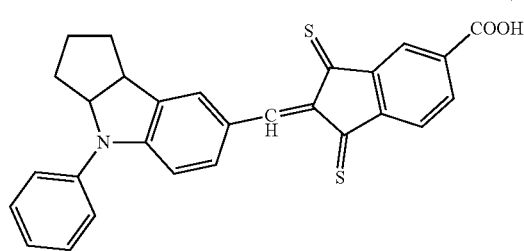
(B-16)
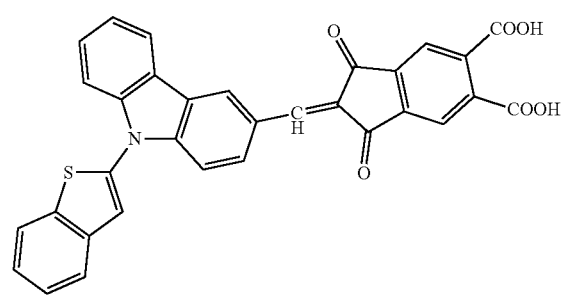
(B-12)
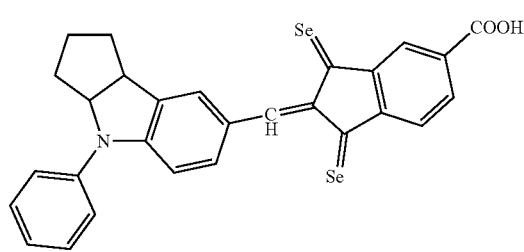
(B-17)
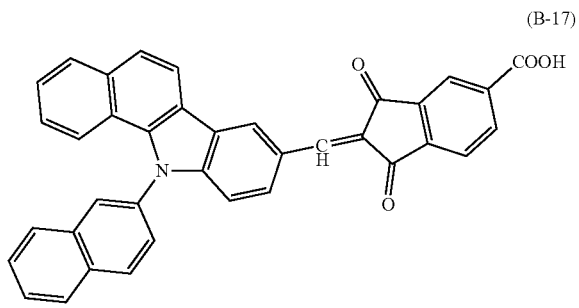
(B-13)
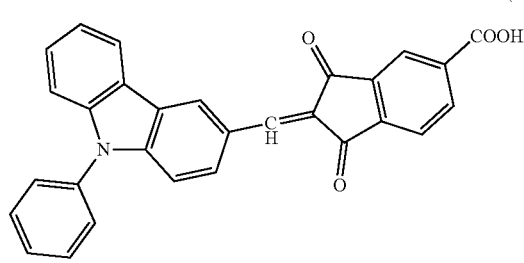
(B-18)
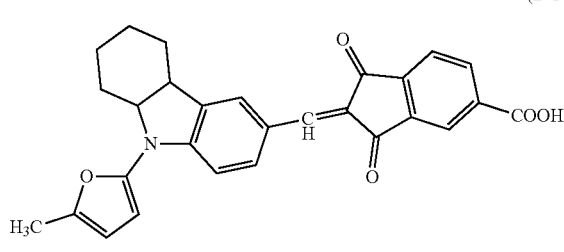

[Chem. 8]
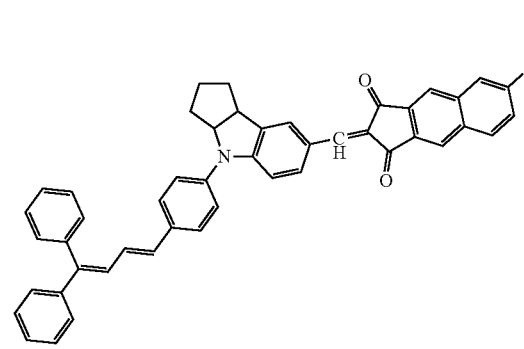
(B-19)
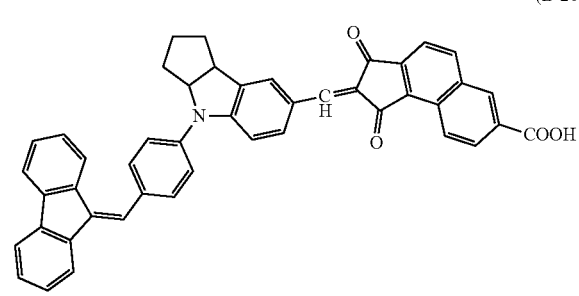
(B-20)
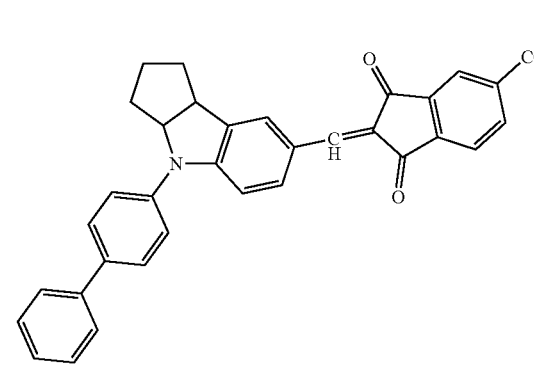
(B-21)
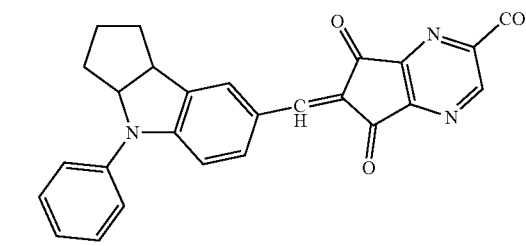
(B-22)
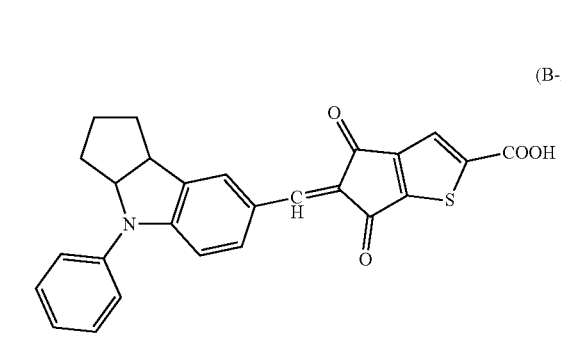
(B-23)
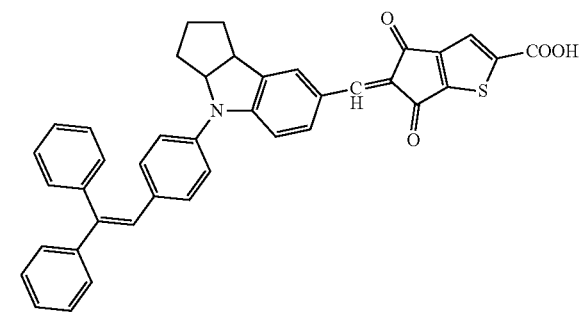
(B-24)
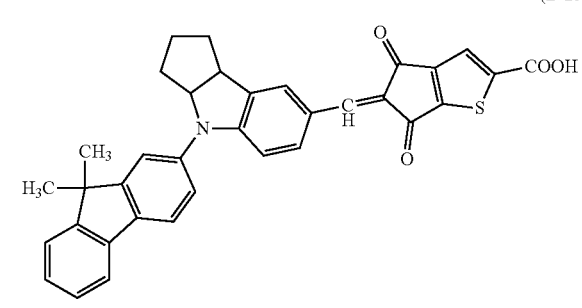
(B-25)
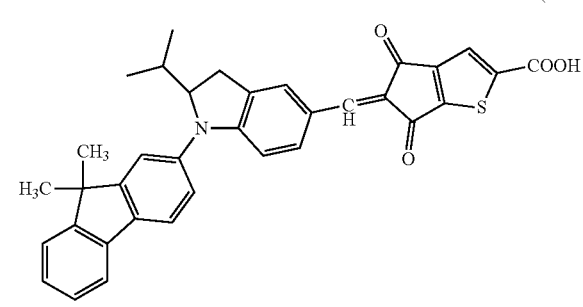
(B-26)
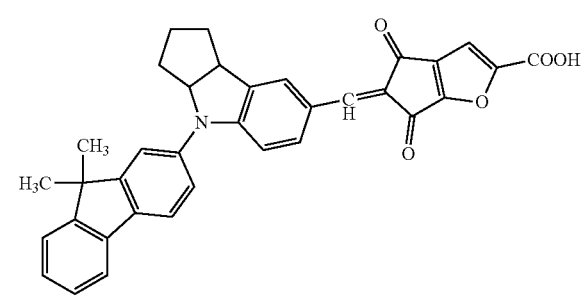
(B-27)
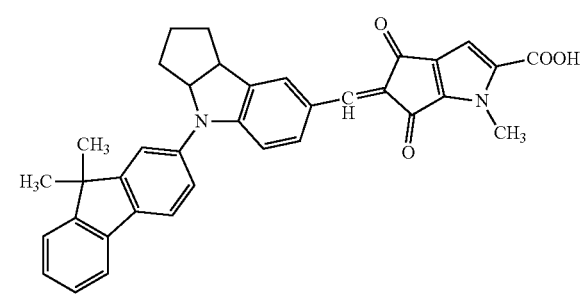
(B-28)

[Chem. 9]
(B-29) 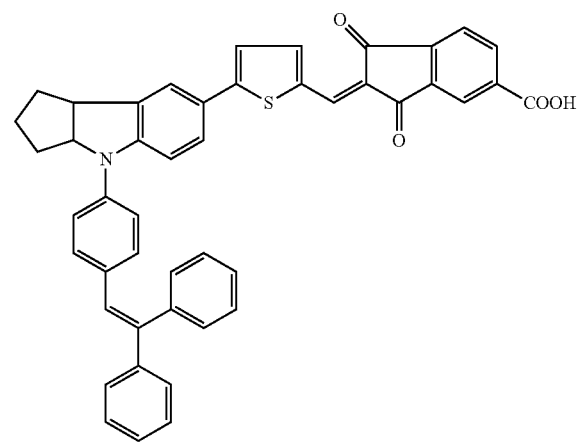
(B-30) 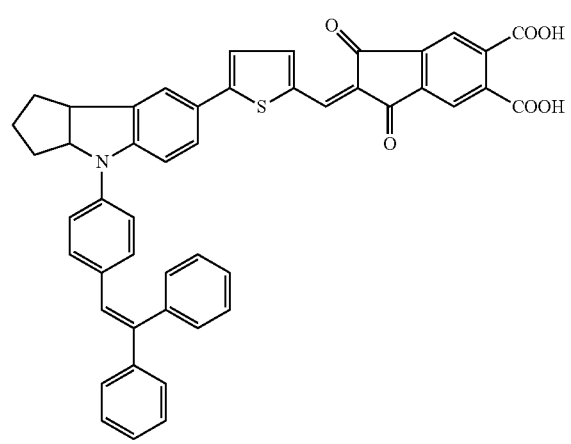
(B-31) 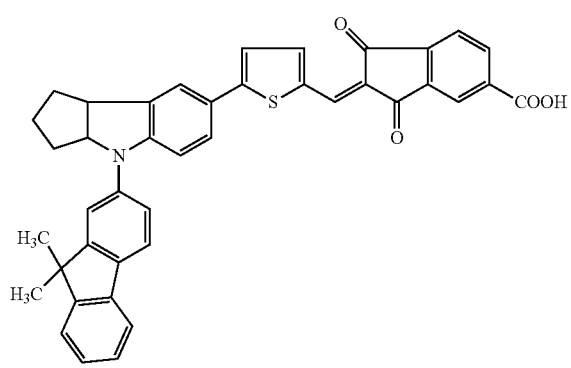
(B-32) 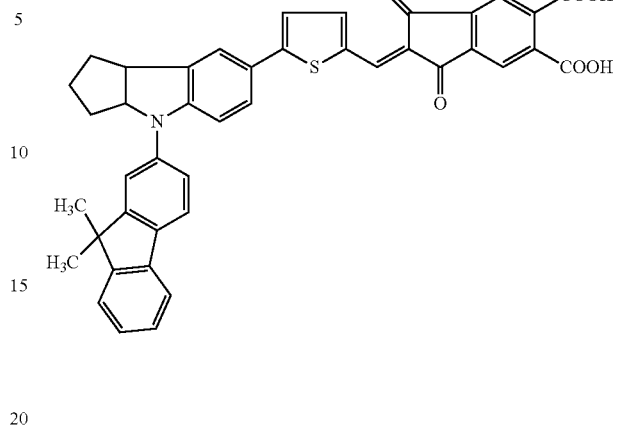
(B-33)
(B-34) 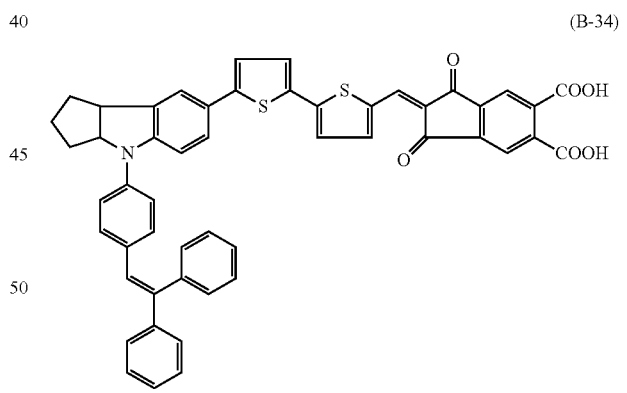
(B-35) 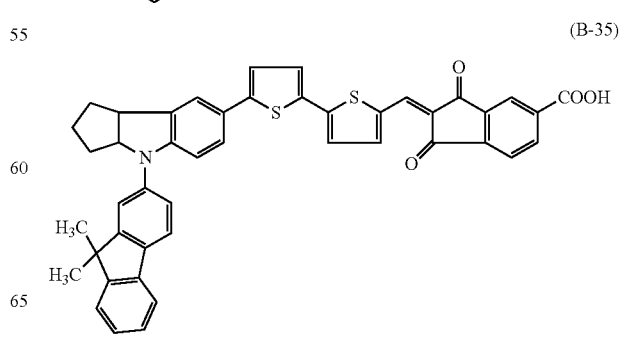

-continued (B-36)

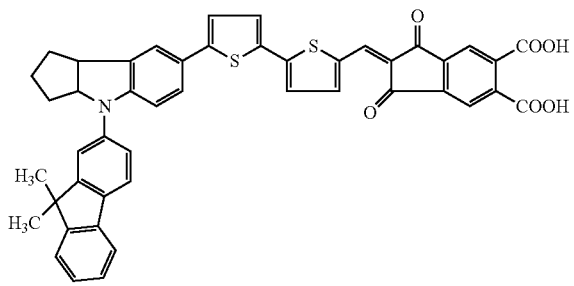

As a method for adsorbing the photosensitization compound on a surface of the semiconductor material of the electron transporting section, for example, it is possible to use a method where the electron-transporting section including the semiconductor material is immersed in a solution of the photosensitization compound or a dispersion liquid of the photosensitization compound, and a method where a solution of the photosensitization compound or a dispersion liquid of the photosensitization compound is coated and adsorbed onto the electron-transporting section. In the case of the method where the electron-transporting section including the semiconductor material is immersed in a solution of the photosensitization compound or a dispersion liquid of the photosensitization compound, the immersion method, the dipping method, the roller method, or the air knife method can be used. In the case of the method where a solution of the photosensitization compound or a dispersion liquid of the photosensitization compound is coated and adsorbed onto the electron-transporting section, wire bar coating, slide hopper coating, extrusion coating, curtain coating, spin coating, or spray coating can be used. Moreover, it is also possible to adsorb the photosensitization compound in a supercritical fluid using, for example, carbon dioxide.

When the photosensitization compound is adsorbed on the semiconductor material, a condensing agent may be used in combination.

The condensing agent may be an agent exhibiting such a catalytic function that a photosensitization compound is physically or chemically bound to a surface of a semiconductor material, and an agent that acts stoichiometrically and advantageously moves a chemical equilibrium. Moreover, thiol or a hydroxyl compound may be added thereto as a condensation auxiliary.

Examples of the solvent that dissolves or disperses the photosensitization compound include water, alcohol solvents, ketone solvents, ester solvents, ether solvents, amide solvents, halogenated hydrocarbon solvents, and hydrocarbon solvents.

Examples of the alcohol solvent include methanol, ethanol, and isopropyl alcohol.

Examples of the ketone solvent include acetone, methyl ethyl ketone, and methyl isobutyl ketone.

Examples of the ester solvent include ethyl formate, ethyl acetate, and n-butyl acetate.

Examples of the ether solvent include diethyl ether, dimethoxy ethane, tetrahydrofuran, dioxolane, and dioxane.

Examples of the amide solvent include N,N-dimethylformamide, N,N-dimethylacetamide, and N-methyl-2-pyrrolidone.

Examples of the halogenated hydrocarbon solvent include dichloromethane, chloroform, bromoform, methyl iodide, dichloroethane, trichloroethane, trichloroethylene, chlorobenzene, o-dichlorobenzene, fluorobenzene, bromobenzene, iodobenzene, and 1-chloronaphthalene.

Examples of the hydrocarbon solvent include n-pentane, n-hexane, n-octane, 1,5-hexadiene, cyclohexane, methylcyclohexane, cyclohexadiene, benzene, toluene, o-xylene, m-xylene, p-xylene, ethylbenzene, and cumene.

These may be used alone or in combination.

Depending on a kind of the photosensitization compound, there is a photosensitization compound that functions more effectively when aggregations between compounds are prevented. Therefore, an aggregation dissociating agent may be used in combination.

The aggregation dissociating agent is not particularly limited and may be appropriately selected depending on a dye to be used. Preferable examples of the aggregation dissociating agent include steroid compounds (e.g., cholic acid and chenodexycholic acid), long-chain alkyl carboxylic acid, or long-chain alkyl phosphonic acid.

An amount of the aggregation dissociating agent is preferably 0.01 parts by mass or more but 500 parts by mass or less, more preferably 0.1 parts by mass or more but 100 parts by mass or less, relative to 1 part by mass of the photosensitization compound.

A temperature at the time when the photosensitization compound, or the photosensitization compound and the aggregation dissociating agent are adsorbed on a surface of the semiconductor material constituting the electron-transporting section is preferably −50 degrees Celsius or higher but 200 degrees Celsius or lower. The adsorption time is preferably 5 seconds or longer but 1,000 hours or shorter, more preferably 10 seconds or longer but 500 hours or shorter, even more preferably 1 minute or longer but 150 hours or shorter. The adsorption step is preferably performed in the dark. Moreover, the adsorption step may be performed with still standing or under stirring.

A stirring method is not particularly limited and may be appropriately selected depending on the intended purpose. Examples thereof include methods using, for example, a stirrer, a ball mill, a paint conditioner, a sand mill, Attritor, a disperser, and an ultrasonic disperser.

As the photosensitization compound, a Perovskite compound is effectively used. The Perovskite compound is a composite substance of an organic compound and an inorganic compound, and is represented by the following General Formula (A).

$$X\alpha Y\beta M\gamma \qquad \text{General Formula (A)}$$

In the General Formula (A), a ratio of $\alpha:\beta:\gamma$ is 3:1:1, and $\beta$ and $\gamma$ are an integer of more than 1. For example, X may be a halogen ion, Y may be an alkylamine compound ion, and M may be a metal ion.

X in the General Formula (A) is not particularly limited and may be appropriately selected depending on the intended purpose. Examples thereof include halogen ions such as chlorine, bromine, and iodine. These may be used alone or in combination.

Examples of Y in the General Formula (A) include alkylamine compound ions (e.g., methylamine, ethylamine, n-butylamine, and formamidine), cesium, potassium, and rubidium. Alternatively, in the case of the Perovskite compound of lead halide-methylammonium, the peak λmax of light-absorbing spectrum is about 350 nm in the case where the halogen ion is Cl, the peak λmax thereof is about 410 nm in the case where the halogen ion is Br, and the peak λmax thereof is about 540 nm in the case where the halogen ion is I. That is, the peaks λmax are shifted to a side of a long-wavelength side in this order, and a usable spectrum width (band width) is different.

M in the General Formula (A) is not particularly limited and may be appropriately selected depending on the intended purpose. Examples thereof include metals such as lead, indium, antimony, tin, copper, and bismuth.

A layer of the Perovskite compound preferably has a layered Perovskite structure obtained by alternately laminating a layer formed of a metal halide and a layer in which organic cation molecules are arranged.

A method for forming the layer of the Perovskite compound is not particularly limited and may be appropriately selected depending on the intended purpose. For example, one example is a method where a solution obtained by dissolving or dispersing metal halide and halogenated alkylamine is coated and dried.

Examples of the method for forming the layer of the Perovskite compound include a two-step precipitation method where a solution obtained by dissolving or dispersing metal halide is coated and dried, and the resultant is immersed in a solution obtained by dissolving halogenated alkylamine to thereby form a Perovskite compound.

Moreover, one example of the method for forming the layer of the Perovskite compound is, for example, a method where a solution obtained by dissolving or dispersing metal halide and halogenated alkylamine is coated while a poor solvent (a solvent having a small solubility) for the Perovskite compound is added thereto, to thereby precipitate crystals. In addition, examples of the method for forming the layer of the Perovskite compound include a method where metal halide is deposited in a gas filled with methylamine.

Among them, preferable is a method where a solution obtained by dissolving or dispersing metal halide and halogenated alkylamine is coated while a poor solvent for the Perovskite compound is added thereto, to thereby precipitate crystals.

A method for coating a solution is not particularly limited and may be appropriately selected depending on the intended purpose. Examples thereof include the immersion method, the spin-coating method, the spray method, the dip method, the roller method, and the air knife method. The method for coating a solution may be, for example, a method where precipitation is performed in a supercritical fluid using, for example, carbon dioxide.

The layer of the Perovskite compound preferably includes a sensitizing dye.

A method for forming a Perovskite layer including a sensitizing dye is not particularly limited and may be appropriately selected depending on the intended purpose. Examples thereof include a method where a Perovskite compound and a sensitizing dye are mixed and a method where a Perovskite layer is formed and then a sensitizing dye is adsorbed thereon.

In the present disclosure, the light-absorbing section can function as the electron-transporting section or a hole-transporting section that will be described hereinafter. For example, when the electron-transporting section includes the semiconductor material that can absorb light, it can have a function as the light-absorbing section and a function as the electron-transporting section, and can function as the light-absorbing section and the electron-transporting section.

<Hole-Transporting Section>

The peak intensity ratio A/B of the present disclosure can be determined using Raman spectroscopy. In the Raman spectroscopy, when scattering light generated when monochrome laser beams are emitted toward a substance is observed, Raman scattering light having a different wavelength from that of the laser light is included in addition to Rayleigh scattering having the same wavelength as that of the laser light. When characteristics of the Raman scattering light are examined, information on molecule structures and crystal structures can be obtained.

In the present disclosure, it was found that, in a Raman spectrum obtained by irradiating the hole-transporting section with laser light having a wavelength of 532 nm (spectrum obtained by converting each wavelength spectrally diffracted to a wavenumber and then plotting a difference between the obtained wavenumber and the wavenumber of the incident light in the horizontal axis and the intensity in the longitudinal axis), a peak that reached the maximum at a Raman shift (shift value from the wavenumber of the incident light) of $1575$ $cm^{-1} \pm 10$ $cm^{-1}$ and a peak that reached the maximum at a Raman shift of $1606$ $cm^{-1} \pm 10$ $cm^{-1}$ were observed, and the former peak that reached the maximum at $1575$ $cm^{-1} \pm 10$ $cm^{-1}$ is a peak derived from the oxidized product of the hole-transporting material. Meanwhile, it was found that since the peak that reaches the maximum at $1606$ $cm^{-1} \pm cm^{-1}$ is not derived from the oxidized product, the oxidized product can be quantified by determining a peak intensity ratio A/B between a maximum peak intensity A of the peak that reaches the maximum at $1575$ $cm^{-1} \pm 10$ $cm^{-1}$ and a maximum peak intensity B of the peak that reaches the maximum at $1606$ $cm^{-1} \pm 10$ $cm^{-1}$. The present inventors further found that the peak intensity ratio AB of 0.80 or more can significantly improve the output and the durability of the photoelectric conversion element and completed the present invention.

An apparatus for the Raman spectroscopy can be any apparatus so long as the apparatus for the Raman spectroscopy can emit laser light having a wavelength of 532 nm. The apparatus configuration is mainly constituted with a laser light source, a spectrometer; and a detector. Furthermore, a microscopic Raman spectroscopic apparatus in combination with a microscope is useful because minute regions can be measured. In the present disclosure, as the Raman spectroscopic apparatus, a 3D laser Raman spectroscopic apparatus "Nanofinder 30" (available from Tokyo Instruments, Inc.) was used.

The irradiation intensity of the laser light is not particularly limited and can be freely set depending on the intended purpose. A high irradiation intensity enhances detection sensitivity, but may result in a risk of deteriorating materials contained in the hole-transporting section. Therefore, the irradiation intensity of the laser light is preferably as low as possible for measurement.

The exposure time is not particularly limited and may be freely set depending on the intended purpose. The exposure time is 1 second or longer, preferably 120 seconds or shorter, more preferably 10 seconds or longer, still more preferably 60 seconds or shorter. This makes it possible to make an SN ratio high and to prevent an influence by the deteriorated material.

The cumulative number is not particularly limited and may be freely set depending on the intended purpose. The cumulative number is 1 time or more, preferably 1 time or more but 50 times or less, more preferably 1 time or more but 30 times or less, still more preferably 1 time or more but 10 times or less. As the exposure frequency is increased, the SN ratio is higher. However, it is preferable to keep the cumulative number as small as possible because the influence by the deteriorated material may be increased.

The magnification of the objective lens is not particularly limited and may be freely set depending on the intended purpose. The magnification thereof is preferably 1 fold or more but 100 folds or less, more preferably 10 folds or more but 50 folds or less.

The Raman spectroscopy of the hole-transporting section can be measured by opening the sealed part of the photoelectric conversion element and further exfoliating the second electrode. However, the Raman spectroscopy thereof can be nondestructively measured with the sealed part being maintained and without exfoliating the second electrode so long as the hole-transporting section can be partially identified under a microscope. In a region where the hole-transporting section and the light-absorbing section are overlapped, it is difficult to detect a peak and to perform the measurement. Therefore, a region where the hole-transporting section and the light-absorbing section are not overlapped is preferably measured as far as possible. Note that, even in a region where the hole-transporting section and the light-absorbing section are overlapped, when the exposure time is increased or the cumulative number is increased, fluorescence of the photosensitization compound contained in the light-absorbing section may vanish gradually to thereby detect a peak in some cases.

A plurality of different portions on the hole-transporting section are measured for the Raman spectroscopy, and an average value is preferably calculated. The average value is preferably an average value of values on two or more portions, and is more preferably an average value of values on five portions.

A software that makes a baseline clear and can accurately determine a maximum peak intensity is preferably used in order to determine the peak intensity ratio AB from the Raman spectra obtained. Examples of the software include OMNIC software.

The peak intensity ratio A/B can be determined in the following manner. First, a base line is drawn between a Raman shift of $1647\ cm^{-1} \pm 1\ cm^{-1}$ and a Raman shift of $1521\ cm^{-1} \pm 1\ cm^{-1}$. Then, the maximum peak intensity A of the peak that reaches the maximum at a Raman shift of $1575\ cm^{-1} \pm 10\ cm^{-1}$ and the maximum peak intensity B of the peak that reaches the maximum at a Raman shift of $1606\ cm^{-1} \pm 10\ cm^{-1}$ are read, to thereby calculate a peak intensity ratio A/B.

The peak intensity ratio A/B in the present disclosure can be determined in the above method and can be defined as a peak intensity ratio A/B in the present disclosure that is calculated by drawing a baseline and then reading maximum peak intensities A and B as descried above.

FIG. 1 presents Raman spectrum obtained by measuring the hole-transporting section of the present disclosure through the above method and Raman spectrum obtained by measuring a cobalt complex powder that is an oxidizing agent.

In the Raman spectrum of the hole-transporting section, a peak that reaches the maximum at a Raman shift of $1575\ cm^{-1} \pm 10\ cm^{-1}$ that is derived from the oxidized product and a peak that reaches the maximum at a Raman shift of $1606\ cm^{-1} \pm 10\ cm^{-1}$ can be confirmed. Meanwhile, regarding the Raman spectrum of the cobalt complex powder of the oxidizing agent, a peak is not observed at $1575\ cm^{-1} \pm 10\ cm^{-1}$ at which a peak of the oxidized product is found. Comparing the Raman spectrum of the hole-transporting section with the Raman spectrum of the cobalt complex powder, it is found that the peaks do not correspond to another peak.

From the above, it is clear that the peak at $1575\ cm^{-1} \pm 10\ cm^{-1}$ found in the Raman spectrum obtained by irradiating the hole-transporting section with laser light having a wavelength of 532 nm is not derived from the oxidizing agent.

Next, the hole-transporting section of the present disclosure will be described.

The hole-transporting section is formed for the purpose of transporting holes generated in the above-described light-absorbing section to a second electrode section that will be described hereinafter, and is appropriately selected depending on the intended purpose without any limitation. The hole-transporting section is preferably formed in the form of layers with the hole-transporting section being in contact with the light-absorbing section. In this case, a structure of the hole-transporting section may be a continuous single layer or a multilayer in which a plurality of layers are laminated.

The hole-transporting section includes a hole-transporting material and an oxidizing agent, and further includes other materials if necessary.

As the hole-transporting material, an organic compound (organic p-type semiconductor material) that can transport holes is used. The hole-transporting material may be used alone or two or more hole-transporting materials may be used in combination.

As the hole-transporting material, conventionally known materials can be used. Examples thereof include spiro compounds presented in Japanese Translation of PCT International Application Publication No. JP-T-11-513522, stilbene compounds presented in Japanese Unexamined Patent Application Publication No. 58-65440 and Japanese Unexamined Patent Application Publication No. 60-98437, hydrazone compounds presented in Japanese Examined Patent Publication No. 55-42380, pyrazoline compounds presented in Japanese Examined Patent Publication No. 52-4188, oxadiazole compounds presented in Japanese Examined Patent Publication No. 34-5466, oxadiazole compounds presented in Japanese Unexamined Patent Application Publication No. 56-123544, triphenylmethane compounds presented in Japanese Examined Patent Publication No. 45-555, and tetraarylbenzidine compounds presented in Japanese Unexamined Patent Application Publication No. 54-58445. These may be used alone or in combination. In addition, a polymer material may be used in combination. Among these hole-transporting materials, spiro compounds are particularly preferable.

Examples of the spiro compound include compounds including the following General Formula (2).

[Chem. 10]

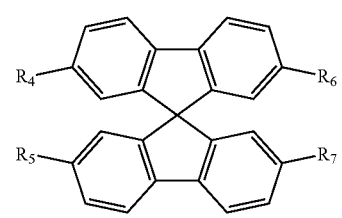

General Formula (2)

In General Formula (2), $R_4$ to $R_7$ represent a substituted amino group such as a dimethylamino group, a diphenylamino group, and a naphthyl-4-tolylamino group.

The spiro compound is not particularly limited and may be appropriately selected depending on the intended purpose. Examples thereof include, but are not limited to, the following exemplified compounds D-1 to D-20. These may be used alone or in combination.

[Chem. 11]
(D-1) 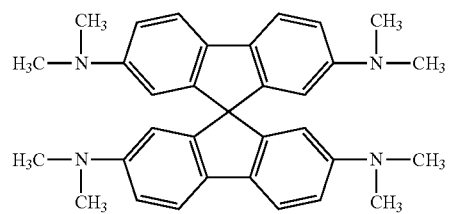
(D-2) 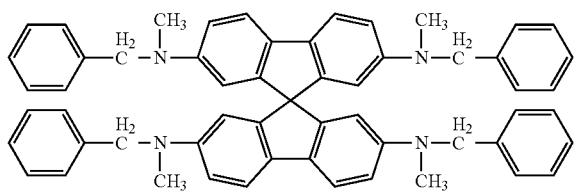
(D-3) 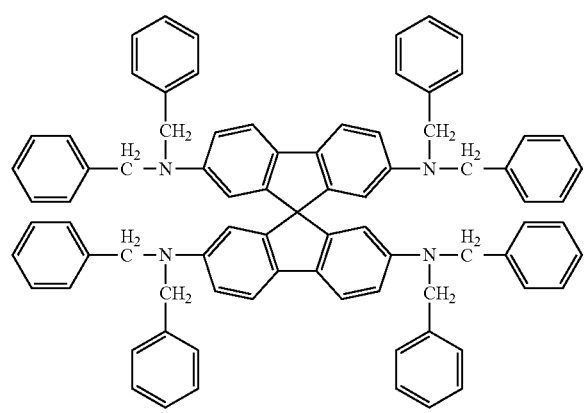
(D-4) 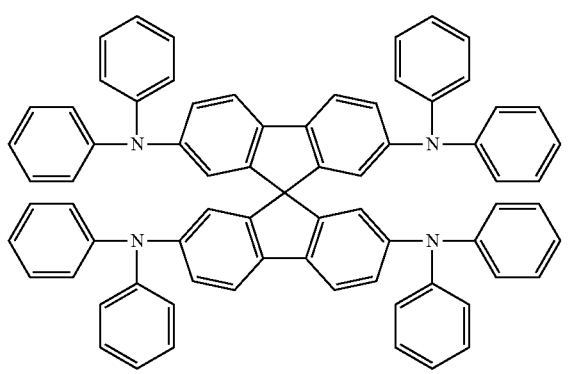
[Chem. 12]
(D-5) 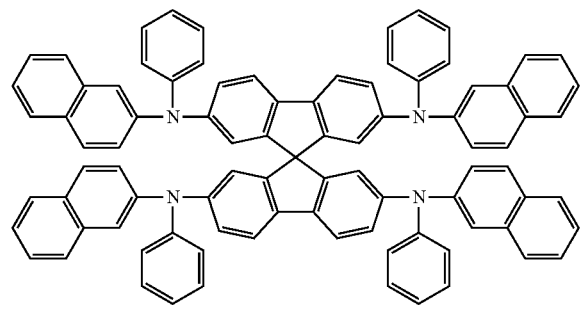
(D-6) 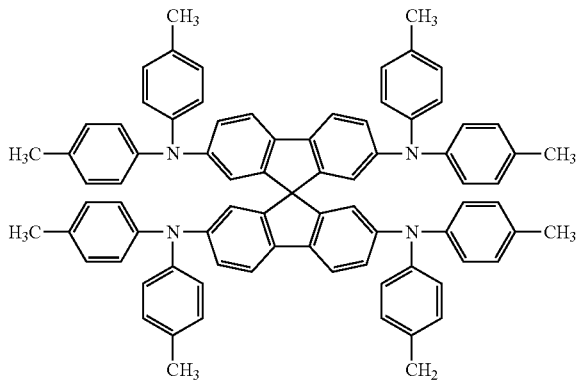
(D-7) 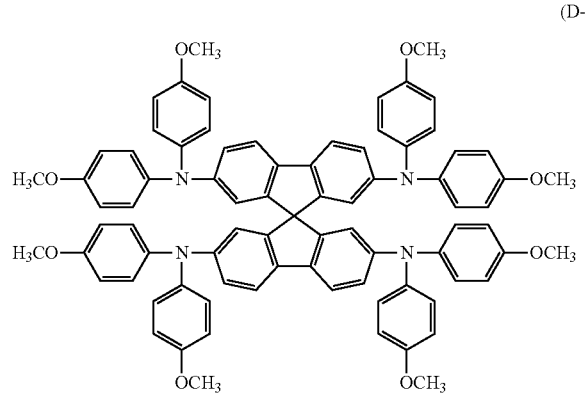
(D-8) 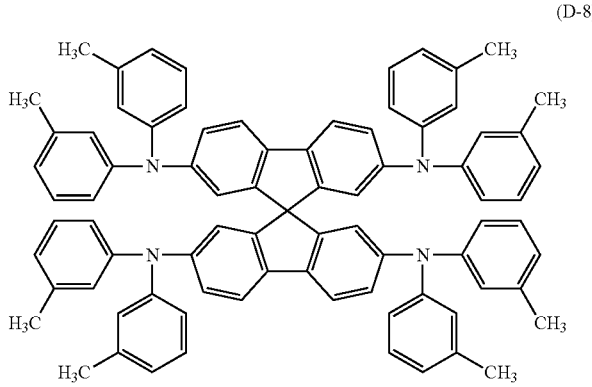

-continued
(D-9)
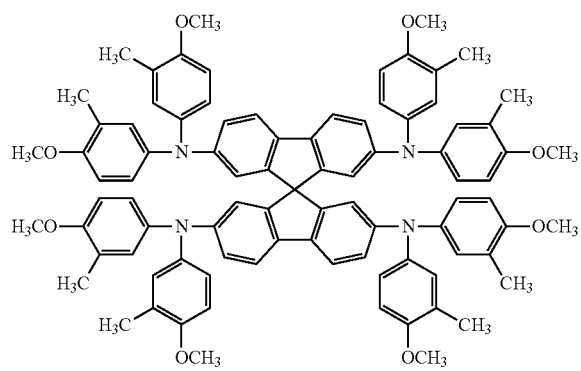
(D-10)
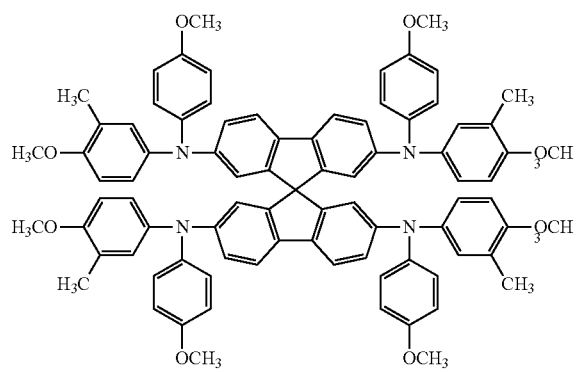
(D-11)
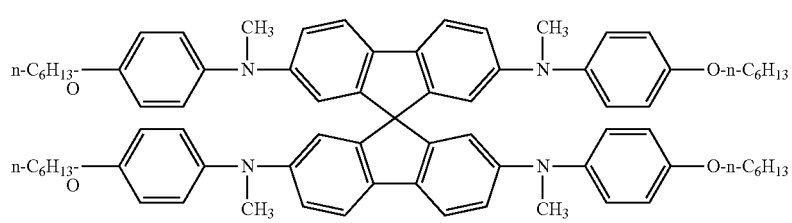
(D-12)
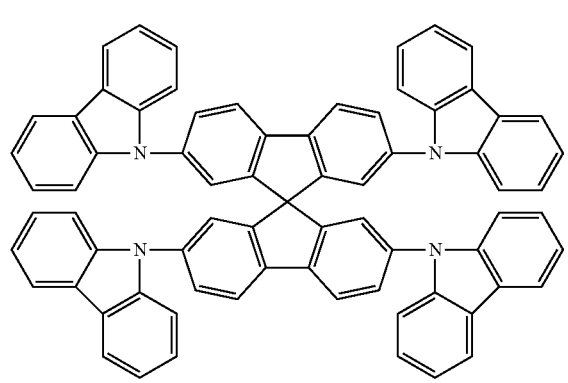
(D-13)
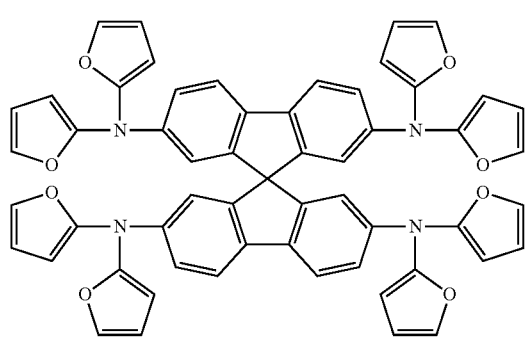
(D-14)
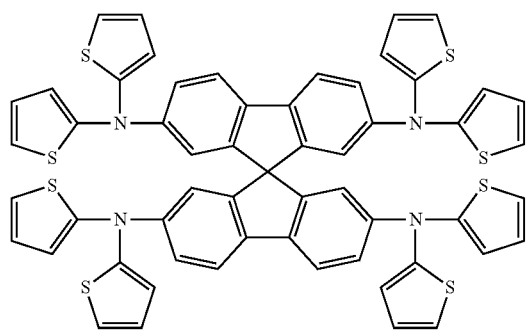

[Chem. 16]

(D-15)
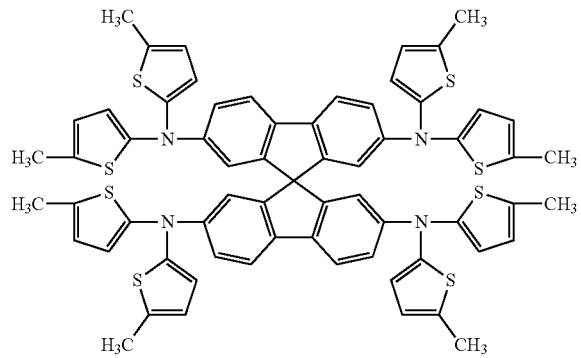

(D-16)
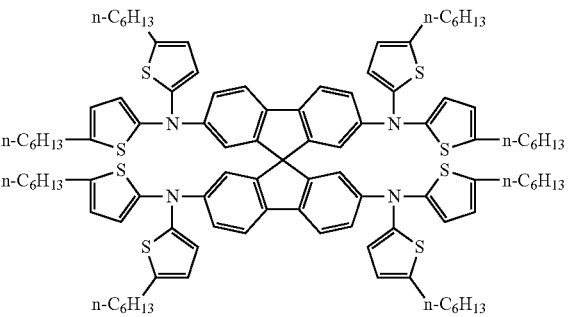

(D-17)
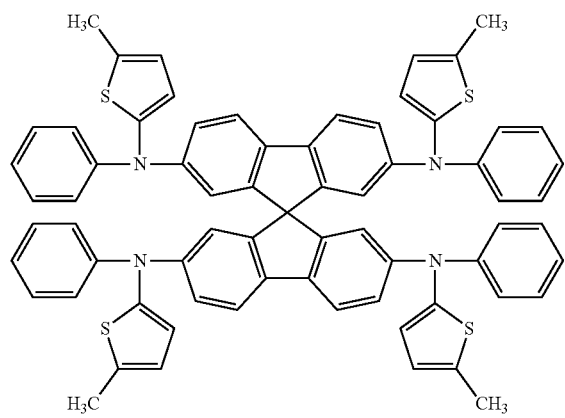

(D-18)
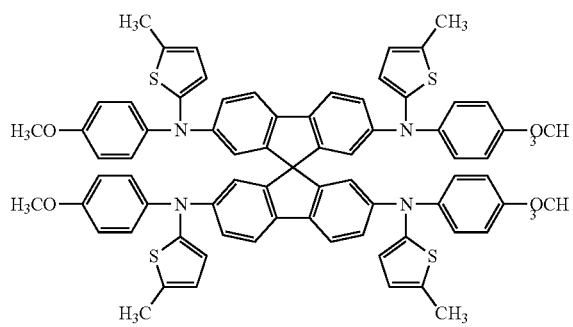

[Chem. 17]

(D-19)
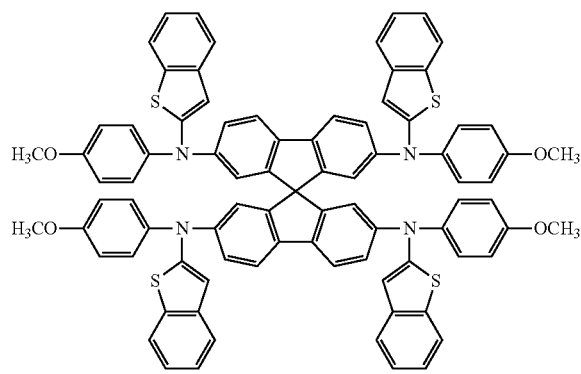

(D-20)
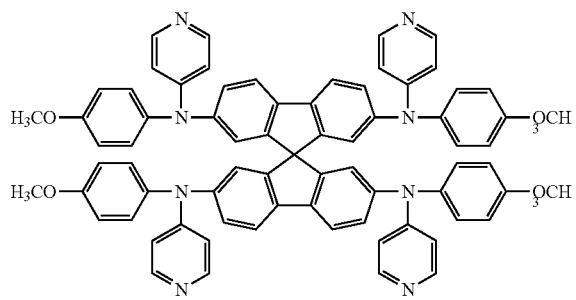

Because these spiro compounds have high hole mobility and two benzidine skeleton molecules are spirally bound, a nearly spherical electron cloud is formed and hopping conductivity between molecules is excellent. Therefore, the spiro compounds exhibit excellent photoelectric conversion properties. Moreover, the spiro compounds are dissolved in various organic solvents because of high solubility. Because the spiro compounds are amorphous (amorphous substances that do not have a crystal structure), the spiro compounds tend to be densely filled in a porous electron-transporting section. Because the spiro compounds do not absorb light of 450 nm or longer, light absorption of the photosensitization compound can be effectively performed, which is particularly preferable for a solid dye-sensitized solar cell.

The oxidizing agent has a function of oxidizing the hole-transporting material. The hole-transporting material is deprived of electrons (holes are provided) by the oxidizing agent and therefore becomes an oxidized product to thereby improve a hole-transporting property. Generally, the hole-transporting property is poorer than the electron-transporting property. Therefore, improvement of the hole-transporting property results in large effects such as improvement of the output as well as improvement of the durability and the stability.

The oxidizing agent is not particularly limited and may be appropriately selected depending on the intended purpose so long as it has a function of oxidizing the hole-transporting material. Examples thereof include tris(4-bromophenyl)aminium hexachloroantimonate, silver hexafluoroantimonate, nitrosonium tetrafluoroborate, silver nitrate, metal complexes, and hypervalent iodine compounds. These may be used alone or in combination. Among them, metal complexes are more preferable. Use of the metal complex as the oxidizing agent is advantageous because it has high solubility and remaining products do not easily remain.

Examples of the metal complex include a composition including, for example, a metal cation, a ligand, and an anion.

Examples of the metal cation include cations of, for example, chromium, manganese, iron, cobalt, nickel, copper, molybdenum, ruthenium, rhodium, palladium, silver, tungsten, rhenium, osmium, iridium, gold, and platinum. Among them, cations of iron, cobalt, nickel, and copper are preferable, and a cobalt complex is more preferable. The cobalt complex is preferably a trivalent cobalt complex.

The ligand preferably includes a 5-membered heterocycle and/or a 6-membered heterocycle including at least one nitrogen, and may include a substituent. Specific examples thereof include, but are not limited to, the following compounds.

[Chem. 18]

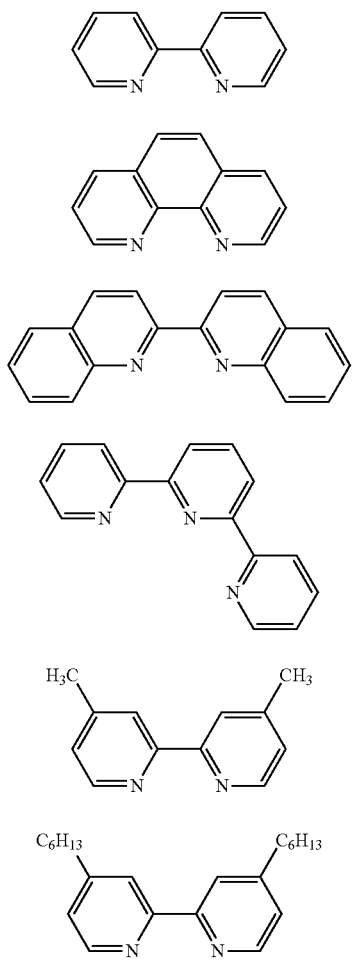

(E-1)

(E-2)

(E-3)

(E-4)

(E-5)

(E-6)

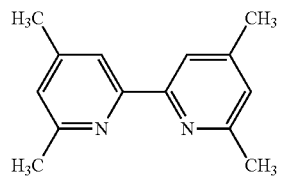

(E-7)

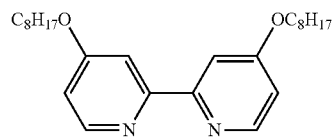

(E-8)

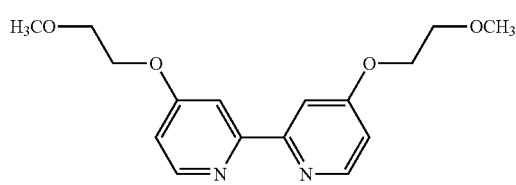

(E-9)

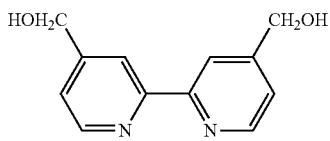

(E-10)

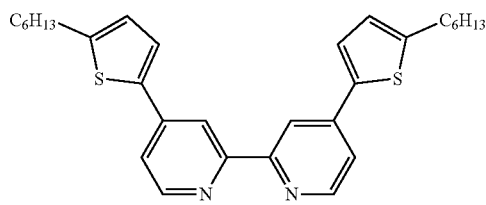

(E-11)

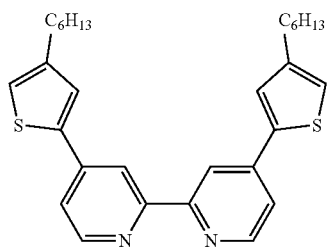

(E-12)

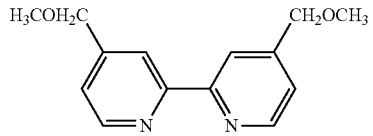

(E-13)

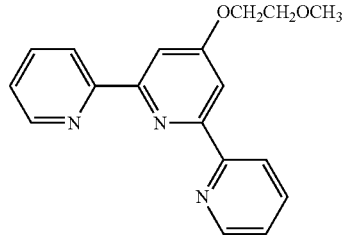

(E-14)

-continued
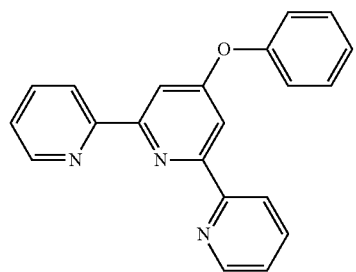
(E-15)
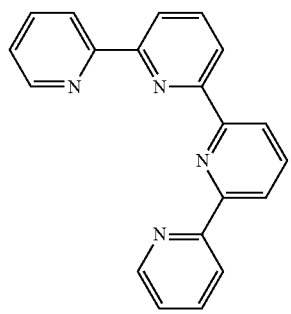
(E-16)
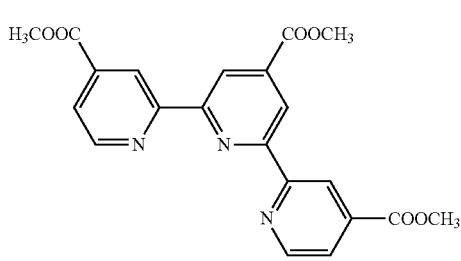
(E-17)
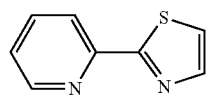
(E-18)
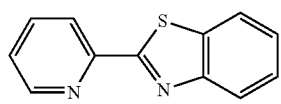
(E-19)
[Chem. 19]
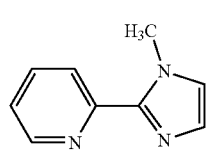
(E-20)
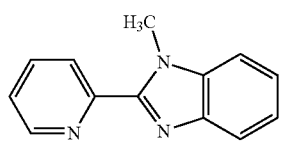
(E-21)
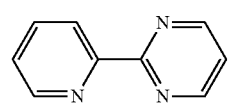
(E-22)
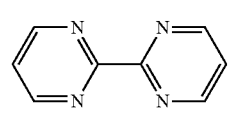
(E-23)
-continued
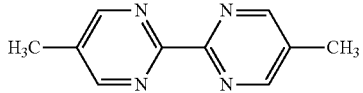
(E-24)
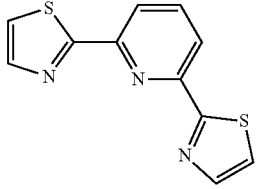
(E-25)
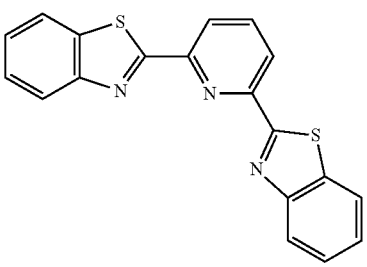
(E-26)
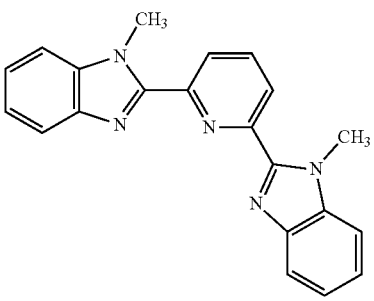
(E-27)
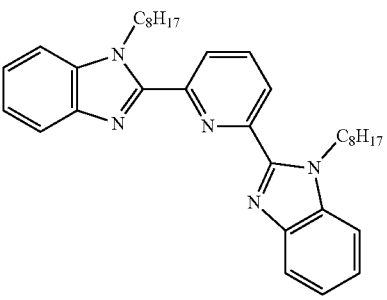
(E-28)
[Chem. 20]
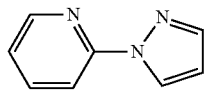
(E-29)
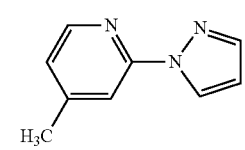
(E-30)

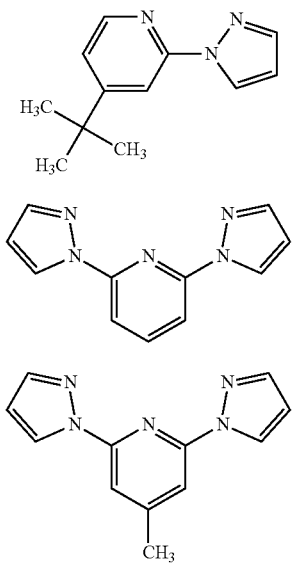

(E-31)

(E-32)

(E-33)

Examples of the anion include a hydride ion (H⁻), a fluoride ion (F⁻), a chloride ion (Cl⁻), a bromide ion (Br⁻), an iodide ion (I⁻), a hydroxide ion (OH⁻), a cyanide ion (CN⁻), a nitric acid ion ($NO_3^-$), a nitrous acid ion ($NO_2^-$), a hypochlorous acid ion (ClO⁻), a chlorous acid ion ($ClO_2^-$), a chloric acid ion ($ClO_3^-$), a perchloric acid ion ($ClO_4^-$), a permanganic acid ion ($MnO_4^-$), an acetic acid ion ($CH_3COO^-$), a hydrogen carbonate ion ($HCO_3^-$), a dihydrogen phosphate ion ($H_2PO_4^-$), a hydrogen sulfate ion ($HSO_4^-$), a hydrogen sulfide ion (HS⁻), a thiocyanic acid ion (SCN⁻), a tetrafluoroboric acid ion ($BF_4^-$), a hexafluorophosphate ion ($PF_6^-$), a tetracyanoborate ion ($B(CN)_4^-$), a dicyanoamine ion ($N(CN)_2^-$), a p-toluenesulfonic acid ion (TsO⁻), a trifluoromethyl sulfonate ion ($CF_3SO_2^-$), a bis(trifluoromethylsulfonyl)amine ion ($N(SO_2CF_3)_2^-$), a tetrahydroxoaluminate ion ($[Al(OH)_4]^-$ or $[Al(OH)_4(H_2O)_2]^-$), a dicyanoargentate (I) ion ($[Ag(CN)_2]^-$), a tetrahydroxochromate (III) ion ($[Cr(OH)_4]^-$), a tetrachloroaurate (III) ion ($[AuCl_4]^-$), an oxide ion ($O^{2-}$), a sulfide ion ($S^{2-}$), a peroxide ion ($O_2^{2-}$), a sulfuric acid ion ($SO_4^{2-}$), a sulfurous acid ion ($SO_3^{2-}$), a thiosulfuric acid ($S_2O_3^{2-}$), a carbonic acid ion ($CO_3^{2-}$), a chromic acid ion ($CrO_4^{2-}$), a dichromic acid ion ($Cr_2O_7^{2-}$), a monohydrogen phosphate ion ($HPO_4^{2-}$), a tetrahydroxozincate (II) ion ($[Zn(OH)_4]^{2-}$), a tetracyanozincate (II) ion ($[Zn(CN)_4]^{2-}$), a tetrachlorocuprate (II) ion ($[CuCl_4]^{2-}$), a phosphoric acid ion ($PO_4^{3-}$), a hexacyanoferrate (III) ion ($[Fe(CN)_6]^{3-}$), a bis(thiosulfate)argentat (I) ion ($[Ag(S_2O_3)_2]^{3-}$), and a hexacyanoferrate (II) ion ($[Fe(CN)_6]^{4-}$). These may be used alone or in combination.

Among them, a tetrafluoroboric acid ion, a hexafluorophosphate ion, a tetracyanoborate ion, a bis(trifluoromethylsulfonyl)amine ion, and a perchloric acid ion are preferable.

Among these metal complexes, trivalent cobalt complexes represented by the following General Formulas (3) and (4) are particularly preferable. When the metal complex is the trivalent cobalt complex, a function as the oxidizing agent is excellent, which is advantageous.

[Chem. 21]

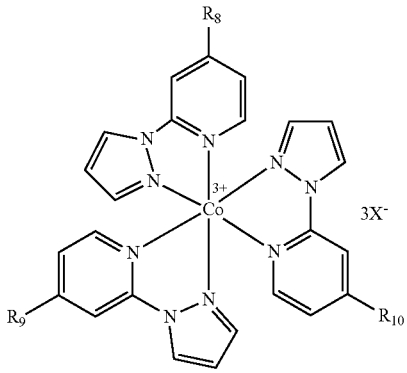

General Formula (3)

In the General Formula (3), $R_8$ to $R_{10}$ represent a hydrogen atom, a methyl group, an ethyl group, a propyl group, a tertiary butyl group, or a trifluoromethyl group. X represents one selected from the group consisting of the aforementioned anions.

Specific examples of the cobalt complex represented by the General Formula (3) are presented below. However, the present disclosure is not limited thereto. These may be used alone or in combination.

[Chem. 22]

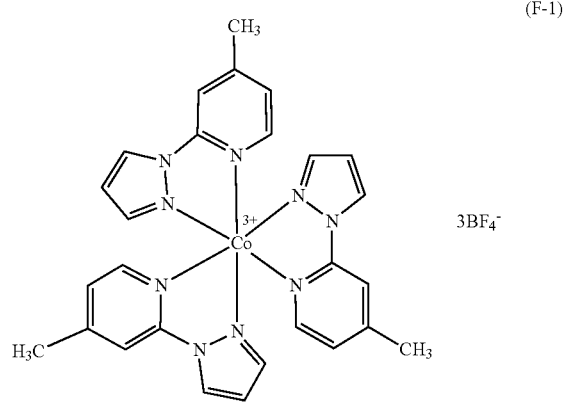

(F-1)

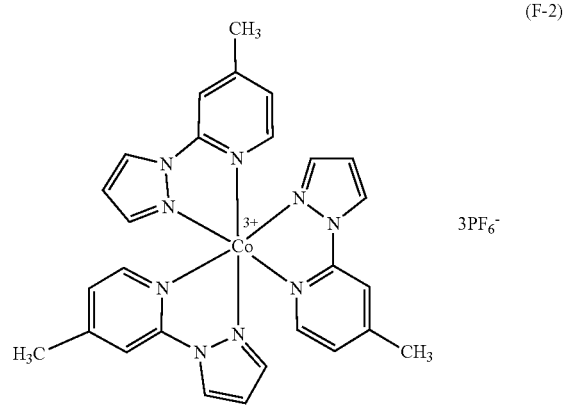

(F-2)

(F-3)
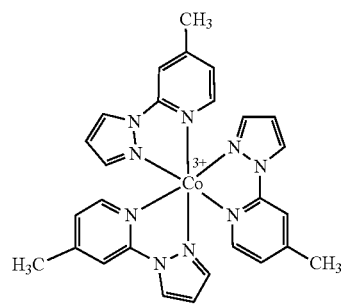 3 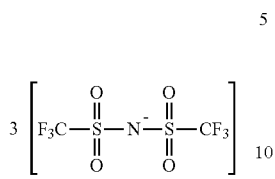
(F-4)
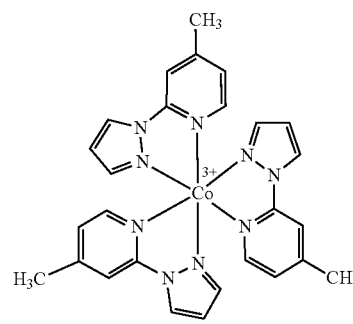 3 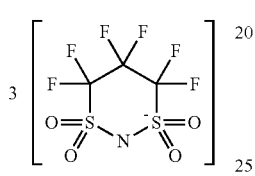
(F-5)
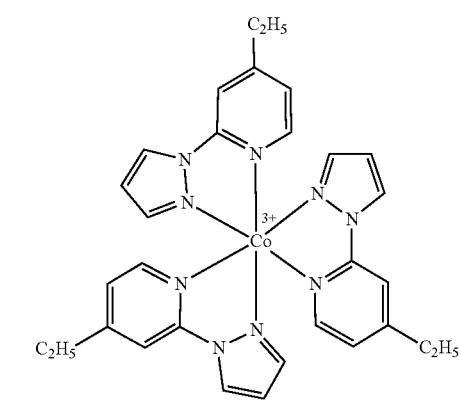 
(F-7)
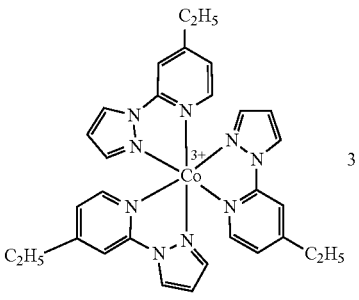 3 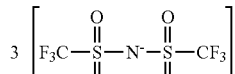
(F-8)
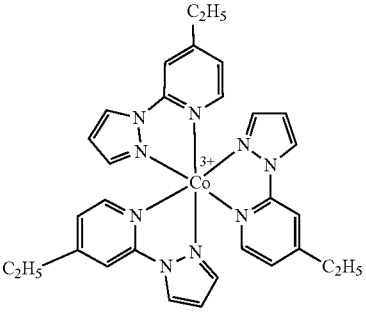 3 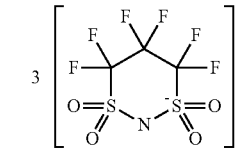
(F-9)
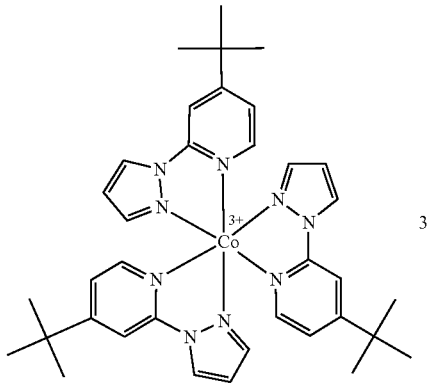 
(F-10)
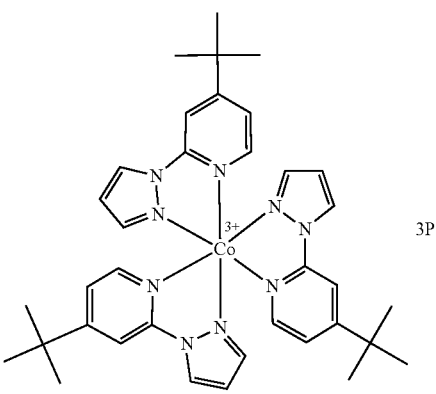 

[Chem. 23]
(F-11)
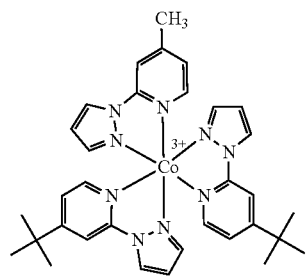
(F-15)
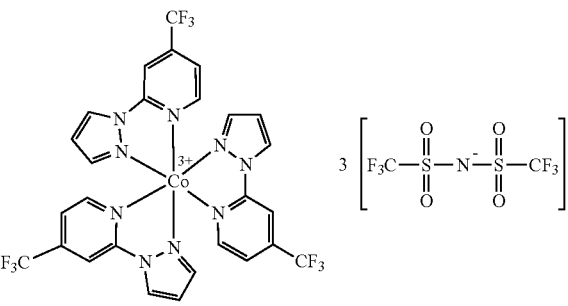
(F-12)
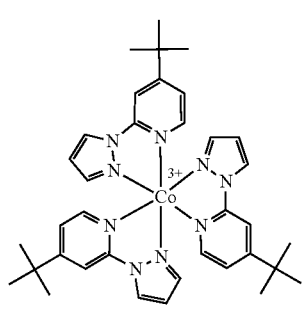
(F-16)
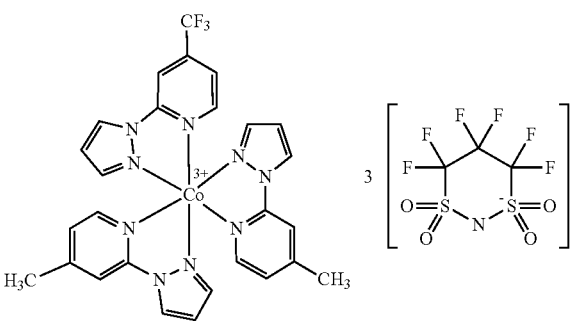
(F-13)
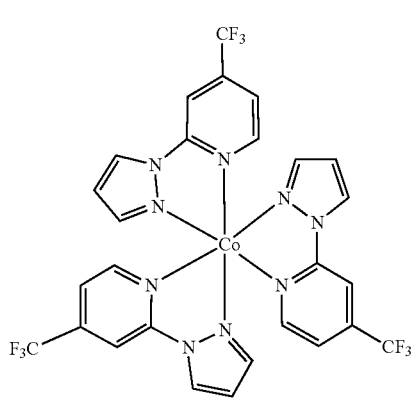
(F-17)
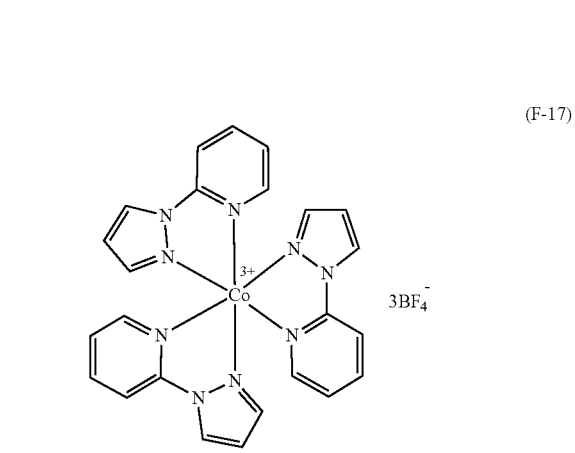
(F-14)
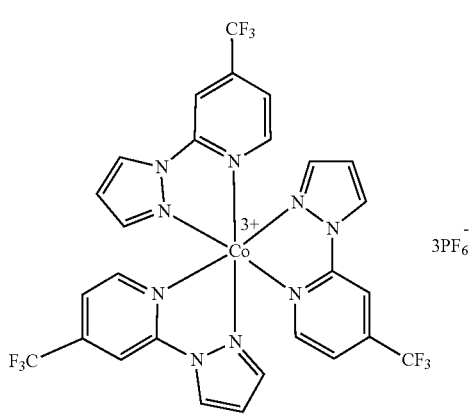
(F-18)
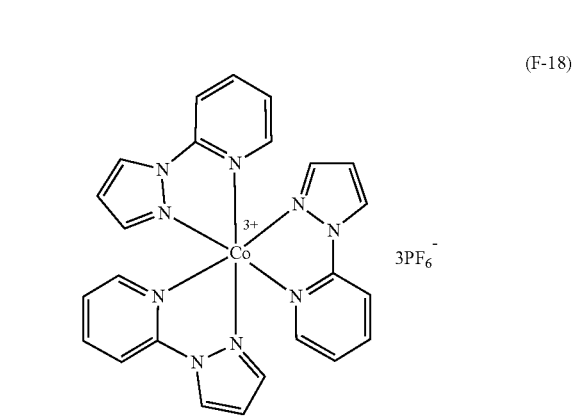

(F-19)

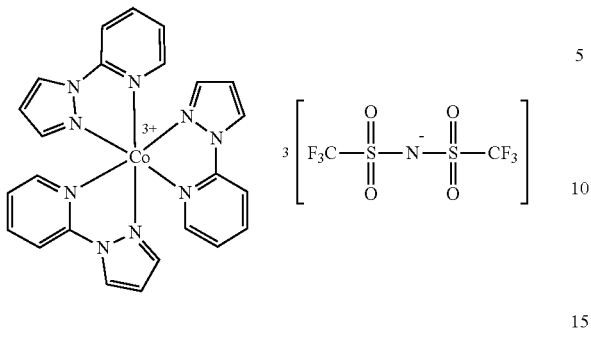

(F-20)

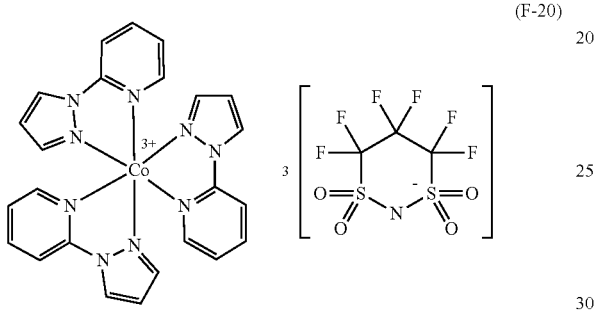

As the metal complex, a trivalent cobalt complex represented by the following General Formula (4) is also effectively used.

[Chem. 24]

General Formula (4)

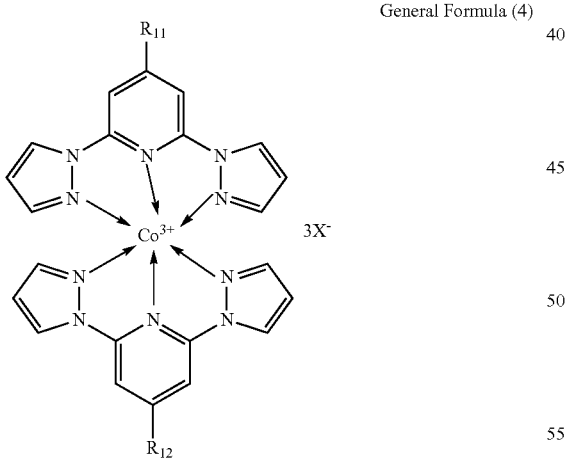

In the General Formula (4), $R_{11}$ and $R_{12}$ represent a hydrogen atom, a methyl group, an ethyl group, a propyl group, a tertiary butyl group, or a trifluoromethyl group. X represents one selected from the group consisting of the aforementioned anions.

Specific examples of the cobalt complex represented by the General Formula (4) are presented below. However, the present disclosure is not limited thereto. These may be used alone or in combination.

[Chem. 25]

(F-21)

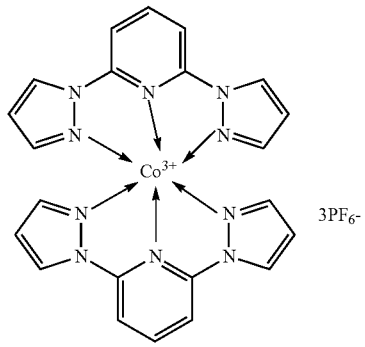

(F-22)

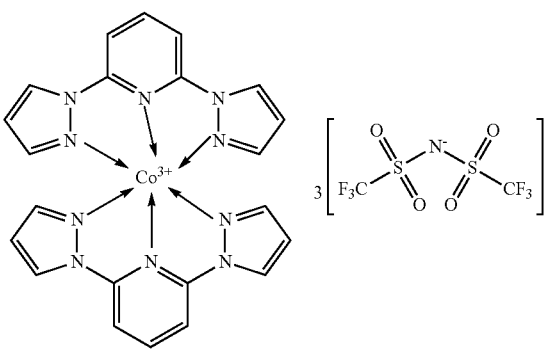

(F-23)

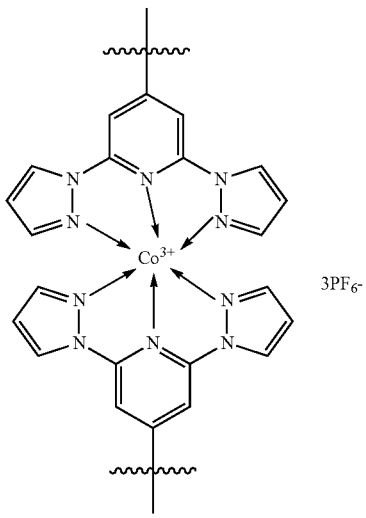

-continued (F-24)

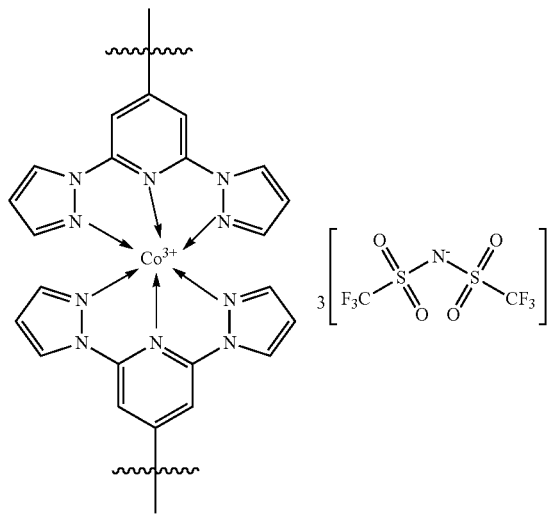

As the oxidizing agent, a hypervalent iodine compound is also preferably used. The hypervalent iodine compound is a compound that includes 8 or more electrons in the valence shell and has a hypervalent iodine atom. Among them, particularly, it was found that when a periodinane compound represented by the following General Formula (5) and a diaryliodonium salt represented by the following General Formula (6) were used as the oxidizing agent in the hole-transporting section, a high output could be obtained because of high solubility, low crystallinity, and low acidity. When acidity of the hole-transporting section is high, the open circuit voltage becomes low. When the amount of a basic material added is large, it is possible to make the open circuit voltage high. However, a concentration of the hole-transporting material is decreased, series resistance is increased to thereby decrease the output under light of high illuminance.

[Chem. 26]

General Formula (5)

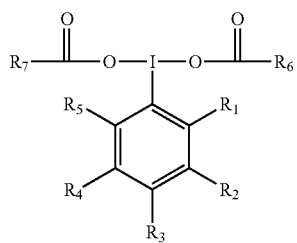

In the General Formula (5), $R_1$ to $R_5$ represent a hydrogen atom or a methyl group. $R_6$ and $R_7$ represent a methyl group or a trifluoromethyl group.

[Chem. 27]

General Formula (6)

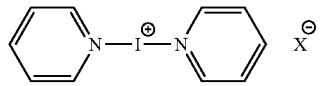

In the General Formula (6), X represents $BF_4$, $PF_4$, the following Structural Formula (4), or the following Structural Formula (5).

[Chem. 28]

Structural Formula (4)

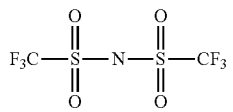

[Chem. 29]

Structural Formula (5)

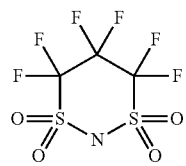

Specific examples of the periodinane compound represented by the General Formula (5) and the diaryliodonium salt represented by the General Formula (6) include, but are not limited to, the following (G-1) to (G-10).

[Chem.30]

(G-1)

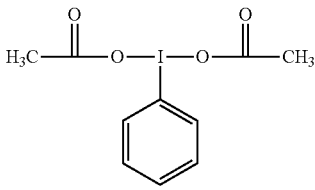

(G-2)

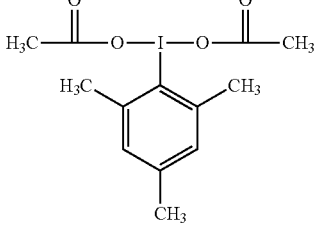

(G-3)

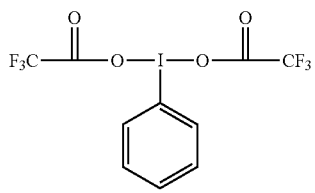

(G-4)
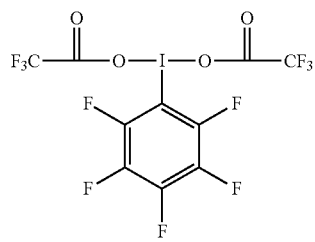

(G-5)
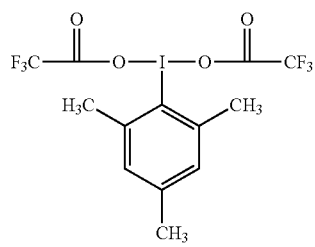

(G-6)
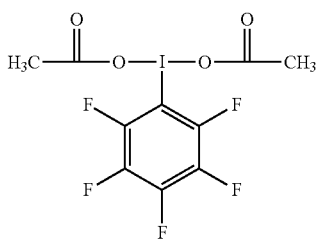

(G-7)
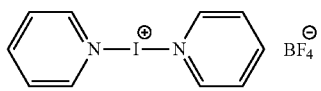

(G-8)
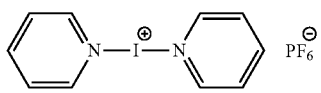

(G-9)
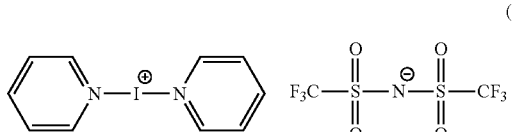

(G-10)
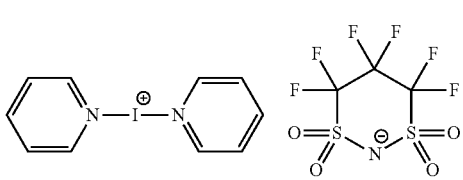

In addition, hypervalent iodine compounds expressed by the following Structural Formulas are also effective.

[Chem. 31]

(G-11)
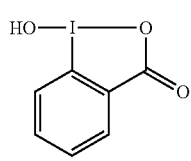

(G-12)
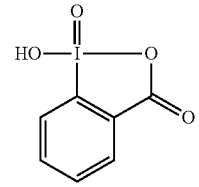

(G-13)
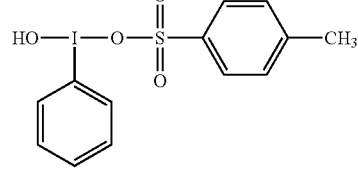

(G-14)
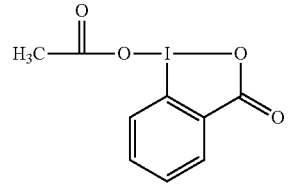

An amount of the oxidizing agent is preferably 5 mol % or more but 30 mol % or less, more preferably 10 mol % or more but 20 mol % or less, relative to the hole-transporting material. Through addition of the oxidizing agent, it is not necessary to oxidize all hole-transporting material, and it is effective so long as the hole-transporting material is partially oxidized.

The oxidizing agent may be used alone or in combination. When two or more oxidizing agents are used in combination, the hole-transporting section is not easily crystallized and may obtain a high thermal resistance in some cases.

Preferably, the hole-transporting section further includes an alkali metal salt. Inclusion of the alkali metal salt in the hole-transporting section can improve the output and can greatly improve the durability. Particularly, when the hole-transporting material is oxidized by the aforementioned oxidizing agent to generate an oxidized product, anions of the alkali metal salt or the metal complex that is the oxidizing agent are doped to be stabilized, which is considered effective for improving the durability of the photoelectric conversion element. Therefore, in addition to the hole-transporting material and the oxidizing agent, the alkali metal salt is preferably added to the hole-transporting section.

The alkali metal salt is not particularly limited and may be appropriately selected depending on the intended purpose. Examples thereof include lithium salts, sodium salts, and potassium salts.

Examples of the lithium salt include lithium chloride, lithium bromide, lithium iodide, lithium perchlorate, lithium bis(trifluoromethanesulfonyl)diimide, lithium diisopropylimide, lithium bis(fluorosulfonyl)imide, lithium bis(pentafluoroethylsulfonyl)imide, lithium (fluorosulfonyl)(trifluoromethylsulfonyl)imide, lithium (fluorosulfonyl)(methylsulfonyl)imide, lithium (fluorosulfonyl)(pentafluoroethylsulfonyl)imide, lithium (fluorosulfonyl)(ethylsulfonyl)imide, lithium acetate, lithium tetrafluoroborate, lithium pentafluorophosphate, and lithium tetracyanoboronate.

Examples of the sodium salt include sodium chloride, sodium bromide, sodium iodide, sodium perchlorate, sodium bis(trifluoromethanesulfonyl)diimide, sodium acetate, sodium tetrafluoroborate, sodium pentafluorophosphate, and sodium tetracyanoborate.

Examples of the potassium salt include potassium chloride, potassium bromide, potassium iodide, and potassium perchlorate.

Among them, lithium salts are preferable, lithium bis(trifluoromethanesulfonyl)diimide, lithium diisopropylimide, and lithium N,N-hexafluoro-1,3-disulfonylimide are more preferable because the electric conductivity can be improved to thereby enhance the durability and the stability of the output characteristics.

An amount of the alkali metal salt is preferably 5 mol % or more but 50 mol % or less, more preferably 20 mol % or more but 35 mol % or less, relative to the hole-transporting material.

Preferably, the hole-transporting section further includes a compound having a pyridine ring structure.
The pyridine ring is expressed by the following Structural Formula (6), and the compound having a pyridine ring structure is a compound including at least one pyridine ring described above.

[Chem. 32]

Structural Formula (6)

By including the compound having a pyridine ring structure, an effect of enhancing the output can be obtained.

Among these compounds having a pyridine ring structure, compounds represented by the following General Formula (7) and General Formula (8) are more preferable.

[Chem. 33]

General Formula (7)

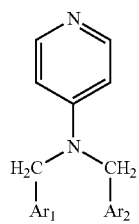

[Chem. 34]

General Formula (8)

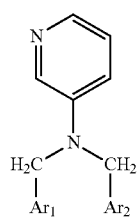

In the General Formula (7) and the General Formula (8), $Ar_1$ and $Ar_2$ represent an aryl group that may have a substituent, the $Ar_1$ and the $Ar_2$ may be identical or different, and may be joined with each other.

Specific examples of the compound having a pyridine ring include, but are not limited to, the following exemplified compounds C-1 to C-16. However, the present disclosure is not limited thereto. These may be used alone or in combination.

[Chem.35]

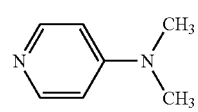
(C-1)

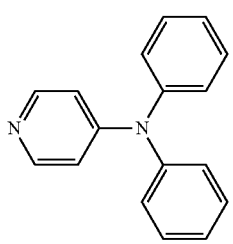
(C-2)

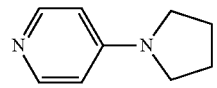
(C-3)

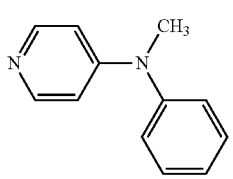
(C-4)

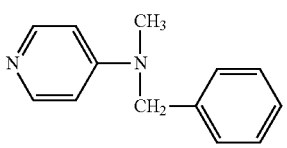
(C-5)

(C-6)

(C-7)

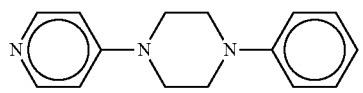
(C-8)

[Chem.36]

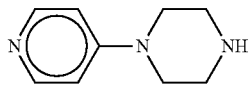
(C-9)

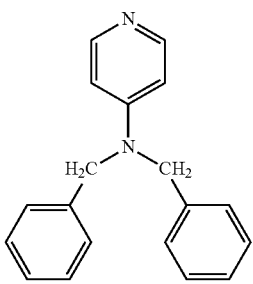
(C-10)

(C-11)
(C-12)
(C-13)
(C-14)
(C-15)

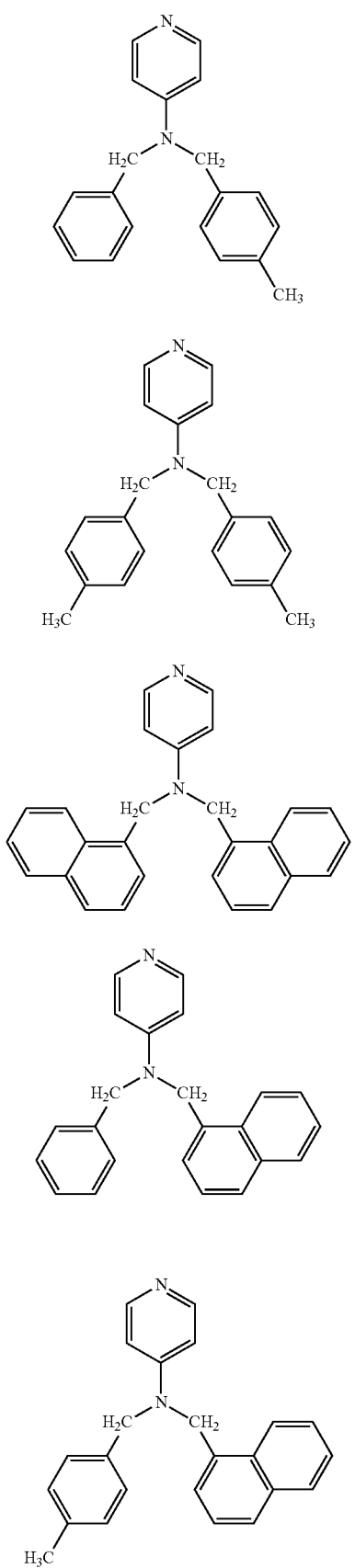

(C-16)

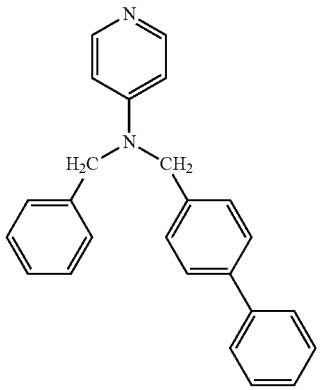

Inclusion of the compound having a pyridine ring structure in the hole-transporting section can enhance not only the output of the photoelectric conversion element but also the durability or the stability, and is particularly effective in improving the stability or the durability against light of low illuminance.

An amount of the compound having a pyridine ring is preferably 20 mol % or more but 65 mol % or less, more preferably 35 mol % or more but 50 mol % or less, relative to the hole-transporting material. When the amount of the compound having a pyridine ring falls within the preferable range, a high open circuit voltage can be maintained, and a high output can be obtained. In addition, even when the photoelectric conversion element is used under various environments for a long period of time, high stability and durability can be obtained.

The hole-transporting section may have a single layer structure formed of a single material or may have a laminate structure including a plurality of compounds. The hole-transporting section having a laminate structure is effective because a polymer material can be used in the hole-transporting section near the second electrode section. Use of the polymer material excellent in a film formation property is advantageous because it is possible to make the surface of the porous electron-transporting section smoother and to improve the photoelectric conversion characteristics. In addition, the polymer material is not easily permeated into the inside of the porous electron-transporting section. Therefore, the polymer material has an excellent property of covering the surface of the porous electron-transporting section, and may achieve an effect of preventing short circuit when electrodes are provided.

Examples of the polymer material used in the hole-transporting section include hole-transporting polymer materials known in the art.

Examples of the hole-transporting polymer material include polythiophene compounds, polyphenylene vinylene compounds, polyfluorene compounds, polyphenylene compounds, polyarylamine compounds, and polythiadiazole compounds.

Examples of the polythiophene compound include poly(3-n-hexylthiophene), poly(3-n-octyloxythiophene), poly(9,9'-dioctyl-fluorene-co-bithiophene), poly(3,3'''-didodecyl-quarter thiophene), poly(3,6-dioctylthieno[3,2-b]thiophene), poly(2,5-bis(3-decylthiophen-2-yl)thieno[3,2-b]thiophene), poly(3,4-didecylthiophene-co-thieno[3,2-b]thiophene), poly(3,6-dioctylthieno[3,2-b]thiophene-co-thieno[3,2-b]thiophene), poly(3,6-dioctylthieno[3,2-b]thiopheno-co-thiophene), and poly(3,6-dioctylthieno[3,2-b]thiophene-co-bithiophene).

Examples of the polyphenylene vinylene compound include poly[2-methoxy-5-(2-ethylhexyloxy)-1,4-phenylenevinylene], poly[2-methoxy-5-(3,7-dimethyloctyloxy)-1,4-phenylenevinylene], and poly[(2-methoxy-5-(2-ethylhexyloxy)-1,4-phenylenevinylene)-co-(4,4'-biphenylenevinylene)].

Examples of the polyfluorene compound include poly(9, 9'-didodecylfluorenyl-2,7-diyl), poly[(9,9-dioctyl-2,7-divinylenefluorene)-alt-co-(9,10-anthracene)], poly[(9,9-dioctyl-2,7-divinylenefluorene)-alt-co-(4,4'-biphenylene)], poly[(9,9-dioctyl-2,7-divinylenefluorene)-alt-co-(2-methoxy-5-(2-ethylhexyloxy)-1,4-phenylene)], and poly[(9,9-dioctyl-2,7-diyl)-co-(1,4-(2,5-dihexyloxy)benzene)].

Examples of the polyphenylene compound include poly[2,5-dioctyloxy-1,4-phenylene] and poly[2,5-di(2-ethylhexyloxy-1,4-phenylene]

Examples of the polyarylamine compound include poly[(9, 9-dioctylfluorenyl-2,7-diyl)-alt-co-(N,N'-diphenyl)-N,N'-di(p-hexylphenyl)-1,4-diaminobenzene], poly[(9,9-dioctylfluorenyl-2,7-diyl)-alt-co-(N,N'-bis(4-octyloxyphenyl)benzidine-N,N'-(1,4-diphenylene)], poly[(N,N'-bis(4-octyloxyphenyl)benzidine-N,N'-(1,4-diphenylene)], poly[(N,N'-bis(4-(2-ethylhexyloxy)phenyl)benzidine-N,N'-(1,4-diphenylene)], poly[phenylimino-1,4-phenylenevinylene-2,5-dioctyloxy-1,4-phenylenevinylene-1,4-phenylene], poly[p-tolylimino-1,4-phenylenevinylene-2,5-di(2-ethylhexyloxy)-1,4-phenylenevinylene-1,4-phenylene], and poly[4-(2-ethylhexyloxy)phenylimino-1,4-biphenylene].

Examples of the polythiadiazole compound include poly[(9, 9-dioctylfluorenyl-2,7-diyl)-alt-co-(1,4-benzo(2,1',3)thiadiazole] and poly(3,4-didecylthiophene-co-(1,4-benzo(2,1',3) thiadiazole).

Among them, polythiophene compounds and polyarylamine compounds are preferable in terms of carrier mobility and ionization potential.

An average thickness of the hole-transporting section is not particularly limited and may be appropriately selected depending on the intended purpose. The hole-transporting section preferably has such a structure that the hole-transporting section enters pores of the porous electron-transporting section. The hole-transporting section having an average thickness of 0.01 micrometers or more but 20 micrometers or less is preferably disposed on the electron-transporting section, the hole-transporting section having an average thickness of 0.1 micrometers or more but 10 micrometers or less is more preferably disposed on the electron-transporting section, the hole-transporting section having an average thickness of 0.2 micrometers or more but 2 micrometers or less is still more preferably disposed on the electron-transporting section.

The hole-transporting section can be directly formed over the electron-transporting section to which a photosensitization compound has been adsorbed. A method for producing the hole-transporting section is not particularly limited and may be appropriately selected depending on the intended purpose. Examples thereof include a method for forming a thin film under vacuum such as vacuum deposition and a wet film formation method. Among them, particularly, a wet film formation method is preferable, a method for performing coating on an electron-transporting section is preferable in terms of production cost.

When the wet film formation method is used, the coating method is not particularly limited and can be performed according to the methods known in the art. Examples thereof include the dip method, the spray method, the wire bar method, the spin-coating method, the roller coating method, the blade coating method, and the gravure coating method. Examples of the wet printing method include various methods such as relief printing, offset printing, gravure printing, intaglio printing, rubber plate printing, and screen printing.

The film may be formed in a supercritical fluid or a subcritical fluid having lower temperature and pressure than a critical point. The supercritical fluid is not particularly limited and may be appropriately selected depending on the intended purpose, so long as it exists as a non-condensable high-density fluid in a temperature and pressure region exceeding the limit (critical point) at which a gas and a liquid can coexist, does not condense even when compressed, and is a fluid in a state of being equal to or higher than the critical temperature and the critical pressure. The supercritical fluid is preferably a supercritical fluid having a low critical temperature.

Examples of the supercritical fluid include carbon monoxide, carbon dioxide, ammonia, nitrogen, water, alcohol solvents, hydrocarbon solvents, halogen solvents, and ether solvents.

Examples of the alcohol solvent include methanol, ethanol, and n-butanol.

Examples of the hydrocarbon solvent include ethane, propane, 2,3-dimethylbutane, benzene, and toluene. Examples of the halogen solvent include methylene chloride and chlorotrifluoromethane.

Examples of the ether solvent include dimethyl ether.

These may be used alone or in combination.

Among them, since carbon dioxide has a critical pressure of 7.3 MPa and a critical temperature of 31 degrees Celsius, it can easily generate a supercritical state, has incombustibility, and is easily handled, which is preferable.

The subcritical fluid is not particularly limited and may be appropriately selected depending on the intended purpose so long as it exists as a high-pressure liquid in a temperature and pressure region near the critical point. The compounds exemplified as the supercritical fluid can be suitably used as the subcritical fluid.

A critical temperature and a critical pressure of the supercritical fluid are not particularly limited and may be appropriately selected depending on the intended purpose. The critical temperature thereof is preferably −273 degrees Celsius or higher but 300 degrees Celsius or lower, more preferably 0 degrees Celsius or higher but 200 degrees Celsius or lower.

In addition to the supercritical fluid and the subcritical fluid, an organic solvent or an entrainer may be used in combination. The solubility in the supercritical fluid can be more easily adjusted by addition of the organic solvent or the entrainer.

The organic solvent is not particularly limited and may be appropriately selected depending on the intended purpose. Examples thereof include ketone solvents, ester solvents, ether solvents, amide solvents, halogenated hydrocarbon solvents, and hydrocarbon solvents.

Examples of the ketone solvent include acetone, methyl ethyl ketone, and methyl isobutyl ketone.

Examples of the ester solvent include ethyl formate, ethyl acetate, and n-butyl acetate.

Examples of the ether solvent include diisopropyl ether, dimethoxy ethane, tetrahydrofuran, dioxolane, and dioxane.

Examples of the amide solvent include N,N-dimethylformamide, N,N-dimethylacetamide, and N-methyl-2-pyrrolidone.

Examples of the halogenated hydrocarbon solvent include dichloromethane, chloroform, bromoform, methyl iodide, dichloroethane, trichloroethane, trichloroethylene, chlorobenzene, o-dichlorobenzene, fluorobenzene, bromobenzene, iodobenzene, and 1-chloronaphthalene.

Examples of the hydrocarbon solvent include n-pentane, n-hexane, n-octane, 1,5-hexadiene, cyclohexane, methylcyclohexane, cyclohexadiene, benzene, toluene, o-xylene, m-xylene, p-xylene, ethylbenzene, and cumene.

These may be used alone or in combination.

After the hole-transporting material is laminated on the electron-transporting section to which the photosensitization compound has been adsorbed, a press treatment step may be performed. The press treatment allows the hole-transporting material to further adhere to the electron-transporting section that is a porous electrode, which may improve efficiency.

A method of the press treatment is not particularly limited and may be appropriately selected depending on the intended purpose. Examples thereof include a press molding method using a plate that is represented by an IR tablet molding device and a roll press method using a roller.

The pressure is preferably 10 kgf/cm$^2$ or more, more preferably 30 kgf/cm$^2$ or more.

The time of the press treatment is not particularly limited and may be appropriately selected depending on the intended purpose. The time thereof is preferably 1 hour or shorter. Moreover, heat may be applied at the time of the press treatment. At the time of the press treatment, a release agent may be disposed between a pressing machine and electrodes.

Examples the release agent include fluororesins, such as polyethylene tetrafluoride, polychloroethylene trifluoride, ethylene tetrafluoride-propylene hexafluoride copolymers, perfluoroalkoxy fluoride resins, polyvinylidene fluoride, ethylene-ethylene tetrafluoride copolymers, ethylene-chloroethylene trifluoride copolymers, and polyvinyl fluoride. These may be used alone or in combination.

A metal oxide may be disposed between the hole-transporting material and a second electrode section after the press treatment step but before disposition of the second electrode section.

Examples of the metal oxide include molybdenum oxide, tungsten oxide, vanadium oxide, and nickel oxide. These may be used alone or in combination. Among them, molybdenum oxide is preferable.

A method for disposing the metal oxide over the hole-transporting section is not particularly limited and may be appropriately selected depending on the intended purpose. Examples thereof include a method where a thin film is formed in vacuum (e.g., sputtering and vacuum vapor deposition), and a wet film formation method.

The wet film formation method is preferably a method where a paste obtained by dispersing powder or sol of the metal oxide is prepared and is coated on the hole-transporting section. In the case where the wet film formation method is used, a coating method is not particularly limited and may be performed according to the methods known in the art. Examples thereof include the dip method, the spraying method, the wire bar method, the spin coating method, the roller coating method, the blade coating method, and the gravure coating method. As the wet film method, various methods such as relief printing, offset printing, gravure printing, intaglio printing, rubber plate printing, and screen printing can be used.

An average thickness of the metal oxide coated is preferably 0.1 nm or more but 50 nm or less, more preferably 1 nm or more but 10 nm or less.

<Second Electrode Section>

The second electrode section can be formed over the hole-transporting section or over a metal oxide on the hole-transporting section. The same as the first electrode section can be used for the second electrode section. When strength is sufficiently maintained, the support is not always necessary.

Examples of a material of the second electrode section include metals, carbon compounds, conductive metal oxides, and conductive polymers.

Examples of the metal include platinum, gold, silver, copper, and aluminum.

Examples of the carbon compound include graphite, fullerene, carbon nanotube, and graphene.

Examples of the conductive metal oxide include the above-described PTO, FFO, ATO, and NTO.

Examples of the conductive polymer include polythiophene and polyaniline.

These may be used alone or in combination.

The second electrode section can appropriately be formed over the hole-transporting section through methods such as the coating method, the lamination method, the deposition method, the CVD method, and the pasting method, depending on kinds of materials to be used and kinds of the hole-transporting section.

In the photoelectric conversion element, it is preferable that at least one of the first electrode section and the second electrode section be substantially transparent. Preferably, a side of the first electrode section is transparent, and a method for receiving incident light from a side of the first electrode section is used. In this case, a material that reflects light is preferably used at a side of the second electrode section, and glass, plastic, or a metal thin film on which a metal or a conductive oxide is deposited is preferably used. In addition, provision of an anti-reflection layer at a side where the incident light is to be received is an effective means.

<Hole Blocking Section>

The photoelectric conversion element of the present disclosure can further include a hole blocking section, which is effective. The hole blocking section may have a single layer structure formed of a single material or may have a laminate structure including a plurality of compounds.

The hole blocking section is formed between the first electrode section and the electron-transporting section. The hole blocking section is formed of a photosensitization compound. The hole blocking section transports, to the first electrode section, electrons that have been transported to the electron-transporting section, and prevents the first electrode section and the hole-transporting section from being in contact with each other. As a result, the hole blocking section does not easily allow holes to flow into the first electrode section, and can prevent the output from being decreased due to recombination of electrons and holes. A solid photoelectric conversion element provided with the hole-transporting section has a rapid recombination speed of holes in the hole-transporting material and electrons on the surface of the electrodes, compared to a wet-type photoelectric conversion element using an electrolyte. Therefore, an effect obtained by forming the hole blocking section is greatly large.

A material of the hole blocking section is not particularly limited and may be appropriately selected depending on the intended purpose, so long as the material is transparent to visible light and has an electron-transporting property.

Examples thereof include: single semiconductors such as silicon and germanium; compound semiconductors such as chalcogenides of metal; compounds having the Perovskite structure, and oxide semiconductors.

Examples of the chalcogenide of metal include: oxides of titanium, tin, zinc, iron, tungsten, zirconium, hafnium, strontium, indium, cerium, yttrium, lanthanum, vanadium, niobium, and tantalum; sulfides of cadmium, zinc, lead, silver, antimony, and bismuth; selenides of cadmium and lead; and tellurides of cadmium. Other examples of the compound semiconductor include: phosphides of zinc, gallium, indium, and cadmium; gallium arsenide; copper-indium-selenide; and copper-indium-sulfide.

Examples of the compound having the Perovskite structure include strontium titanate, calcium titanate, sodium titanate, barium titanate, and potassium niobate.

Examples of the oxide semiconductor include titanium oxide, niobium oxide, magnesium oxide, aluminum oxide, zinc oxide, tungsten oxide, and tin oxide.

Among them, an oxide semiconductor is more preferable, titanium oxide is still more preferable.

These may be used alone or in combination. The oxide semiconductor may be a single layer or may have such a structure that a plurality of layers are laminated. A crystal type of these semiconductors is not particularly limited and may be appropriately selected depending on the intended purpose. The crystal type thereof may be a single crystal, polycrystalline, or amorphous.

A film formation method of the hole-blocking section is not particularly limited and may be appropriately selected depending on the intended purpose. Examples thereof include: wet film formation such as a sol-gel method and a hydrolysis method using titanium tetrachloride; and dry film formation such as sputtering. Among them, sputtering is preferable. When the film formation method of the hole-blocking section is sputtering, the film density can be sufficiently high and electric current loss can be prevented.

A thickness of the hole-blocking section is not particularly limited and may be appropriately selected depending on the intended purpose. The thickness thereof is preferably 5 nm or more but 1 micrometer or less. In the wet film formation, the thickness thereof is more preferably 500 nm or more but 700 nm or less. In the dry film formation, the thickness thereof is more preferably 5 nm or more but 30 nm or less.

<Substrate>

The photoelectric conversion element of the present disclosure may include a substrate, and the substrate is effective in improving the mechanical strength and preventing entry of excessive oxygen or moisture. The substrate may be provided over the outermost part of the first electrode section side of the photoelectric conversion element, may be provided over the outermost part of the second electrode section side of the photoelectric conversion element, or may be disposed over the outermost part of the first electrode section side of the photoelectric conversion element and over the outermost part of the second electrode section side of the photoelectric conversion element.

Hereinafter, a substrate provided over the outermost part of the first electrode section side is referred to as "first substrate", and a substrate provided over the outermost part of the second electrode section side is referred to as "second substrate".

<<First Substrate>>

The photoelectric conversion element may include a first substrate.

A shape, a structure, and a size of the first substrate are not particularly limited and may be appropriately selected depending on the intended purpose.

The material of the first substrate is not particularly limited and may be appropriately selected depending on the intended purpose, so long as it has transparency and an insulation property. Examples thereof include substrates such as glass, plastic films, and ceramics. Among them, a substrate having heat resistance against a firing temperature is preferable when the firing step is performed to form the electron-transporting section. Moreover, the first substrate is preferably a substrate having flexibility.

<<Second Substrate>>

The photoelectric conversion element may include a second substrate.

The second substrate is not particularly limited and products known in the art can be used. Examples thereof include substrates such as glass, plastic films, and ceramic. A convex-concave part may be formed at a connection part between the second substrate and a sealing member, in order to increase adhesiveness.

A formation method of the convex-concave part is not particularly limited and may be appropriately selected depending on the intended purpose. Examples of the formation method include the sand blasting method, the water blasting method, abrasive paper, the chemical etching method, and the laser processing method.

As a method for increasing adhesiveness between the second substrate and the sealing member, for example, an organic matter on the surface may be removed, or hydrophilicity may be improved. The method for removing an organic matter on the surface of the second substrate is not particularly limited and may be appropriately selected depending on the intended purpose. Examples of the method include UV ozone washing and an oxygen plasma treatment.

<Sealing Member>

The photoelectric conversion element of the present disclosure can be provided with a sealing member, which is effective.

The sealing member is not particularly limited and may be appropriately selected depending on the intended purpose, so long as at least the hole-transporting section can be shielded from an external environment of the photoelectric conversion element. The purpose of shielding at least the hole-transporting section from an external environment of the photoelectric conversion element by the sealing member is to prevent entry of excessive oxygen or moisture from the outside and to prevent mechanical breakage caused by pressing force from the outside.

A method of the sealing can be roughly classified into "frame sealing" and "surface sealing". Specifically, the frame sealing means that sealing members are provided around a power generation region formed of, for example, the light-absorbing section, the electron-transporting section, and the hole-transporting section of the photoelectric conversion element, and are attached to the second substrate. The surface sealing means that the sealing member is provided on the whole surface of the power generation region, and is attached to the second substrate. The frame sealing of the former can form a hollow section inside the sealed part. Therefore, an amount of moisture or an amount of oxygen inside the sealed part can appropriately be adjusted. In addition, since the second electrode is not in contact with the sealing member, an influence of exfoliated electrodes can be decreased. Meanwhile, the "surface sealing" of the latter is excellent in preventing entry of excessive oxygen or moisture from the outside. In addition, an area where the power generation region is in contact with the sealing member is large. Therefore, the sealing strength is high, and the surface sealing is particularly suitable when a flexible substrate is used as the first substrate.

Kinds of the sealing member are not particularly limited and may be appropriately selected depending on the intended purpose. Examples thereof include curable resins and glass resins having a low melting temperature. The curable resin is not particularly limited and may be appropriately selected depending on the intended purpose so long as it is cured by light or heat. Among them, acrylic resins or epoxy resins are preferably used.

As a cured product of the acrylic resin, any of materials known in the art can be used, so long as the cured product is a product obtained by curing a monomer or an oligomer including an acrylic group in a molecule thereof.

As a cured product of the epoxy resin, any of materials known in the art can be used, so long as the cured product is a product obtained by curing a monomer or an oligomer including an epoxy group in a molecule thereof.

Among them, an epoxy resin having a high adhesive force with a substrate and an excellent barrier property against moisture or oxygen is preferably used. As a result, it is possible to further enhance the durability of the photoelectric conversion element of the present disclosure that has a high output and an excellent stability.

Examples of the epoxy resin include water-dispersing epoxy resins, non-solvent epoxy resins, solid epoxy resins, thermosetting epoxy resins, curing agent-mixed epoxy resins, and ultraviolet ray-curable epoxy resins. Among them, thermosetting epoxy resins and ultraviolet ray-curable epoxy resins are preferable, ultraviolet ray-curable epoxy resins are more preferable. Note that, ultraviolet ray-curable epoxy resins may be heated.

The epoxy resin is not particularly limited and may be appropriately selected depending on the intended purpose. Examples thereof include bisphenol A-based epoxy resins, bisphenol F-based epoxy resins, novolac-based epoxy resins, alicyclic epoxy resins, long-chain aliphatic epoxy resins, glycidyl amine-based epoxy resins, glycidyl ether-based epoxy resins, and glycidyl ester-based epoxy resins. These may be used alone or in combination.

The sealing member may include a curing agent and various additives if necessary.

Examples of the curing agent include amine-based curing agents, acid anhydride-based curing agents, polyamide-based curing agents, and other curing agents.

Examples of the amine-based curing agent include: aliphatic polyamine such as diethylenetriamine and triethylenetetramine; and aromatic polyamine such as methphenylenediamine, diaminodiphenylmethane, and diaminodiphenylsulfone.

Examples of the acid anhydride-based curing agent include phthalic anhydride, tetrahydrophthalic anhydride, hexahydrophthalic anhydride, methyltetrahydrophthalic anhydride, methylnadic anhydride, pyromellitic anhydride, HET anhydride, and dodecenylsuccinic anhydride.

Examples of other curing agents include imidazoles and polymercaptan. These may be used alone or in combination.

Examples of the additive include fillers, gap agents, polymerization initiators, drying agents (moisture absorbents), curing accelerators, coupling agents, flexibilizers, colorants, flame retardant auxiliaries, antioxidants, and organic solvents. These may be used alone or in combination. Among them, fillers, gap agents, curing accelerators, polymerization initiators, and drying agents (moisture absorbents) are preferable, and fillers and polymerization initiators are particularly preferable.

The filler is effective in preventing entry of moisture or oxygen under an external environment. In addition, the filler can obtain effects such as a decrease in volumetric shrinkage at the time of curing, a decrease in an amount of gas generated at the time of curing or heating, improvement of mechanical strength, and control of thermal conductivity or fluidity, and is considerably effective in maintaining a stable output under various environments in the present disclosure.

Regarding the output characteristics or the durability of the photoelectric conversion element, not only an influence by moisture or oxygen entering into the photoelectric conversion element from an external environment but also an influence by gas generated at the time of heating and curing the sealing member cannot be ignored. Particularly, an influence by the gas generated at the time of heating greatly affects the output characteristics even when the photoelectric conversion element is used under a high temperature environment.

In this case, when the filler, the gap agent, and the drying agent are included in the sealing member, they can prevent entry of moisture or oxygen, and can decrease an amount of the sealing member used, which makes it possible to obtain an effect of decreasing generation of gas. This is effective not only at the time of curing but also when the photoelectric conversion element is used under a high temperature environment.

The filler is not particularly limited and known products may be used. Preferable examples thereof include inorganic fillers such as crystalline or amorphous silica, talc, alumina, aluminum nitride, silicon nitride, calcium silicate, and calcium carbonate. These may be used alone or in combination.

An average primary particle diameter of the filler is preferably 0.1 micrometers or more but 10 micrometers or less, more preferably 1 micrometer or more but 5 micrometers or less. When the average primary particle diameter of the filler is 0.1 micrometers or more but 10 micrometers or less, an effect of preventing entry of moisture or oxygen can be sufficiently achieved, an appropriate viscosity is obtained, and adhesiveness to a substrate or a defoaming property is improved. Alternatively, it is also effective in terms of control of a width of the sealing part or workability.

An amount of the filler is preferably 10 parts by mass or more but 90 parts by mass or less, more preferably 20 parts by mass or more but 70 parts by mass or less, relative to the total amount of the sealing member. When the amount of the filler is 10 parts by mass or more but 90 parts by mass or less, an effect of preventing entry of moisture or oxygen can be sufficiently obtained, an appropriate viscosity is obtained, and adhesiveness and workability are good.

The gap agent is called a gap controlling agent or a spacer agent, and can control gap of the sealing part. For example, when a sealing member is provided over a first substrate or a first electrode section and a second substrate is provided thereover for sealing, a gap of the sealing part is matched with a size of the gap agent because the gap agent is mixed in an epoxy resin. As a result, it is possible to easily control the gap of the sealing part.

As the gap agent, known materials in the art can be used so long as it has a particulate shape and a uniform particle diameter, and has high solvent resistance and heat resistance. The particulate shape is not particularly limited, but is preferably spherical. Specific examples thereof include glass beads, silica particles, and organic resin particles. These may be used alone or in combination.

A particle diameter of the gap agent can be selected depending on a gap of the sealing part to be set. The particle diameter thereof is preferably 1 micrometer or more but 100 micrometers or less, more preferably 5 micrometers or more but 50 micrometers or less.

The polymerization initiator is a material that is added for the purpose of initiating polymerization using heat or light. The thermal polymerization initiator is a compound that generates active species such as radical cations through heating. Specific examples thereof include azo compounds such as 2,2'-azobisbutyronitrile (AIBN) and peroxides such as benzoyl peroxide (BPO). Examples of the thermal cationic polymerization initiator include benzenesulfonic acid esters and alkyl sulfonium salts.

Meanwhile, as the photopolymerization initiator, a photocationic polymerization initiator is preferably used in the case of the epoxy resin. When the photocationic polymerization initiator is mixed with the epoxy resin and light is emitted, the photocationic polymerization initiator is decomposed to generate strong acid, and the acid induces polymerization of the epoxy resin. Then, curing reaction proceeds. The photocationic polymerization initiator has such effects that volumetric shrinkage during curing is low, oxygen inhibition does not occur, and storage stability is high.

Examples of the photocationic polymerization initiator include aromatic diazonium salts, aromatic iodonium salts, aromatic sulfonium salts, metallocene compounds, and silanol-aluminium complexes. Moreover, a photoacid generator having a function of generating an acid upon irradiation of light can also be used.

The photoacid generator functions as an acid for initiating cationic polymerization. Examples of the photoacid generator include onium salts such as ionic sulfonium salt-based opium salts and ionic iodonium salt-based onium salts including a cation part and an ionic part. These may be used alone or in combination.

An amount of the polymerization initiator is preferably 0.5 parts by mass or more but 10 parts by mass or less, more preferably 1 part by mass or more but 5 parts by mass or less relative to the total amount of the sealing member. The amount of the polymerization initiator satisfying 0.5 parts by mass or more but 10 parts by mass or less allows curing to proceed appropriately, can decrease the remaining uncured products, and can prevent the amount of gas from being excessive, which is effective.

The drying agent is also called a moisture absorbent and is a material having a function of physically or chemically adsorbing or absorbing moisture. Inclusion of the drying agent in the sealing member is effective because moisture resistance may be further improved and influence of the outgas can be decreased.

The drying agent is preferably particulate. Examples thereof include inorganic water-absorbing materials such as calcium oxide, barium oxide, magnesium oxide, magnesium sulfate, sodium sulfate, calcium chloride, silica gel, molecular sieve, and zeolite. Among them, zeolite is preferable because zeolite absorbs a large amount of moisture. These may be used alone or two or more drying agents may be used in combination.

The curing accelerator is also called a curing catalyst and is used for the purpose of accelerating a curing speed. The curing accelerator is mainly used for a thermosetting epoxy resin.
Examples of the curing accelerator include: tertiary amine or tertiary amine salts such as DBU (1,8-diazabicyclo(5,4,0)-undecene-7) and DBN (1,5-diazabicyclo(4,3,0)-nonene-5); imidazole-based compounds such as 1-cyanoethyl-2-ethyl-4-methylimidazole and 2-ethyl-4-methylimidazole; and phosphine or phosphonium salts such as triphenylphosphine and tetraphenylphosphonium-tetraphenyl borate. These may be used alone or two or more curing accelerators may be used in combination.

The coupling agent has an effect of enhancing a bonding force between molecules, and examples thereof include silane coupling agents. Specific examples thereof include: silane coupling agents such as 3-glycidoxypropyltrimethoxysilane, 3-glycidoxypropylmethyldimethoxysilane, 3-glycidoxypropylmethyldimethoxysilane, 2-(3,4-epoxycyclohexyl)ethyltrimethoxysilane, N-phenyl-γ-aminopropyltrimethoxysilane, N-(2-aminoethyl)3-aminopropylmethyldimethoxysilane, N-(2-aminoethyl)3-aminopropylmethyltrimethoxysilane, 3-aminopropyltriethoxysilane, 3-mercaptopropyltrimethoxysilane, vinyltrimethoxysilane, N-(2-(vinylbenzylamino)ethyl)3-aminopropyltrimethoxysilane hydrochloride, and 3-methacryloxypropyltrimethoxysilane. These may be used alone or two or more coupling agents may be used in combination.

As the sealing member, resin compositions that are commercially available as sealing materials, seal materials, or adhesives have been known, and can be effectively used in the present disclosure. Among them, there are resin compositions that are developed and are commercially available to be used in solar cells or organic EL elements, and can be particularly effectively used in the present disclosure.

Examples of the commercially available products of the epoxy resin include product names: TB3118, TB3114, TB3124, and TB3125F (all of which are available from ThreeBond), World Rock 5910, World Rock 5920, World Rock 8723 (all of which are available from Kyoritsu Chemical & Co., Ltd.), and WB90US(P) (available from MORESCO).

Examples of the commercially available products of the acrylic resin include product names: TB3035B and TB3035C (both of which are available from ThreeBond) and NICHIBAN UM (available from Nichiban Co., Ltd.).

Meanwhile, after a glass resin having a low melting temperature is coated and fired, a resin component is decomposed. Then, while the resin component is melted through, for example, infrared laser, the resultant is allowed to adhere to the grass substrate to thereby perform the sealing. At this time, the low melting temperature component is diffused inside the metal oxide layer and is physically joined, to thereby obtain high sealing performance. In addition, since the resin component vanishes, outgas as seen in ultraviolet-curing resins is not generated, which is effective in making the durability of the photoelectric conversion element high. Generally, glass resins having a low melting temperature are commercially available as glass fit or glass paste. These can be effectively used. In the present disclosure, those having a lower melting temperature are preferable.

In the present disclosure, a sheet-shaped sealing material may effectively be used.

The sheet-shaped sealing material is a sheet on which a resin layer has been formed over a sheet in advance. As the sheet, glass or a film having high gas barrier properties may be used, and the sheet-shaped sealing material corresponds to a second substrate in the present disclosure. When the sheet-shaped sealing material is pasted over the second electrode section of the photoelectric conversion element and is cured, the sealing member and the substrate can be formed at one time. When the resin layer is formed on the whole surface of the sheet, the "surface sealing" is achieved. However, the "frame sealing" that provides a hollow section inside the photoelectric conversion element can be achieved depending on formation patterns of the resin layer.

A position of the sealing member is not particularly limited and may be appropriately selected depending on the intended purpose, so long as the sealing member is disposed at such a position that shields at least the hole-transporting section, preferably the electron-transporting section, the hole-transporting section, and the second electrode section from an external environment of the photoelectric conversion element. However, in the present disclosure, the "frame sealing" that forms a hollow section is more preferable because an appropriate amount of oxygen inside the sealed part can be adjusted.

Inclusion of oxygen in the hollow section inside the sealed part makes it possible to stably maintain a function of transporting holes of the hole-transporting section for a long period of time, which is considerably effective in improving the durability of the photoelectric conversion element. In the present disclosure, effects can be obtained so long as oxygen is included therein, but the oxygen concentration of the hollow section inside the sealed part disposed through the sealing is more preferably 5.0% by volume or more but 21.0% by volume or less.

The oxygen concentration of the hollow section can be controlled by performing the sealing in a glove box in which the oxygen concentration has been adjusted. The oxygen concentration can be adjusted through a method using a gas cylinder having a specific oxygen concentration or through a method using a nitrogen gas generator. The oxygen concentration in a glove box is measured using a commercially available oxygen concentration meter or oxygen monitor.

The oxygen concentration inside the hollow section formed through the sealing can be measured through, for example, an atmospheric pressure ionization mass spectrometer (API-MS). Specifically, the photoelectric conversion element is placed in a chamber filled with an inert gas, and the sealed part is opened in the chamber. Then, the gas in the chamber is subjected to quantitative analysis through API-MS, and all the components in the gas contained in the hollow section are quantified. A ratio of oxygen to a total of the all components can be calculated to determine an oxygen concentration.

Gas other than oxygen is preferably inert gas. Examples thereof include nitrogen and argon.

When the sealing is performed, the oxygen concentration and the dew point in a glove box are preferably controlled, and such a control is effective in improving the output and the durability.

The dew point is defined as a temperature at which condensation starts when gas containing water vapor is cooled.

The dew point is not particularly limited but is preferably 0 degrees Celsius or less, more preferably −20 degrees Celsius or less. The upper limit thereof is preferably −50 degrees Celsius or more.

A method for forming the sealing member is not particularly limited and may be appropriately selected depending on the intended purpose. Examples thereof include various methods such as the dispensing method, the wire bar method, the spin-coating method, the roller coating method, the blade coating method, the gravure coating method, the relief printing, the offset printing, the intaglio printing, the rubber plate printing, and the screen printing.

Moreover, a passivation layer may be disposed between the second electrode section and the sealing member. The passivation layer is not particularly limited and may be appropriately selected depending on the intended purpose. For example, aluminum oxide, silicon nitride, and silicon oxide are preferable.

EMBODIMENTS

Hereinafter, one example of a photoelectric conversion element of the present disclosure will be described with reference to drawings. However, the present disclosure is not limited thereto, those that are not described in the embodiments of the present disclosure regarding the number, the position, and the shape of the following constituent components can be included in the scope of the present disclosure.

Figure 2:
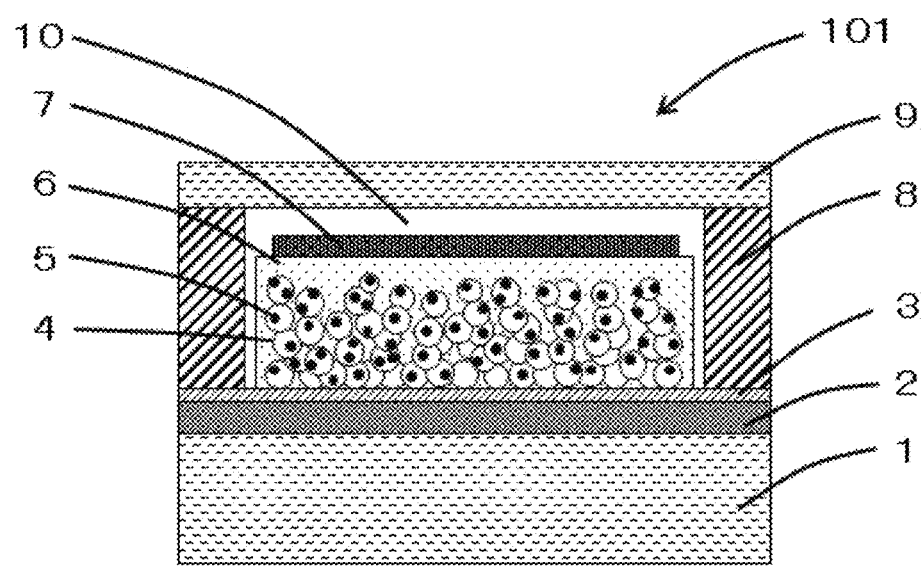
FIG. 2 is a schematic view presenting one example of a photoelectric conversion element of the present disclosure.

FIG. 2 is a schematic view presenting one example of a photoelectric conversion element of the present disclosure.

As presented in FIG. 2, in a photoelectric conversion element 101, a first electrode section 2 is formed over a first substrate 1, and a hole blocking section 3 is formed over the first electrode section 2. An electron-transporting section 4 is formed over the hole blocking section 3, a photosensitization compound 5 as a light-absorbing section is adsorbed on the surface of an electron-transporting material constituting the electron-transporting section 4. In an upper part and an inner part of the electron-transporting section 4, a hole-transporting section 6 is formed, and a second electrode section 7 is formed over the hole-transporting section 6. A second substrate 9 is disposed above the second electrode section 7, and the space between the second substrate 9 and the hole blocking section 3 is sealed by a sealing member 8. Formation of the hole blocking section 3 makes it possible to prevent recombination of electrons and holes, resulting in improvement of the power generation performance.

The photoelectric conversion element presented in FIG. 2 can include a hollow section 10 between the second electrode section 7 and the second substrate 9. Since inclusion of the hollow section makes it possible to control an oxygen concentration inside the hollow section, the power generation performance and the durability can be improved. In addition, the second electrode section 7 and the second substrate 9 are not directly in contact with each other, it is possible to prevent the second electrode section 7 from being exfoliated and broken.

Note that, the first electrode section 2 and the second electrode section 7 each have a path configured to allow electric current to pass to an electrode extraction terminal (not presented).

Figure 3:
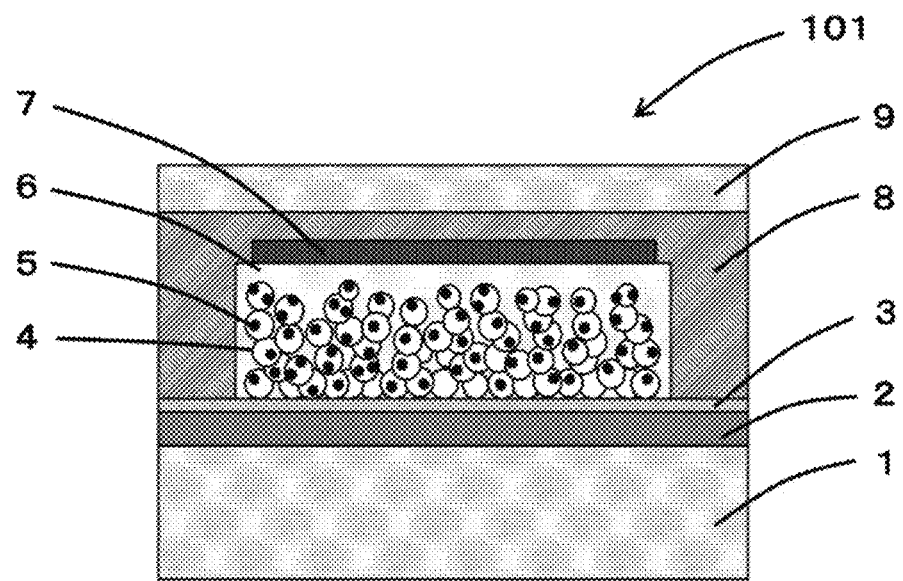
FIG. 3 is a schematic view presenting another example of a photoelectric conversion element of the present disclosure.

FIG. 3 is a schematic view presenting another example of a photoelectric conversion element of the present disclosure, and presents the case where the hollow section is not provided and the hollow section in FIG. 2 is covered with the sealing member 8.

A method for producing the photoelectric conversion element in which the hollow section is not provided is not particularly limited and may be appropriately selected depending on the intended purpose. Examples thereof include a method where the sealing member 8 is coated on the whole surface of the second electrode section 7 and the second substrate 9 is provided thereon and a method using the aforementioned sheet-shaped sealing material.

Figure 4:
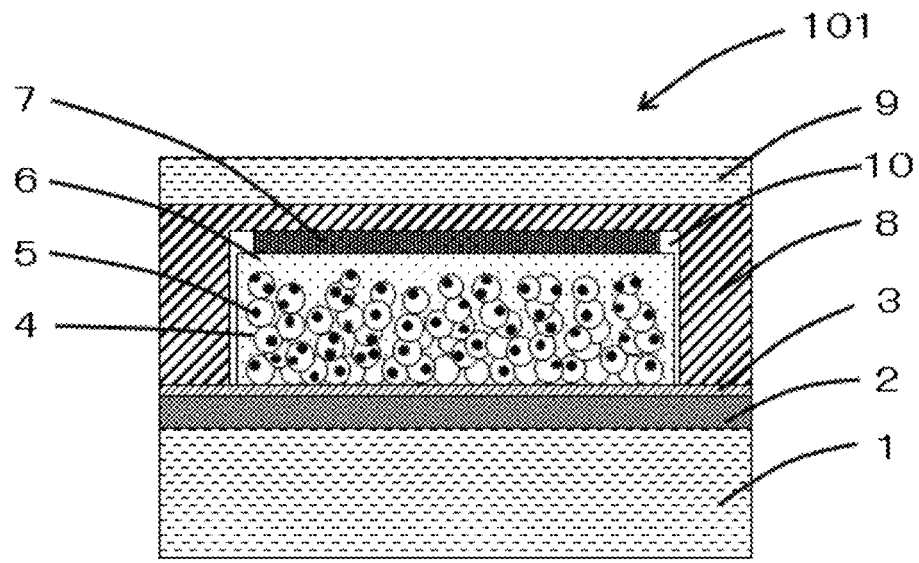
FIG. 4 is a schematic view presenting another example of a photoelectric conversion element of the present disclosure.
Figure 5:
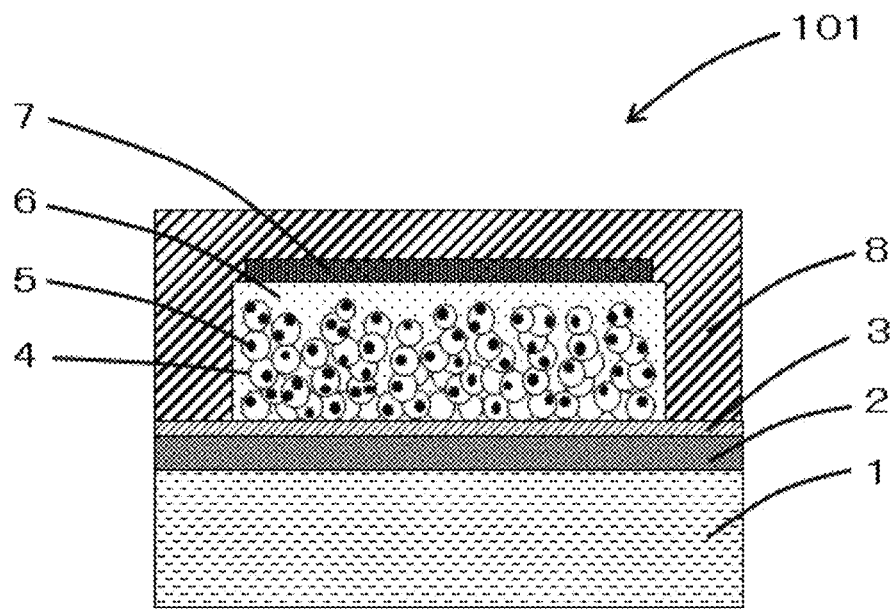
FIG. 5 is a schematic view presenting another example of a photoelectric conversion element of the present disclosure.

The hollow section inside the sealed part may be completely absent, or may partially remain as presented in FIG. 4. Almost all of the surface covered with the sealing member can decrease exfoliation or breakage of the second substrate 9 in the case where stress is applied to the photoelectric conversion element due to a twist or falling. As a result, mechanical strength of the photoelectric conversion element can be enhanced. As a modification example of FIG. 3, the configuration of FIG. 5 in which the second substrate is not provided may be used.

Figure 6:
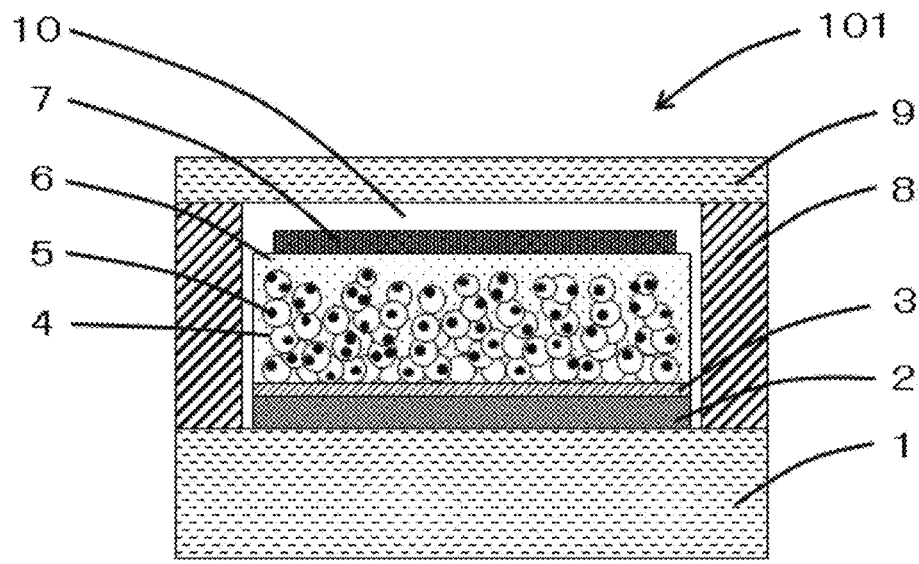
FIG. 6 is a schematic view presenting another example of a photoelectric conversion element of the present disclosure.

FIG. 6 is a schematic view presenting another example of a photoelectric conversion element of the present disclosure and presents the case where the sealing member 8 is attached to the first substrate 1 and the second substrate 9. Such configuration increases adhesiveness between the substrate and the sealing member 8 and can obtain an effect of enhancing the mechanical strength of the photoelectric conversion element. When the adhesiveness is enhanced, an effect of further enhancing the sealing effect of preventing entry of excessive moisture or oxygen can be obtained.

<Photoelectric Conversion Element Module>

A photoelectric conversion element module of the present disclosure includes a plurality of photoelectric conversion elements disposed that are adjacent to each other, and has a region where the photoelectric conversion elements are coupled in series or in parallel. The plurality of photoelectric conversion elements each include at least an electron-transporting section, a light-absorbing section, and a hole-transporting section between a first electrode section and a second electrode section. The hole-transporting section includes at least a hole-transporting material and an oxidizing agent, and the hole-transporting section has a peak that reaches maximum at a Raman shift of 1575 $cm^{-1} \pm 10$ $cm^{-1}$ and a peak that reaches maximum at a Raman shift of 1606 $cm^{-1} \pm 10$ $cm^{-1}$ in a Raman spectrum obtained by irradiating the hole-transporting section with laser light having a wavelength of 532 nm, and has a peak intensity ratio A/B of 0.80 or more. The peak intensity ratio A/B is obtained from a maximum peak intensity A of the peak that reaches maximum at 1575 $cm^{-1} \pm 10$ $cm^{-1}$ and a maximum peak intensity B of the peak that reaches maximum at 1606 $cm^{-1} \pm 10$ $cm^{-1}$.

The photoelectric conversion element module of the present disclosure may include a plurality of photoelectric conversion elements. The plurality of photoelectric conversion elements may be coupled in series and/or in parallel. Alternatively, the photoelectric conversion element module may include independent photoelectric conversion elements that are not coupled to each other.

The configuration of each layer of the photoelectric conversion element module may have the same configuration as that of the photoelectric conversion element.

A structure of the photoelectric conversion element module is not particularly limited and may be appropriately selected depending on the intended purpose. However, first electrode sections, electron-transporting sections, and second electrode sections are preferably separated in at least two photoelectric conversion elements that are adjacent to each other. This makes it possible to decrease a risk of short circuit. Meanwhile, in the at least two photoelectric conversion elements that are adjacent to each other, the hole-transporting section may be separated, or the hole-transporting sections have configuration of an extended continuous layer.

Moreover, the photoelectric conversion element module may have a configuration where, in the at least two photoelectric conversion elements that are adjacent to each other, the first electrode section in one of the photoelectric conversion elements is electrically coupled to the second electrode section in another of the photoelectric conversion elements through a conduction section penetrating at least from the hole-transporting section through the hole blocking section.

The photoelectric conversion element module may include a pair of substrates and a region where photoelectric conversion elements are coupled in series or in parallel between the pair of substrates. In addition, the photoelectric conversion element module may include a configuration where the sealing member may be sandwiched between the pair of substrates.

EMBODIMENTS

Hereinafter, one example of a photoelectric conversion element module of the present disclosure will be described with reference to drawings. However, the present disclosure is not limited thereto, those that are not described in the embodiments of the present disclosure regarding the number, the position, and the shape of the following constituent components can be included in the scope of the present disclosure.

Figure 7:
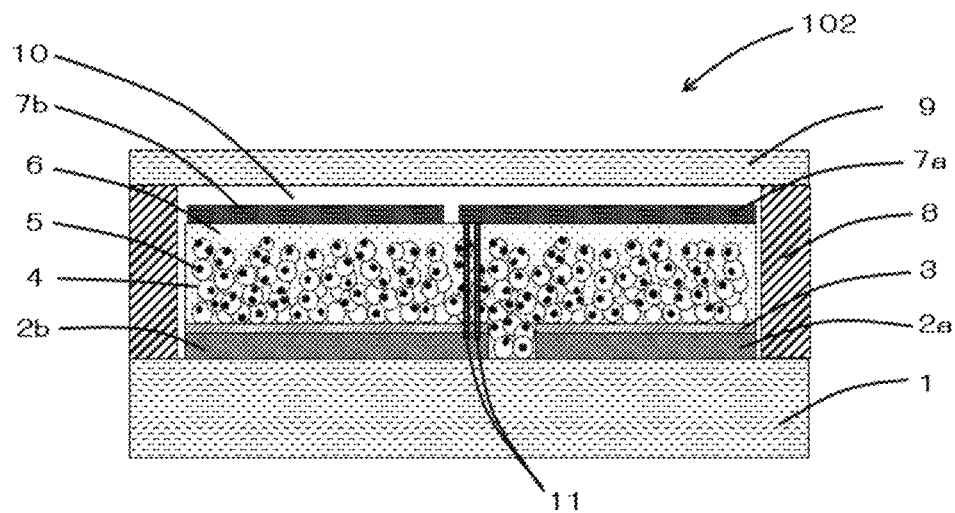
FIG. 7 is a schematic view presenting one example of a photoelectric conversion element module of the present disclosure.

FIG. 7 is a schematic view presenting one example of a photoelectric conversion element module of the present disclosure, and presents one example of a cross section of a part of the photoelectric conversion element module that includes a plurality of photoelectric conversion elements that are coupled in series.

In FIG. 7, after the hole-transporting section 6 is formed, a penetration section 11 is formed. Then, the second electrode section 7 is formed thereon, to thereby introduce a material of the second electrode section inside the penetration section 11, and this makes it possible to allow electric current to pass to a first electrode section 2b of the adjacent cell. Note that, a first electrode section 2a and a second electrode section 7b each have an electrode of a further adjacent photoelectric conversion element or a path configured to allow electric current to pass to an electrode extraction terminal, which is not presented in FIG. 7.

The penetration section 11 may penetrate through the first electrode section 2 to reach the first substrate 1, or may not reach the first substrate 1 by stopping processing inside the first electrode section 2.

In the case where a shape of the penetration section 11 is such a micropore that penetrates through the first electrode section 2 and reaches the first substrate 1, when a total opening area of the micropore with respect to an area of the penetration section 11 is too large, a cross-sectional area of the film of the first electrode section 2 is decreased to thereby increase the resistance value, which may cause a decrease of photoelectric conversion efficiency. Therefore, a ratio of the total opening area of the micropore to the area of the penetration section 11 is preferably 5/100 or more but 60/100 or less.

A method for forming the penetration section 11 is not particularly limited and may be appropriately selected depending on the intended purpose. Examples thereof include the sand blasting method, the water blasting method, abrasive paper, the chemical etching method, and the laser processing method. Among them, the laser processing method is preferable. This makes it possible to form a minute hole without using, for example, sand, etching, or resist, and to perform processing with good cleanness and reproducibility. In addition, when the penetration section 11 is formed, at least one of the hole blocking section 3, the electron-transporting section 4, the hole-transporting section 6, and the second electrode section 7 can be removed through impact exfoliation using the laser processing method. As a result, it is not necessary to provide a mask at the time of laminating, the aforementioned removal and formation of the minute penetration section 11 can be easily performed at one time.

Figure 8:
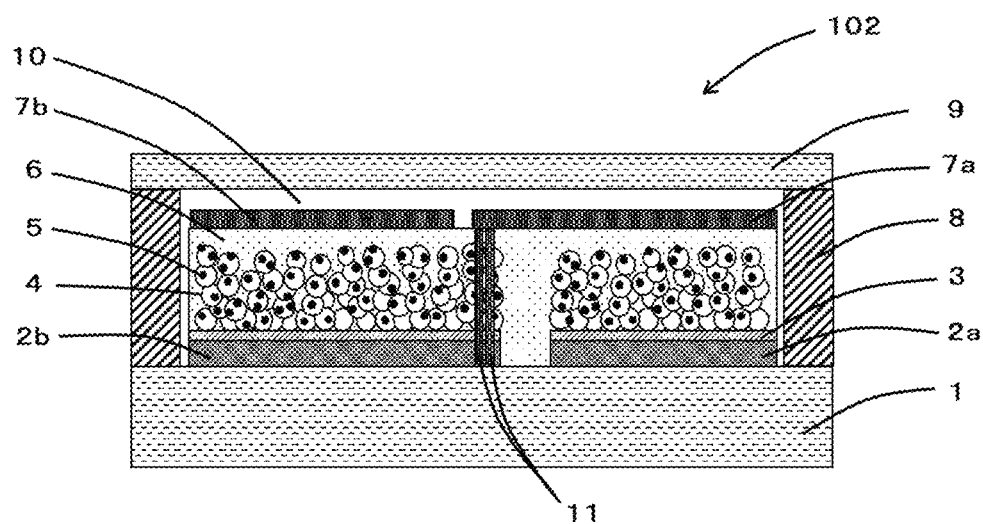
FIG. 8 is a schematic view presenting another example of a photoelectric conversion element module of the present disclosure.

FIG. 8 is a schematic view presenting one example of the photoelectric conversion element module of the present disclosure. The photoelectric conversion element module of FIG. 8 has such a configuration that unlike the photoelectric conversion element module of FIG. 7, the electron-transporting section 4 is separated from the adjacent photoelectric conversion element to make each layer independent. The photoelectric conversion element module of FIG. 8 has such a configuration that the electron-transporting section 4 is separated from the adjacent photoelectric conversion element but the hole-transporting section 6 is continuous.

Since the electron-transporting sections 4 are not extended to each other in the photoelectric conversion element module 102 presented in FIG. 8, diffusion of electrons is prevented and leakage of electric current is decreased to thereby improve light durability, which is advantageous.

Figure 9:
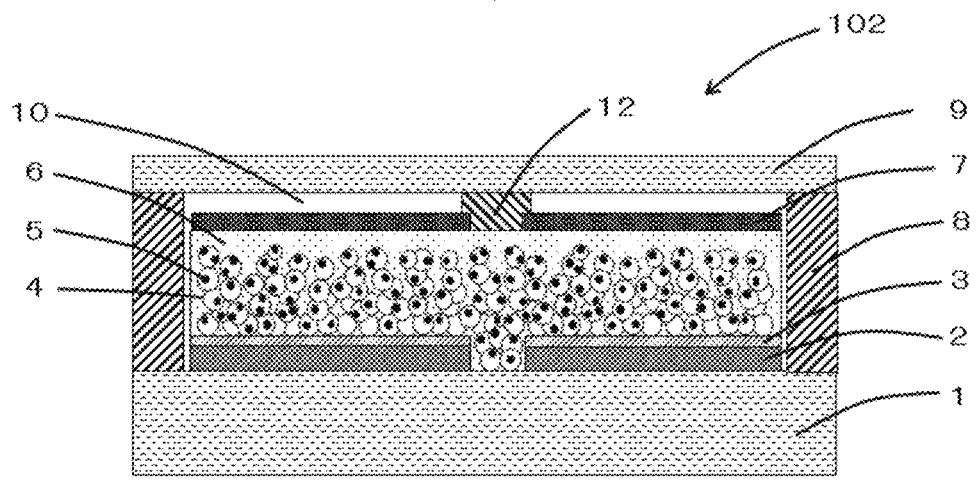
FIG. 9 is a schematic view obtained by observing FIG. 6 from a different angle.

FIG. 9 is a schematic view presenting one example of a photoelectric conversion element module of the present disclosure that includes a plurality of photoelectric conversion elements that are coupled in series, and is one example of a cross section of a part of the photoelectric conversion element module in which a sealing member 12 like a beam is provided in the hollow section between the photoelectric conversion elements.

As presented in FIG. 2, when the hollow section is provided between the second electrode section 7 and the second substrate 9, exfoliation or breakage of the second electrode section 7 can be prevented, but the mechanical strength of the sealed part may be decreased in some cases. Meanwhile, as presented in FIG. 3 and FIG. 4, a space between the second electrode section 7 and the second substrate 9 is filled with the sealing member, the mechanical strength of the sealed part is enhanced, but there may be a risk that the exfoliation of the second electrode section 7 is caused. In order to enhance power generation force, increasing an area of the photoelectric conversion element module is effective, but a decrease of the mechanical strength is inevitable in the case where the hollow section is included therein.

Therefore, as presented in FIG. 9, provision of the sealing member 12 like a beam is effective because exfoliation or breakage of the second electrode section 7 can be prevented and the mechanical strength of the sealed part can be enhanced. Here, materials of the sealing member 8 and the sealing member 12 may be identical or different.

<Electronic Device and Power Supply Module>

An electronic device of the present disclosure includes the photoelectric conversion element and/or the photoelectric conversion element module of the present disclosure, and a device configured to be driven by electric power obtained through power generation of the photoelectric conversion element and/or the photoelectric conversion element module, and further includes other devices if necessary.

A power supply module of the present disclosure includes the photoelectric conversion element and/or the photoelectric conversion element module of the present disclosure and a power supply IC, and further includes other devices if necessary.

A specific embodiment of an electronic device including the photoelectric conversion element and/or the photoelectric conversion element module of the present disclosure, and a device configured to be driven by electric power obtained through power generation of the photoelectric conversion element and/or the photoelectric conversion element module will be described.

Figure 10:
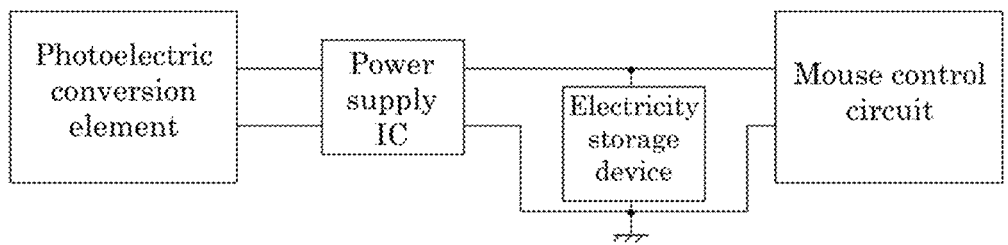
FIG. 10 is a schematic diagram presenting one example where a mouse is used as an electronic device.

FIG. 10 presents one example where a mouse is used as the electronic device.

As presented in FIG. 10, a photoelectric conversion element and/or a photoelectric conversion element module, a power supply IC, and an electricity storage device are combined and the supplied electric power is allowed to pass to a power supply of a control circuit of a mouse. As a result, the electricity storage device is charged when the mouse is not used, and the mouse can be driven by the electric power, and therefore such a mouse that does not require wiring or replacement of a cell can be obtained. Since a cell is not required, a weight thereof can be decreased, which is effective.

Figure 11:
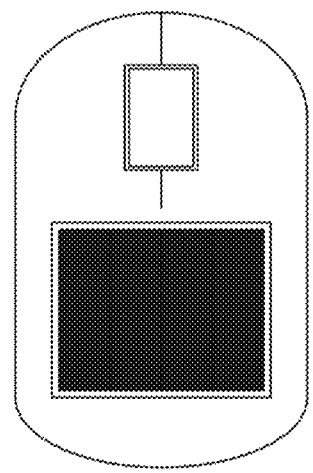
FIG. 11 is a schematic view presenting one example where a photoelectric conversion element is mounted in a mouse.

FIG. 11 presents a schematic view where a photoelectric conversion element is mounted in a mouse. A photoelectric conversion element, a power supply IC, and an electricity storage device are mounted inside a mouse, but an upper part of the photoelectric conversion element is covered with a transparent housing so that the photoelectric conversion element receives light. Moreover, the whole housing of the mouse can be formed of a transparent resin. The arrangement of the photoelectric conversion element is not limited to the above. For example, the photoelectric conversion element may be arranged in a position to which light is emitted even when the mouse is covered with a hand, and such arrangement may be preferable.

Another embodiment of an electronic device including the photoelectric conversion element and/or the photoelectric conversion element module of the present disclosure, and a device configured to be driven by electric power obtained through power generation of the photoelectric conversion element and/or the photoelectric conversion element module will be described.

Figure 12:
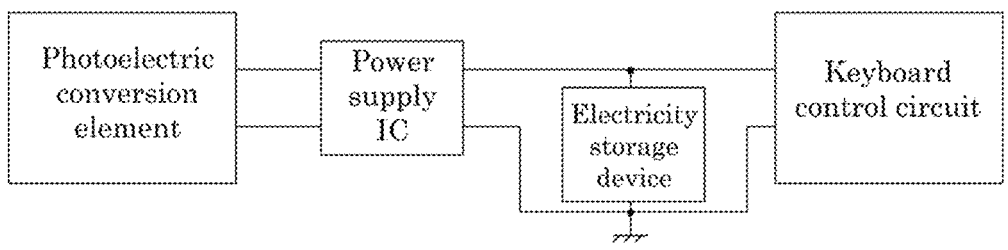
FIG. 12 is a schematic diagram presenting one example where a keyboard used in a personal computer is used as an electronic device.

FIG. 12 presents one example where a keyboard used in a personal computer is used as the electronic device.

As presented in FIG. 12, a photoelectric conversion element, a power supply IC, and an electricity storage device are combined, and the supplied electric power is allowed to pass to a power supply of a control circuit of a keyboard. As a result, the electricity storage device is charged when the keyboard is not used, and the keyboard can be driven by the electric power. Therefore, such a keyboard that does not require wiring or replacement of a cell can be obtained. Since a cell is not required, a weight thereof can be decreased, which is effective.

Figure 13:
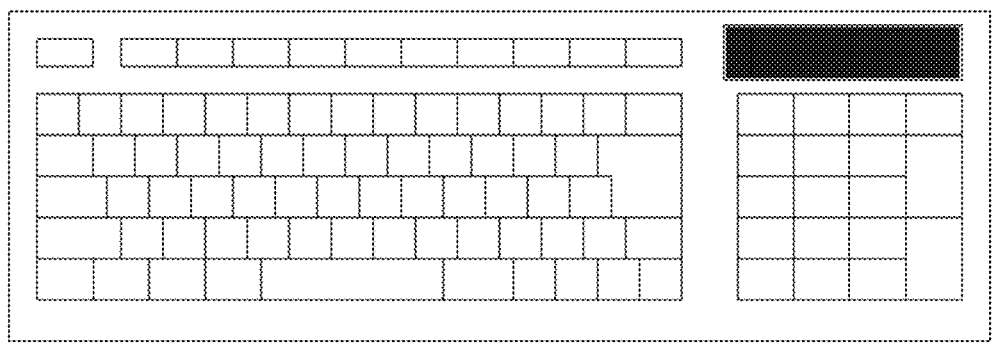
FIG. 13 is a schematic view presenting one example where a photoelectric conversion element is mounted in a keyboard.

FIG. 13 presents a schematic view in which a photoelectric conversion element is mounted in a keyboard. A photoelectric conversion element, a power supply IC, and an electricity storage device are mounted inside the keyboard, but an upper part of the photoelectric conversion element is covered with a transparent housing so that the photoelectric conversion element receives light. The whole housing of the keyboard can be formed of a transparent resin. The arrangement of the photoelectric conversion element is not limited to the above.

Figure 14:
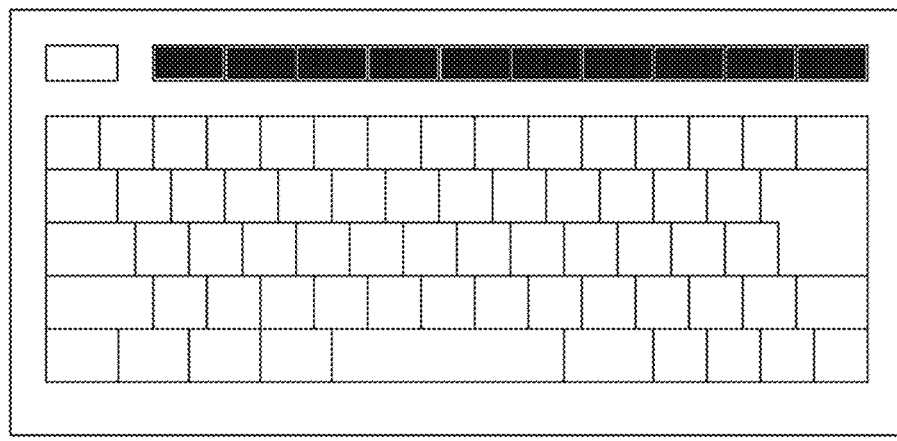
FIG. 14 is a schematic view presenting one example where a small-sized photoelectric conversion element is mounted in some keys of a keyboard.

In the case of a small keyboard in which a space for incorporating the photoelectric conversion element is small, a small photoelectric conversion element may be embedded in some keys as presented in FIG. 14, and such arrangement is effective.

Another embodiment of an electronic device including the photoelectric conversion element and/or the photoelectric conversion element module of the present disclosure, and a device configured to be driven by electric power obtained through power generation of the photoelectric conversion element and/or the photoelectric conversion element module will be described.

Figure 15:
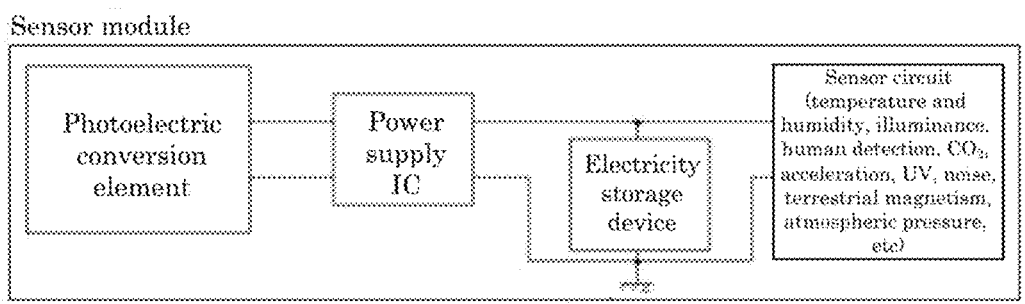
FIG. 15 is a schematic diagram presenting one example where a sensor is used as an electronic device.
Figure 15:

FIG. 15 presents one example where a sensor is used as an electronic device.

As presented in FIG. 15, a photoelectric conversion element, a power supply IC, and an electricity storage device are combined, and the supplied electric power is allowed to pass to a power supply of a control circuit of a sensor circuit. As a result, a sensor module can be constituted without requiring connection to an external power supply and without requiring replacement of a cell. A sensing target is, for example, temperature and humidity, illuminance, human detection, $CO_2$, acceleration, UV, noise, terrestrial magnetism, and atmospheric pressure, and such an electronic device can be applied to various sensors, which is effective. As presented in A in FIG. 15, the sensor module is configured to sense a target to be measured on a regular basis and to transmit the read data to a personal computer (PC) or a smartphone through wireless communication.

It is expected that use of sensors is significantly increased as the internet of things (IoT) society approaches. Replacing batteries of numerous sensors one by one is time consuming and is not realistic. Moreover, the fact that a sensor is installed at a position such as a ceiling and a wall where a cell is not easily replaced also makes workability bad. The fact that electricity can be supplied by the photoelectric conversion element is also significantly advantageous. Moreover, supplying electric power by the photoelectric conversion element is also a significantly large advantage. In addition, the photoelectric conversion element of the present disclosure has advantages that a high output can be obtained even with light of low illuminance and a high degree of freedom in installation can be achieved because dependence of light incident angle for the output is small.

Next, another embodiment of an electronic device including the photoelectric conversion element and/or the photoelectric conversion element module of the present disclosure and a device configured to be driven by electric power obtained through power generation of the photoelectric conversion element and/or the photoelectric conversion element module will be described.

Figure 16:
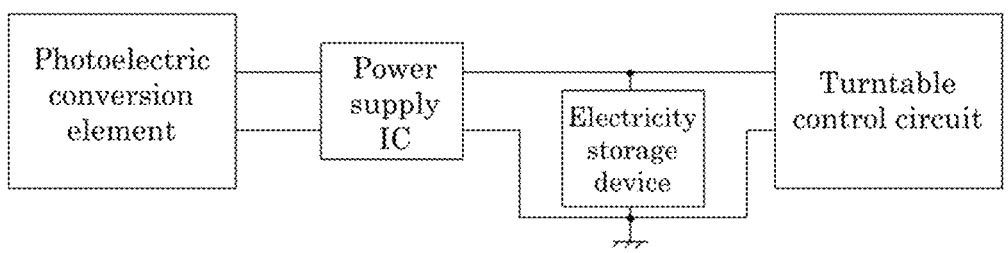
FIG. 16 is a schematic diagram presenting one example where a turntable is used as an electronic device.

FIG. 16 presents one example in which a turntable is used as the electronic device.

As presented in FIG. 16, the photoelectric conversion element, a power supply IC, and an electricity storage device are combined, and the supplied electric power is allowed to pass to a power supply of a turntable control circuit. As a result, a turntable can be constituted without requiring connection to an external power supply and without requiring replacement of a cell.

The turntable is used, for example, in a display case in which products are displayed. Wiring of a power supply degrades appearance of the display, and moreover displayed products need to be removed at the time of replacing a cell, which is time-consuming. Use of the photoelectric conversion element of the present disclosure is effective because the aforementioned problems can be solved.

<Use>

As described above, the electronic device including the photoelectric conversion element and/or the photoelectric conversion element module of the present disclosure and the device configured to be driven by electric power obtained through power generation of the photoelectric conversion element and/or the photoelectric conversion element module, and the power supply module have been described above. However, the embodiments described are only part of applicable embodiments, and use of the photoelectric conversion element or the photoelectric conversion element module of the present disclosure is not limited to the above-described uses.

The photoelectric conversion element and/or the photoelectric conversion element module can be applied for, for example, a power supply device by combining it with a circuit board configured to control generated electric current.

Examples of devices using the power supply device include electronic desk calculators, watches, mobile phones, electronic organizers, and electronic paper.

Moreover, a power supply device including the photoelectric conversion element can be used as an auxiliary power supply for prolonging a continuous operating time of a charge-type or dry cell-type electronic equipment.

The photoelectric conversion element and the photoelectric conversion element module of the present disclosure can function as a self-sustaining power supply, and electric power generated through photoelectric conversion can be used to drive a device. Since the photoelectric conversion element and the photoelectric conversion element module of the present disclosure can generate electricity by irradiation of light, it is not necessary to couple the electronic device to a power supply or to replace a cell. Therefore, the electronic device can be driven in a place where there is no power supply facility, the electronic device can be worn or carried, and the electronic device can be driven without replacement of a cell even in a place where a cell is not easily replaced. Moreover, when a dry cell is used, the electronic device becomes heavy by a weight of the dry cell, or the electronic device becomes large by a size of the dry cell. Therefore, there may be a problem in installing the electronic device on a wall or ceiling, or transporting the electronic device. Since the photoelectric conversion element and the photoelectric conversion element module of the present disclosure are light and thin, they can be freely installed, and can be worn and carried, which is advantageous.

As described above, the photoelectric conversion element and the photoelectric conversion element module of the present disclosure can be used as a self-sustaining power supply, and can be combined with various electronic devices. For example, the photoelectric conversion element and the photoelectric conversion element module of the present disclosure can be used in combination with a display device (e.g., an electronic desk calculator, a watch, a mobile phone, an electronic organizer, and electronic paper), an accessory device of a personal computer (e.g., a mouse and a keyboard), various sensor devices (e.g., a temperature and humidity sensor and a human detection sensor), transmitters (e.g., a beacon and a global positioning system (GPS)), and numerous electronic devices (e.g., auxiliary lamps and remote controllers).

The photoelectric conversion element and the photoelectric conversion element module of the present disclosure are widely applied because they can generate electricity particularly with light of low illuminance and can generate electricity indoors and in further darker shade. Moreover, the photoelectric conversion element and the photoelectric conversion element module are highly safe because liquid leakage found in the case of a dry cell does not occur, and accidental ingestion found in the case of a button cell does not occur. Furthermore, the photoelectric conversion element and the photoelectric conversion element module can be used as an auxiliary power supply for the purpose of prolonging a continuous operation time of a charge-type or dry cell-type electronic equipment. As described above, when the photoelectric conversion element and the photoelectric conversion element module of the present disclosure are combined with a device configured to be driven by electric power generated through photoelectric conversion of the photoelectric conversion element and/or the photoelectric conversion element module, it is possible to obtain an electronic device that is light and easy to use, has a high degree of freedom in installation, does not require replacement of a cell, is excellent in safety, and is effective in decreasing environmental loads.

Figure 17:
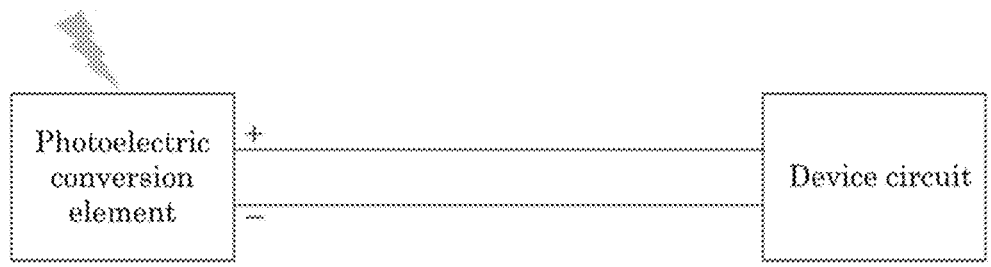
FIG. 17 is a schematic diagram presenting one example of an electronic device obtained by combining a photoelectric conversion element and/or a photoelectric conversion element module of the present disclosure with a device configured to be driven by electric power generated through photoelectric conversion of the photoelectric conversion element and/or the photoelectric conversion element module.

FIG. 17 presents a basic configuration diagram of an electronic device obtained by combining the photoelectric conversion element and/or the photoelectric conversion element module of the present disclosure with a device configured to be driven by electric power generated through photoelectric conversion of the photoelectric conversion element and/or the photoelectric conversion element module. The electronic device can generate electricity when the photoelectric conversion element is irradiated with light, and can extract electric power. A circuit of the device can be driven by the generated electric power.

Figure 18:
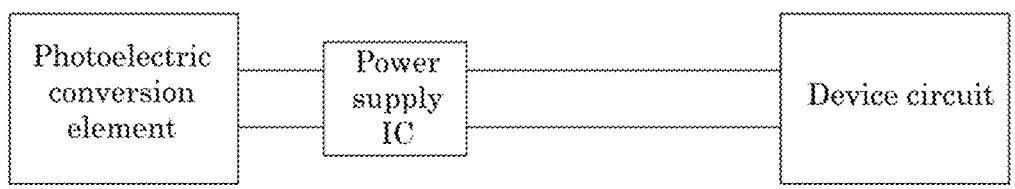
FIG. 18 is a schematic diagram presenting one example where a power supply IC for a photoelectric conversion element is incorporated between the photoelectric conversion element and a circuit of the device in FIG. 17.

Since the output of the photoelectric conversion element varies depending on circumferential illuminance, the electronic device presented in FIG. 17 may not be stably driven in some cases. In this case, as presented in FIG. 18, a power supply IC for a photoelectric conversion element can be incorporated between the photoelectric conversion element and the circuit of the device in order to stably supply voltage to a side of the circuit, and such arrangement is effective.

Figure 19:
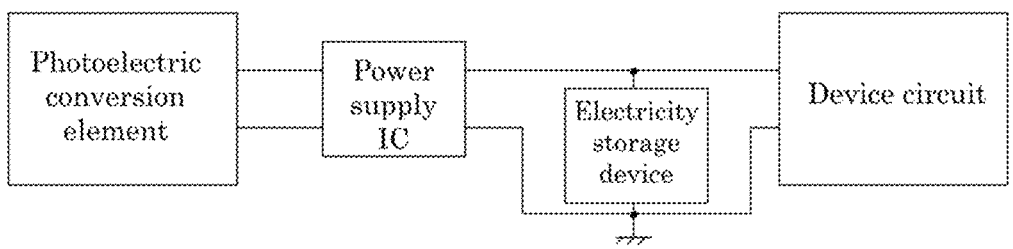
FIG. 19 is a schematic diagram presenting one example where an electricity storage device is incorporated between the power supply IC and the circuit of the device in FIG. 18.

The photoelectric conversion element can generate electricity so long as light of sufficient illuminance is emitted. However, when illuminance for generating electricity is not enough, desired electric power cannot be obtained, which is a disadvantage of the photoelectric conversion element. In this case, as presented in FIG. 19, when an electricity storage device such as a capacitor is mounted between a power supply IC and a device circuit, excess electric power from the photoelectric conversion element can be stored in the electricity storage device. In addition, the electric power stored in the electricity storage device can be supplied to a device circuit to thereby enable stable operation when the illuminance is too low or even when light is not applied to the photoelectric conversion element.

As described above, the electronic device obtained by combining the photoelectric conversion element and/or the photoelectric conversion element module of the present disclosure with the device circuit can be driven even in an environment without a power supply, does not require replacement of a cell, and can be stably driven by combination with a power supply IC or an electricity storage device. Therefore, it is possible to make the most of advantages of the photoelectric conversion element.

Meanwhile, the photoelectric conversion element and/or the photoelectric conversion element module of the present disclosure can also be used as a power supply module, and such use is effective. As presented in FIG. 20, for example, when the photoelectric conversion element and/or the photoelectric conversion element module of the present disclosure are coupled to a power supply IC for a photoelectric conversion element, a DC power supply module capable of supplying electric power generated through photoelectric conversion of the photoelectric conversion element to the power supply IC at a predetermined voltage level can be constituted.

Figure 21:
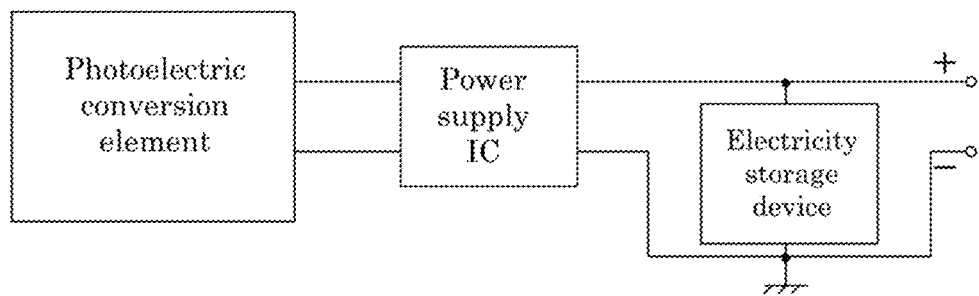
FIG. 21 is a schematic view presenting one example of a power supply module obtained by adding an electricity storage device to the power supply IC in FIG. 20.

Moreover, as presented in FIG. 21, when an electricity storage device is added to a power supply IC, electric power generated by the photoelectric conversion element can be stored in the electricity storage device. Therefore, a power supply module to which electric power can be supplied can be constituted when the illuminance is too low or even when light is not applied to the photoelectric conversion element.

Figure 20:
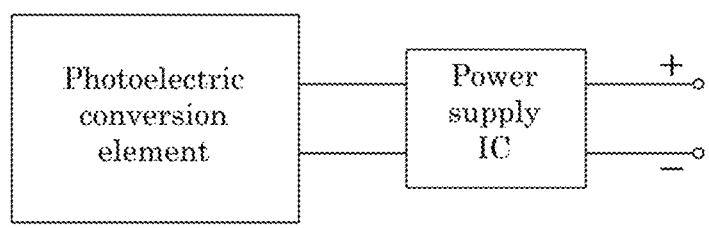
FIG. 20 is a schematic diagram presenting one example of a power supply module including a photoelectric conversion element and/or a photoelectric conversion element module of the present disclosure and a power supply IC.

The power supply modules of the present disclosure presented in FIG. 20 and FIG. 21 can be used as a power supply module without replacement of a cell as in case of primary cells known in the art.

EXAMPLES

Hereinafter, Examples of the present disclosure will be described. However, the present disclosure should not be construed as being limited to these Examples.

Example 1

<Production of Photoelectric Conversion Element>

Over a glass substrate as a first substrate, a film of indium-doped tin oxide (ITO) and a film of niobium-doped tin oxide (NTO) as a first electrode section were sequentially formed through sputtering. Then, a compact layer formed of titanium oxide as a hole blocking section was formed through reactive sputtering with oxygen gas.

Next, titanium oxide (ST-21, available from ISHIHARA SANGYO KAISHA, LTD.) (3 parts by mass), acetylacetone (0.2 parts by mass), and polyoxyethylene octylphenyl ether (available from Wako Pure Chemical Industries, Ltd.) (0.3 parts by mass) as a surfactant were subjected to a bead mill treatment for 12 hours together with water (5.5 parts by mass) and ethanol (1.0 part by mass). To the titanium oxide dispersion liquid obtained, polyethylene glycol (polyethylene glycol 20,000, available from Wako Pure Chemical Industries, Ltd.) (1.2 parts by mass) was added to thereby prepare paste.

The paste prepared was coated over the hole blocking section (average thickness: about 1.5 micrometers) and was dried at 60 degrees Celsius. Then, the resultant was fired at 550 degrees Celsius for 30 minutes in the air, to thereby form a porous electron-transporting section.

The glass substrate over which the electron-transporting section had been formed was immersed in a mixed solution including a photosensitization compound expressed by B-5 and acetonitrile/t-butanol (volume ratio: 1:1) and was left to stand for 1 hour in the dark to thereby adsorb the photosensitization compound on the surface of the electron-transporting section.

To chlorobenzene (1100 parts by mass), a hole-transporting material expressed by the D-7 (available from Merck KGaA) (195 parts by mass), a cobalt complex expressed by the F-11 (available from Sigma-Aldrich Japan) (19 parts by mass) as an oxidizing agent, lithium bis(trifluoromethanesulfonyl)imide (LiTFSI) (available from KANTO CHEMICAL CO., INC.) (20 parts by mass) as an alkali metal salt, a compound having a pyridine ring structure expressed by the C-10 (40 parts by mass), and acetonitrile (available from KANTO CHEMICAL CO., INC.) (60 parts by mass) were added and dissolved to thereby prepare a coating liquid for the hole-transporting section.

Next, over the electron-transporting section to which the photosensitization compound had been adsorbed, a hole-transporting section was formed (average thickness: about 500 nm) through the spin-coating method using the coating liquid for the hole-transporting section. Then, the hole-transporting section coated on the peripheral portion of the glass substrate was removed. Over the hole-transporting section, silver was deposited under vacuum to thereby form a second electrode section (average thickness: 100 nm).

On the peripheral portion of the glass substrate from which the hole-transporting section had been removed, an ultraviolet-curing resin A (TB3118, available from ThreeBond Holdings Co., Ltd.) as a sealing member was coated using a dispenser (2300N, available from SAN-EI TECH LTD.) so as to surround a power generation region.

Then, it was transferred to a glove box into which a mixed gas of nitrogen and oxygen (oxygen concentration: 10.0% by volume, dew point: −50 degrees Celsius) had been introduced, and a cover glass as a second substrate was placed over the ultraviolet-curing resin. Then, the resin was cured through irradiation of ultraviolet rays and the power generation region was sealed to thereby produce a photoelectric conversion element of Example 1 as presented in FIG. 2.

Example 2

A photoelectric conversion element of Example 2 was produced in the same manner as in Example 1 except that the amount of the hole-transporting material added was changed to 191 parts by mass, the amount of the oxidizing agent added was changed to 25 parts by mass, the amount of the alkali metal salt added was changed to 19 parts by mass, and the amount of the added compound having a pyridine ring structure was changed to 39 parts by mass.

Example 3

A photoelectric conversion element of Example 3 was produced in the same manner as in Example 1, except that the amount of the hole-transporting material added was changed to 186 parts by mass, the amount of the oxidizing agent added was changed to 30 parts by mass, the amount of the alkali metal salt added was changed to 19 parts by mass, and the amount of the added compound having a pyridine ring structure was changed to 38 parts by mass.

Example 4

A photoelectric conversion element of Example 4 was produced in the same manner as in Example 1 except that the amount of the hole-transporting material added was changed to 176 parts by mass, the amount of the oxidizing agent added was changed to 43 parts by mass, the amount of the alkali metal salt added was changed to 18 parts by mass, and the amount of the added compound having a pyridine ring structure was changed to 35 parts by mass.

Example 5

A photoelectric conversion element of Example 5 was produced in the same manner as in Example 1 except that the amount of the hole-transporting material added was changed to 199 parts by mass, and the amount of the oxidizing agent added was changed to 15 parts by mass.

Example 6

A photoelectric conversion element of Example 6 was produced in the same manner as in Example 1 except that the amount of the hole-transporting material added was changed to 200 parts by mass, and the amount of the oxidizing agent added was changed to 14 parts by mass.

Example 7

A photoelectric conversion element of Example 7 was produced in the same manner as in Example 1 except that the amount of the hole-transporting material added was changed to 200 parts by mass, the oxidizing agent used was changed to a cobalt complex expressed by the F-22 (available from Sigma-Aldrich Japan), and the amount of the oxidizing agent added was changed to 13 parts by mass.

Example 8

A photoelectric conversion element of Example 8 was produced in the same manner as in Example 7 except that the amount of the hole-transporting material added was changed to 194 parts by mass, and the amount of the oxidizing agent added was changed to 21 parts by mass.

Example 9

A photoelectric conversion element of Example 9 was produced in the same manner as in Example 7 except that the amount of the hole-transporting material added was changed to 184 parts by mass, the amount of the oxidizing agent added was changed to 33 parts by mass, the amount of the alkali metal salt added was changed to 19 parts by mass, and the amount of the added compound having a pyridine ring structure was changed to 37 parts by mass.

Example 10

A photoelectric conversion element of Example 10 was produced in the same manner as in Example 1 except that the amount of the hole-transporting material added was changed to 203 parts by mass, the oxidizing agent was changed to a cobalt complex expressed by the F-19 (available from Sigma-Aldrich Japan), the amount of the oxidizing agent was changed to 9.5 parts by mass, the amount of the alkali metal salt added was changed to 21 parts by mass, and the amount of the added compound having a pyridine ring structure was changed to 41 parts by mass.

Example 11

A photoelectric conversion element of Example 11 was produced in the same manner as in Example 10 except that the amount of the hole-transporting material added was changed to 194 parts by mass, the amount of the oxidizing agent added was changed to 21 parts by mass, the amount of the alkali metal salt added was changed to 20 parts by mass, and the amount of the added compound having a pyridine ring structure was changed to 39 parts by mass.

Example 12

A photoelectric conversion element of Example 12 was produced in the same manner as in Example 1 except that the amount of the hole-transporting material added was changed to 205 parts by mass, the oxidizing agent was changed to a hypervalent iodine compound expressed by the G-1 (available from Sigma-Aldrich Japan), the amount of the oxidizing agent added was changed to 7 parts by mass, the amount of the alkali metal salt added was changed to 21 parts by mass, and the amount of the added compound having a pyridine ring structure was changed to 41 parts by mass.

Example 13

A photoelectric conversion element of Example 13 was produced in the same manner as in Example 12 except that the cobalt complex expressed by the F-11 (available from Sigma-Aldrich Japan) (15 parts by mass) was further added thereto as the oxidizing agent.

Example 14

A photoelectric conversion element of Example 14 was produced in the same manner as in Example 1 except that the hole-transporting material was changed to the D-10.

Example 15

A photoelectric conversion element of Example 15 was produced in the same manner as in Example 1 except that lithium bis(trifluoromethanesulfonyl)imide (LiTFSI) was changed to lithium bis(fluorosulfonyl)imide (LiFSi).

Example 16

A photoelectric conversion element of Example 16 was produced in the same manner as in Example 1 except that the compound having a pyridine ring structure was changed to the C-12.

Example 17

A photoelectric conversion element of Example 17 was produced in the same manner as in Example 1 except that the sealing member was changed to an ultraviolet-curing resin B (World Rock No. 5910, available from Kyoritsu Chemical & Co., Ltd.).

Example 18

A photoelectric conversion element of Example 18 was produced in the same manner as in Example 17 except that the oxygen concentration of the hollow section inside the sealed part was changed to 15% by volume (nitrogen/oxygen mixed gas).

Example 19

A photoelectric conversion element of Example 19 was produced in the same manner as in Example 17 except that the oxygen concentration of the hollow section inside the sealed part was changed to 21% by volume (high-purity air).

Example 20

A photoelectric conversion element of Example 20 was produced in the same manner as in Example 17 except that the oxygen concentration of the hollow section inside the sealed part was changed to 5% by volume (nitrogen/oxygen mixed gas).

Comparative Example 1

A photoelectric conversion element of Comparative Example 1 was produced in the same manner as in Example 17 except that the amount of the hole-transporting material added was changed to 201 parts by mass, and the amount of the oxidizing agent added was changed to 12 parts by mass.

Comparative Example 2

A photoelectric conversion element of Comparative Example 2 was produced in the same manner as in Example 17 except that the amount of the hole-transporting material added was changed to 204 parts by mass, and the amount of the oxidizing agent added was changed to 8.3 parts by mass.

Comparative Example 3

A photoelectric conversion element of Comparative Example 3 was produced in the same manner as in Example 17 except that the amount of the hole-transporting material added was changed to 207 parts by mass, the amount of the oxidizing agent added was changed to 4.2 parts by mass, the amount of the alkali metal salt added was changed to 21 parts by mass, and the amount of the added compound having a pyridine ring structure was changed to 42 parts by mass.

Comparative Example 4

A photoelectric conversion element of Comparative Example 4 was produced in the same manner as in Comparative Example 1 except that the oxygen concentration of the hollow section inside the sealed part was changed to 21% by volume (high-purity air).

Comparative Example 5

A photoelectric conversion element of Comparative Example 5 was produced in the same manner as in Comparative Example 1 except that the oxygen concentration of the hollow section inside the sealed part was changed to 0% by volume (nitrogen gas).

A peak intensity ratio A/B of each of the produced photoelectric conversion elements was determined in the following manner. Results are presented in Table 1-2.

<Calculation of Peak Intensity>

The hole-transporting section of each of the produced photoelectric conversion elements could be identified under a microscope. Therefore, each hole-transporting section was measured through Raman spectroscopy just as it was without opening the sealed part. The Raman spectroscopic apparatus used was a 3D laser Raman spectroscopic apparatus "Nanofinder 30" (available from Tokyo Instruments, Inc.).

Measurement conditions were as follows.
Laser wavelength: 532 nm
Objective lens: 40 folds
ND filter (laser power): 3.0 (minimum)
Exposure time: 60 seconds
Cumulative number: one time An OMNIC software was used to read peaks. First, a base line was drawn between a Raman shift of 1647 $cm^{-1}$±1 $cm^{-1}$ and a Raman shift of 1521 $cm^{-1}$±1 $cm^{-1}$. Then, the maximum peak intensity A of the peak that reached the maximum at a Raman shift of 1575 $cm^{-1}$±10 $cm^{-1}$ and the maximum peak intensity B of the peak that reached the maximum at a Raman shift of 1606 $cm^{-1}$±10 $cm^{-1}$ were read, to thereby calculate a peak intensity ratio A/B. Furthermore, 4 portions per one sample were measured for the Raman measurement, and the peak intensity ratio A/B obtained was an average of values on the four portions.

Each of the produced photoelectric conversion elements was subjected to the following durability test. Results are presented in Table 1-2.

<Durability Test of Photoelectric Conversion Element>

Using a solar cell test system (As-510-PV03, available from NF CORPORATION), under irradiation of adjusted white LED of 200 lux, each of the produced photoelectric conversion elements was evaluated for IV characteristics. An initial maximum output power Pmax 1 ($\mu W/cm^2$) thereof was determined.

Next, the photoelectric conversion element was irradiated under irradiation adjusted white LED of 8,000 lux for 750 hours. Then, the photoelectric conversion element was evaluated again for IV characteristics under irradiation of adjusted white LED of 200 lux, and a maximum output power Pmax 2 ($\mu W/cm^2$) after the test was determined. Finally, the maximum output power Pmax 2 ($\mu W/cm^2$) after the test was divided by the initial maximum output power Pmax 1 ($\mu W/cm^2$) to thereby determine a Pmax maintenance rate (Pmax 2/Pmax 1×100) after the durability test.

TABLE 1-1

|  | Dye | Hole-transporting material | Oxidizing agent | Alkali metal salt | Pyridine compound | Sealing resin | Oxygen concentration (%) of sealed part |
|---|---|---|---|---|---|---|---|
| Example 1 | B-5 | D-7 | F-11 | Li-TFSI | C-10 | Resin A | 10.0 |
| Example 2 | B-5 | D-7 | F-11 | Li-TFSI | C-10 | Resin A | 10.0 |
| Example 3 | B-5 | D-7 | F-11 | Li-TFSI | C-10 | Resin A | 10.0 |
| Example 4 | B-5 | D-7 | F-11 | Li-TFSI | C-10 | Resin A | 10.0 |
| Example 5 | B-5 | D-7 | F-11 | Li-TFSI | C-10 | Resin A | 10.0 |
| Example 6 | B-5 | D-7 | F-11 | Li-TFSI | C-10 | Resin A | 10.0 |
| Example 7 | B-5 | D-7 | F-22 | Li-TFSI | C-10 | Resin A | 10.0 |
| Example 8 | B-5 | D-7 | F-22 | Li-TFSI | C-10 | Resin A | 10.0 |
| Example 9 | B-5 | D-7 | F-22 | Li-TFSI | C-10 | Resin A | 10.0 |
| Example 10 | B-5 | D-7 | F-19 | Li-TFSI | C-10 | Resin A | 10.0 |
| Example 11 | B-5 | D-7 | F-19 | Li-TFSI | C-10 | Resin A | 10.0 |
| Example 12 | B-5 | D-7 | G-1 | Li-TFSI | C-10 | Resin A | 10.0 |
| Example 13 | B-5 | D-7 | G-1 + F-11 | Li-TFSI | C-10 | Resin A | 10.0 |
| Example 14 | B-5 | D-10 | F-11 | Li-TFSI | C-10 | Resin A | 10.0 |
| Example 15 | B-5 | D-7 | F-11 | Li-FSI | C-10 | Resin A | 10.0 |
| Example 16 | B-5 | D-7 | F-11 | Li-TFSI | C-12 | Resin A | 10.0 |
| Example 17 | B-5 | D-7 | F-11 | Li-TFSI | C-10 | Resin B | 10.0 |
| Example 18 | B-5 | D-7 | F-11 | Li-TFSI | C-10 | Resin B | 15.0 |
| Example 19 | B-5 | D-7 | F-11 | Li-TFSI | C-10 | Resin B | 21.0 |
| Example 20 | B-5 | D-7 | F-11 | Li-TFSI | C-10 | Resin B | 5.0 |
| Comparative Example 1 | B-5 | D-7 | F-11 | Li-TFSI | C-10 | Resin B | 10.0 |
| Comparative Example 2 | B-5 | D-7 | F-11 | Li-TFSI | C-10 | Resin B | 10.0 |
| Comparative Example 3 | B-5 | D-7 | F-11 | Li-TFSI | C-10 | Resin B | 10.0 |
| Comparative Example 4 | B-5 | D-7 | F-11 | Li-TFSI | C-10 | Resin B | 21.0 |
| Comparative Example 5 | B-5 | D-7 | F-11 | Li-TFSI | C-10 | Resin B | 0.0 |

TABLE 1-2

|  | Amount of hole-transporting material added (parts by mass) | Amount of oxidizing agent added (parts by mass) | Amount of alkali metal salt added (parts by mass) | Amount of pyridine compound added (parts by mass) | Peak intensity ratio A/B | Initial Pmax ($\mu W/cm^2$) | Pmax Maintenance rate (%) |
|---|---|---|---|---|---|---|---|
| Example 1 | 195 | 19 | 20 | 40 | 0.91 | 10.5 | 91 |
| Example 2 | 191 | 25 | 19 | 39 | 0.99 | 10.8 | 93 |
| Example 3 | 186 | 30 | 19 | 38 | 1.04 | 11.0 | 94 |
| Example 4 | 176 | 43 | 18 | 35 | 1.10 | 10.9 | 94 |
| Example 5 | 199 | 15 | 20 | 40 | 0.83 | 10.4 | 86 |
| Example 6 | 200 | 14 | 20 | 40 | 0.81 | 10.1 | 83 |
| Example 7 | 200 | 13 | 20 | 40 | 0.86 | 10.3 | 88 |
| Example 8 | 194 | 21 | 20 | 40 | 0.98 | 10.7 | 92 |
| Example 9 | 184 | 33 | 19 | 37 | 1.07 | 11.0 | 94 |
| Example 10 | 203 | 9.5 | 21 | 41 | 0.84 | 10.2 | 89 |
| Example 11 | 194 | 21 | 20 | 39 | 1.02 | 10.6 | 91 |
| Example 12 | 205 | 7 | 21 | 41 | 1.00 | 10.8 | 92 |
| Example 13 | 205 | 7 + 15 | 21 | 41 | 1.13 | 11.0 | 95 |
| Example 14 | 195 | 19 | 20 | 40 | 0.91 | 10.6 | 93 |
| Example 15 | 195 | 19 | 20 | 40 | 0.91 | 10.5 | 92 |
| Example 16 | 195 | 19 | 20 | 40 | 0.91 | 10.6 | 92 |
| Example 17 | 195 | 19 | 20 | 40 | 0.91 | 10.5 | 92 |
| Example 18 | 195 | 19 | 20 | 40 | 0.93 | 10.5 | 93 |
| Example 19 | 195 | 19 | 20 | 40 | 0.94 | 10.5 | 95 |
| Example 20 | 195 | 19 | 20 | 40 | 0.90 | 10.3 | 85 |
| Comparative Example 1 | 201 | 12 | 20 | 40 | 0.73 | 9.7 | 68 |
| Comparative Example 2 | 204 | 8.3 | 20 | 40 | 0.60 | 9.5 | 57 |

TABLE 1-2-continued

|  | Amount of hole-transporting material added (parts by mass) | Amount of oxidizing agent added (parts by mass) | Amount of alkali metal salt added (parts by mass) | Amount of pyridine compound added (parts by mass) | Peak intensity ratio A/B | Initial Pmax ($\mu$W/cm$^2$) | Pmax Maintenance rate (%) |
|---|---|---|---|---|---|---|---|
| Comparative Example 3 | 207 | 4.2 | 21 | 42 | 0.41 | 9.0 | 40 |
| Comparative Example 4 | 201 | 12 | 20 | 40 | 0.77 | 10.0 | 74 |
| Comparative Example 5 | 207 | 4.2 | 21 | 42 | 0.68 | 9.2 | 12 |

Example 21

<Production of Photoelectric Conversion Element Module>

Over a glass substrate as a first substrate, a film of indium-doped tin oxide (ITO) and a film of niobium-doped tin oxide (NTO) as a first electrode section were sequentially formed through sputtering. Then, a compact layer formed of titanium oxide as a hole blocking section was formed through reactive sputtering with oxygen gas.

The first electrode section formed over the substrate and the hole blocking section were partially subjected to an etching treatment through laser processing to divide the continuous photoelectric conversion element.

Next, titanium oxide (ST-21, available from ISHIHARA SANGYO KAISHA, LTD.) (3 parts by mass), acetylacetone (0.2 parts by mass), and polyoxyethylene octylphenyl ether (available from Wako Pure Chemical Industries, Ltd.) (0.3 parts by mass) as a surfactant were subjected to a bead mill treatment for 12 hours together with water (5.5 parts by mass) and ethanol (1.0 part by mass) to thereby prepare a titanium oxide dispersion liquid. Polyethylene glycol (polyethylene glycol 20,000, available from Wako Pure Chemical Industries, Ltd.) (1.2 parts by mass) was added to the prepared titanium oxide dispersion liquid to thereby prepare a paste. The prepared paste was coated on the hole blocking section (average thickness: about 1.3 micrometers), was dried at 60 degrees Celsius, and was fired at 550 degrees Celsius for 30 minutes in the air to thereby form a porous electron-transporting section.

The glass substrate over which the electron-transporting section had been formed was immersed in a solution, which was obtained by adding a mixed liquid of acetonitrile/t-butanol (volume ratio: 1:1) to a photosensitization compound expressed by the B-5 (120 parts by mass) and chenodeoxycholic acid (available from Tokyo Chemical Industry Co., Ltd.) (150 parts by mass), followed by stirring, and was left to stand for 1 hour in the dark to thereby adsorb the photosensitization compound on the surface of the electron-transporting section.

To chlorobenzene (1100 parts by mass), a hole-transporting material expressed by the D-7 (available from Merck KGaA) (196 parts by mass), a cobalt complex expressed by the F-11 (available from Sigma-Aldrich Japan) (19 parts by mass) as an oxidizing agent, lithium bis(trifluoromethanesulfonyl)imide (available from KANTO CHEMICAL CO., INC.) (21 parts by mass) as an alkali metal salt, a compound having a pyridine ring structure expressed by the C-10 (38 parts by mass), and acetonitrile (available from KANTO CHEMICAL CO., INC.) (60 parts by mass) were added and dissolved to thereby prepare a coating liquid for the hole-transporting section.

Over the electron-transporting section to which the photosensitization compound had been adsorbed, a hole-transporting section was formed (average thickness: about 500 nm) through die coating using the coating liquid for the hole-transporting section. The peripheral portion of the glass substrate over which a sealing member would be provided was subjected to an etching treatment through laser processing, and then through holes configured to couple photoelectric conversion elements in series were formed through further laser processing.

Furthermore, silver was deposited thereover under vacuum to thereby form a second electrode section (average thickness: about 100 nm). At this time, silver was also deposited on the inner walls of the through holes. Then, it was confirmed that the adjacent photoelectric conversion elements were coupled in series.

On the peripheral portion of the glass substrate, an ultraviolet-curing resin B (World Rock No. 5910, available from Kyoritsu Chemical & Co., Ltd.) as a sealing member was coated using a dispenser (2300N, available from SAN-EI TECH LTD.) so as to surround a power generation region. Then, it was transferred to a glove box into which a mixed gas of nitrogen and oxygen (oxygen concentration: 21.0% by volume, dew point: −50 degrees Celsius), and a cover glass as a second substrate was placed over the ultraviolet-curing resin. Then, the resin was cured through irradiation of ultraviolet rays and the power generation region was sealed to thereby produce a photoelectric conversion element of Example 21 as presented in FIG. 8.

Example 22

A photoelectric conversion element module of Example 22 was produced in the same manner as in Example 21 except that the amount of the hole-transporting material added was changed to 190 parts by mass, and the amount of the oxidizing agent added was changed to 26 parts by mass.

Example 23

A photoelectric conversion element module of Example 23 was produced in the same manner as in Example 21 except that the amount of the hole-transporting material added was changed to 181 parts by mass, the amount of the oxidizing agent added was changed to 37 parts by mass, the amount of the alkali metal salt added was changed to 20 parts by mass, and the amount of the added compound having a pyridine ring structure was changed to 35 parts by mass.

Comparative Example 6

A photoelectric conversion element module of Comparative Example 6 was produced in the same manner as in Example 21 except that the amount of the hole-transporting material added was changed to 202 parts by mass, the amount of the oxidizing agent added was changed to 11 parts by mass, the amount of the alkali metal salt added was changed to 22 parts by mass, and the amount of the added compound having a pyridine ring structure was changed to 39 parts by mass.

A peak intensity ratio A/B of each of the produced photoelectric conversion element modules was determined in the following manner. Results are presented in Table 2-2.

<Calculation of Peak Intensity>

The sealed part of the produced photoelectric conversion element module was opened and the second electrode was exfoliated using a piece of tape in order to perform Raman spectroscopy of the hole-transporting section. The Raman spectroscopic apparatus used was a 3D laser Raman spectroscopic apparatus "Nanofinder 30" (available from Tokyo Instruments, Inc.).

Measurement conditions were as follows.
Laser wavelength: 532 nm
Objective lens: 40 folds
ND filter (laser power): 3.0 (minimum)
Exposure time: 60 seconds
Cumulative number: one time An OMNIC software was used to read peaks. First, a base line was drawn between a Raman shift of $1647\ cm^{-1} \pm 1\ cm^{-1}$ and a Raman shift of $1521\ cm^{-1} \pm 1\ cm^{-1}$. Then, the maximum peak intensity A of the peak that reached the maximum at a Raman shift of $1575\ cm^{-1} \pm 10\ cm^{-1}$ and the maximum peak intensity B of the peak that reached the maximum at a Raman shift of $1606\ cm^{-1} \pm 10\ cm^{-1}$ were read, to thereby calculate a peak intensity ratio A/B. Furthermore, 4 portions per one sample were measured for the Raman measurement, and the peak intensity ratio AB obtained was an average of values on the four portions.

<Durability Test of Photoelectric Conversion Element Module>

Each of the produced photoelectric conversion element modules was subjected to the following durability test. Results are presented in Table 2-2.

Using a solar cell test system (As-510-PV03, available from NF CORPORATION), under irradiation of adjusted white LED of 200 lux, each of the produced photoelectric conversion element modules was evaluated for IV characteristics. Then, an initial maximum output power Pmax 1 ($\mu W/cm^2$) thereof was determined.

Next, the photoelectric conversion element module was irradiated with adjusted white LED of 8,000 lux for 1,000 hours. Then, the photoelectric conversion element module was evaluated again for IV characteristics under irradiation of adjusted white LED of 200 lux, and a maximum output power Pmax 2 ($\mu W/cm^2$) after the test was determined.

Finally, the maximum output power Pmax 2 ($\mu W/cm^2$) after the test was divided by the initial maximum output power Pmax 1 ($\mu W/cm^2$) to thereby determine a Pmax maintenance rate (Pmax 2/Pmax 1×100) after the durability test.

TABLE 2-1

| | Dye | Hole-transporting material | Oxidizing agent | Alkali metal salt | Pyridine compound | Sealing resin | Oxygen concentration (%) of sealed part |
|---|---|---|---|---|---|---|---|
| Example 21 | B-5 | D-7 | F-11 | Li-TFSI | C-10 | Resin B | 21.0 |
| Example 22 | B-5 | D-7 | F-11 | Li-TFSI | C-10 | Resin B | 21.0 |
| Example 23 | B-5 | D-7 | F-11 | Li-TFSI | C-10 | Resin B | 21.0 |
| Comparative Example 6 | B-5 | D-7 | F-11 | Li-TFSI | C-10 | Resin B | 21.0 |

TABLE 2-2

| | Amount of hole-transporting material added (parts by mass) | Amount of oxidizing agent added (parts by mass) | Amount of alkali metal salt added (parts by mass) | Amount of pyridine compound added (parts by mass) | Peak intensity ratio A/B | Initial Pmax ($\mu W/cm^2$) | Pmax maintenance rate (%) |
|---|---|---|---|---|---|---|---|
| Example 21 | 196 | 19 | 21 | 38 | 0.93 | 55.0 | 91 |
| Example 22 | 190 | 26 | 21 | 38 | 1.02 | 57.8 | 95 |
| Example 23 | 181 | 37 | 20 | 35 | 1.08 | 60.2 | 97 |
| Comparative Example 6 | 202 | 11 | 22 | 39 | 0.70 | 48.8 | 71 |

As was seen from the results of Table 1-2 to Table 2-2, it was found that the photoelectric conversion element and the photoelectric conversion element module of the present disclosure having a peak intensity ratio A/B of 0.80 or more could obtain a high output even with light of low illuminance of 200 lux, and achieved a less decrease in the output and high durability even after light of high illuminance of 8,000 lux was continuously emitted for a long period of time.

Meanwhile, it was found that the photoelectric conversion element and the photoelectric conversion element module having a peak intensity ratio AB of less than 0.80 had a large decrease in the output caused by emitting light of high illuminance of 8,000 lux, and were deteriorated in durability.

Aspects of the present disclosure are as follows, for example.

<1> A photoelectric conversion element including:
a first electrode section;
a second electrode section;
an electron-transporting section between the first electrode section and the second electrode section;
a light-absorbing section; and
a hole-transporting section,
wherein the hole-transporting section has a peak that reaches maximum at a Raman shift of 1575 cm$^{-1}$±10 cm$^{-1}$ and a peak that reaches maximum at a Raman shift of 1606 cm$^{-1}$±10 cm$^{-1}$ in a Raman spectrum obtained by emitting laser light having a wavelength of 532 nm, and has a peak intensity ratio AB of 0.80 or more, the peak intensity ratio AB being obtained from a maximum peak intensity A of the peak that reaches maximum at 1575 cm$^{-1}$±10 cm$^{-1}$ and a maximum peak intensity B of the peak that reaches maximum at 1606 cm$^{-1}$±10 cm$^{-1}$.

<2> The photoelectric conversion element according to <1>,
wherein the peak intensity ratio AB is 0.90 or more.

<3> The photoelectric conversion element according to <1> or <2>,
wherein the hole-transporting section includes at least a hole-transporting material and an oxidizing agent, and the hole-transporting material includes a spiro-ring structure.

<4> The photoelectric conversion element according to <3>,
wherein the oxidizing agent includes a trivalent cobalt complex.

<5> The photoelectric conversion element according to <3> or <4>,
wherein the hole-transporting section further includes an alkali metal salt.

<6> The photoelectric conversion element according to any one of <3> to <5>,
wherein the hole-transporting section further includes a compound having a pyridine ring structure.

<7> The photoelectric conversion element according to any one of <1> to <6>, further including
a hole blocking section that is provided between the first electrode section and the electron-transporting section.

<8> The photoelectric conversion element according to any one of <1> to <7>,
wherein the photoelectric conversion element includes a sealing member configured to shield the hole-transporting section from an external environment of the photoelectric conversion element.

<9> The photoelectric conversion element according to <8>,
wherein a hollow section inside a sealed part shielded from the external environment by the sealing member includes oxygen.

<10> A photoelectric conversion element module including
a plurality of photoelectric conversion elements that are disposed, each of the plurality of photoelectric conversion elements is the photoelectric conversion element according to any one of <1> to <9>,
wherein the plurality of photoelectric conversion elements are coupled in series, are coupled in parallel, or are coupled in series and in parallel.

<11> The photoelectric conversion element module according to <10>,
wherein the photoelectric conversion element module includes at least two photoelectric conversion elements adjacent to each other, and the first electrode section in one of the photoelectric conversion elements is electrically coupled to the second electrode section in another of the photoelectric conversion elements through a conduction section penetrating at least from the hole-transporting section through a hole blocking section.

<12> The photoelectric conversion element module according to <10> or <11>,
wherein the photoelectric conversion element module includes a sealing member configured to shield, from an external environment of the photoelectric conversion element module, the hole-transporting sections in the plurality of photoelectric conversion elements constituting the photoelectric conversion element module.

<13> The photoelectric conversion element module according to <12>,
wherein a hollow section inside a sealed part shielded from the external environment by the sealing member includes oxygen.

<14> An electronic device including:
at least one selected from the group consisting of the photoelectric conversion element according to any one of <1> to <9> and the photoelectric conversion element module according to any one of <10> to <13>; and
a device configured to be driven by electric power generated through photoelectric conversion of at least one selected from the group consisting of the photoelectric conversion element and the photoelectric conversion element module.

<15> An electronic device including:
at least one selected from the group consisting of the photoelectric conversion element according to any one of <1> to <9> and the photoelectric conversion element module according to any one of <10> to <13>;
a secondary cell capable of storing electric power generated through photoelectric conversion of at least one selected from the group consisting of the photoelectric conversion element and the photoelectric conversion element module; and
a device configured to be driven by the electric power stored in the secondary cell.

<16> A power supply module including:
at least one selected from the group consisting of the photoelectric conversion element according to any one of <1> to <9> and the photoelectric conversion element module according to any one of <10> to <13>; and
a power supply IC.

The photoelectric conversion element according to any one of <1> to <9>, the photoelectric conversion element module according to any one of <10> to <13>, the electronic device according to <14> or <15>, and the power supply module according to <16> can solve the conventionally existing problems in the art and can achieve the object of the present disclosure.

REFERENCE SIGNS LIST

1: first substrate
2, 2a, 2b: first electrode section
3: hole blocking section
4: electron-transporting section
5: light-absorbing section (photosensitization compound)
6: hole-transporting section
7, 7a, 7b: second electrode section
8: sealing member
9: second substrate
10: hollow section
11: penetration section
12: sealing member
101: photoelectric conversion element
102: photoelectric conversion element module

The invention claimed is:

1. A photoelectric conversion element, comprising:
a first electrode section;
a second electrode section;
an electron-transporting section between the first electrode section and the second electrode section;
a light-absorbing section; and
a hole-transporting section comprising at least one hole transporting material having a spiro-ring structure and an oxidizing agent,
wherein the hole-transporting section has a peak that reaches maximum at a Raman shift of 1575 $cm^{-1}$±10 $cm^{-1}$ and a peak that reaches maximum at a Raman shift of 1606 $cm^{-1}$±10 $cm^{-1}$ in a Raman spectrum obtained by emitting laser light having a wavelength of 532 nm, and has a peak intensity ratio A/B of 0.90 or more, the peak intensity ratio A/B being obtained from a maximum peak intensity A of the peak that reaches maximum at 1575 $cm^{-1}$±10 $cm^{-1}$ and a maximum peak intensity B of the peak that reaches maximum at 1606 $cm^{-1}$±10 $cm^{-1}$.

2. The photoelectric conversion element according to claim 1, wherein the oxidizing agent includes a cobalt complex.

3. The photoelectric conversion element according to claim 1, wherein the hole-transporting section further comprises an alkali metal salt.

4. The photoelectric conversion element according to claim 1, wherein the hole-transporting section further includes a compound having a pyridine ring structure.

5. The photoelectric conversion element according to claim 1, further comprising a hole blocking section that is provided between the first electrode section and the electron-transporting section.

6. The photoelectric conversion element according to claim 1, wherein the photoelectric conversion element includes a sealing member configured to shield the hole-transporting section from an external environment of the photoelectric conversion element.

7. The photoelectric conversion element according to claim 6, wherein a hollow section inside a sealed part shielded from the external environment by the sealing member includes oxygen.

8. A photoelectric conversion element module, comprising
a plurality of photoelectric conversion elements that are disposed, wherein each of the plurality of photoelectric conversion elements is the photoelectric conversion element according to claim 1,
wherein the plurality of photoelectric conversion elements are coupled in series, are coupled in parallel, or are coupled in series and in parallel.

9. The photoelectric conversion element module according to claim 8, wherein the photoelectric conversion element module includes at least two photoelectric conversion elements adjacent to each other, and the first electrode section in one of the photoelectric conversion elements is electrically coupled to the second electrode section in another of the photoelectric conversion elements through a conduction section penetrating at least from the hole-transporting section through a hole blocking section.

10. The photoelectric conversion element module according to claim 8, wherein the photoelectric conversion element module includes a sealing member configured to shield, from an external environment of the photoelectric conversion element module, the hole-transporting sections in the plurality of photoelectric conversion elements constituting the photoelectric conversion element module.

11. The photoelectric conversion element module according to claim 10, wherein a hollow section inside a sealed part shielded from the external environment by the sealing member includes oxygen.

12. An electronic device, comprising:
the photoelectric conversion element according to claim 1; and
a device configured to be driven by electric power generated through photoelectric conversion of the photoelectric conversion element.

13. An electronic device, comprising:
the photoelectric conversion element according to claim 1;
a secondary cell capable of storing electric power generated through photoelectric conversion of the photoelectric conversion element; and
a device configured to be driven by the electric power stored in the secondary cell.

14. A power supply module, comprising:
the photoelectric conversion element according to claim 1; and
a power supply IC.

15. An electronic device, comprising:
the photoelectric conversion element module according to claim 8; and
a device configured to be driven by electric power generated through photoelectric conversion of the photoelectric conversion element module.

16. An electronic device, comprising:
the photoelectric conversion element module according to claim 8;
a secondary cell capable of storing electric power generated through photoelectric conversion of the photoelectric conversion element module; and
a device configured to be driven by the electric power stored in the secondary cell.

17. A power supply module, comprising:
the photoelectric conversion element module according to claim 8; and
a power supply IC.

18. The photoelectric conversion element according to claim 4, wherein an amount of the compound having a pyridine ring structure is 20 mol % or more but 65 mol % or less.

19. The photoelectric conversion element according to claim 1, where a content of said oxidizing agent is from 5 to 30 mol % relative to said hole-transporting material.

20. The photoelectric conversion element according to claim 1, where a content of said oxidizing agent is from 10 to 20 mol % relative to said hole-transporting material.

* * * * *